(12) United States Patent
Matsui et al.

(10) Patent No.: US 10,068,849 B2
(45) Date of Patent: Sep. 4, 2018

(54) SEMICONDUCTOR DEVICE

(71) Applicant: Renesas Electronics Corporation, Tokyo (JP)

(72) Inventors: Koujirou Matsui, Kanagawa (JP); Takehiko Sakamoto, Kanagawa (JP); Kazuyuki Umezu, Kanagawa (JP); Tomoaki Uno, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/073,574

(22) Filed: Mar. 17, 2016

(65) Prior Publication Data

US 2016/0204252 A1     Jul. 14, 2016

Related U.S. Application Data

(63) Continuation of application No. 14/470,745, filed on Aug. 27, 2014, now Pat. No. 9,318,434.

(30) Foreign Application Priority Data

Nov. 20, 2013    (JP) ................................. 2013-240286

(51) Int. Cl.
     *H01L 23/528*     (2006.01)
     *H01L 23/532*     (2006.01)
     (Continued)

(52) U.S. Cl.
     CPC ........ *H01L 23/528* (2013.01); *H01L 23/4824* (2013.01); *H01L 23/53228* (2013.01);
     (Continued)

(58) Field of Classification Search
     CPC ............................ H01L 23/528; H01L 27/088
     See application file for complete search history.

(56) References Cited

U.S. PATENT DOCUMENTS 6,150,722 A    11/2000   Efland et al.
6,278,264 B1    8/2001   Burstein et al.
(Continued)

FOREIGN PATENT DOCUMENTS

CN    101170091 A    4/2008
JP    08-255910 A    10/1996
(Continued)

OTHER PUBLICATIONS

Office Action, dated Aug. 15, 2017, in Japanese Patent Application No. 2013-240286.
(Continued)

*Primary Examiner* — Moazzam Hossain
*Assistant Examiner* — Farun Lu
(74) *Attorney, Agent, or Firm* — Shapiro, Gabor and Rosenberger, PLLC

(57) ABSTRACT

A plurality of unit MISFET elements connected in parallel with each other to make up a power MISFET are formed in an LDMOSFET forming region on a main surface of a semiconductor substrate. A control circuit that controls a gate voltage of the power MISFET is formed in a driver circuit region on the main surface of the semiconductor substrate. A wiring structure having a plurality of wiring layers made of the same metal material is formed on the semiconductor substrate. The gate electrodes of the plurality of unit MISFET elements formed in the LDMOSFET forming region are electrically connected to each other via gate wirings formed in all of the plurality of wiring layers made of the same metal material.

11 Claims, 28 Drawing Sheets

(51) Int. Cl.
    *H01L 27/088*     (2006.01)
    *H01L 23/482*     (2006.01)
    *H01L 29/40*     (2006.01)
    *H01L 29/78*     (2006.01)
    *H01L 29/06*     (2006.01)
    *H03K 17/687*     (2006.01)

(52) U.S. Cl.
    CPC ........ *H01L 27/088* (2013.01); *H01L 29/0696* (2013.01); *H01L 29/404* (2013.01); *H01L 29/7835* (2013.01); *H03K 17/687* (2013.01); *H01L 23/53214* (2013.01); *H01L 2224/16225* (2013.01); *H01L 2924/19105* (2013.01)

(56) References Cited

U.S. PATENT DOCUMENTS

| | | |
|---|---|---|
| 6,713,823 B1 | 3/2004 | Nickel |
| 6,972,464 B2 | 12/2005 | Shen |
| 2009/0243087 A1* | 10/2009 | Nakamura ............ H01L 23/585 |
| | | 257/723 |
| 2010/0001790 A1 | 1/2010 | Hashimoto et al. |
| 2010/0020509 A1 | 1/2010 | Xie et al. |
| 2011/0304049 A1 | 12/2011 | Shigihara et al. |
| 2013/0033243 A1* | 2/2013 | Takemae ................ H02M 1/38 |
| | | 323/271 |
| 2013/0187204 A1* | 7/2013 | Sugiura ............... H01L 27/1203 |
| | | 257/288 |

FOREIGN PATENT DOCUMENTS

| | | |
|---|---|---|
| JP | 2004-022694 A | 1/2004 |
| JP | 2009-260215 A | 11/2009 |
| JP | 2010-016035 A | 1/2010 |
| JP | 2010-177478 A | 8/2010 |
| JP | 2012-004210 A | 1/2012 |

OTHER PUBLICATIONS

Office Action, dated May 28, 2018, in Chinese Patent Application No. 201410422025.0.

* cited by examiner

SEMICONDUCTOR DEVICE

CROSS-REFERENCE TO RELATED APPLICATIONS

The present application claims priority from Japanese Patent Application No. 2013-240286 filed on Nov. 20, 2013, the content of which is hereby incorporated by reference to this application.

TECHNICAL FIELD

The present invention relates to a semiconductor device and is suitably available for, for example, a semiconductor device having a MISFET.

BACKGROUND

U.S. Pat. No. 6,972,464 (Patent Document 1), U.S. Pat. No. 6,713,823 (Patent Document 2), U.S. Pat. No. 6,278,264 (Patent Document 3) and Japanese Patent Application Laid-Open Publication No. 8-255910 (Patent Document 4) describe techniques related to a semiconductor device having a MOSFET. Japanese Patent Application Laid-Open Publication No. 2010-16035 (Patent Document 5) describes a technique related to a semiconductor device for a DC-DC converter.

SUMMARY

A technique is known, according to which a plurality of unit MISFETs are formed and connected in parallel on a semiconductor substrate to form a semiconductor device having a power MISFET. Even in such a semiconductor device, it is desired to improve the performance as much as possible.

Other problems and novel characteristics of the present invention will be apparent from the description of the present specification and the accompanying drawings.

According to one embodiment, the semiconductor includes: a semiconductor substrate; a plurality of unit MISFET elements formed on a main surface of the semiconductor substrate and connected in parallel with each other to make up a power MISFET; a control circuit formed on the main surface of the semiconductor substrate and controlling a gate voltage of the power MISFET; and a wiring structure formed on the semiconductor substrate and having a plurality of wiring layers made of the same metal material. Gate electrodes of the plurality of unit MISFET elements are electrically connected to each other via gate wirings which are respectively formed in all of the plurality of wiring layers.

According to one embodiment, the performance of a semiconductor device can be improved.

DETAILED DESCRIPTION

Figure 1:
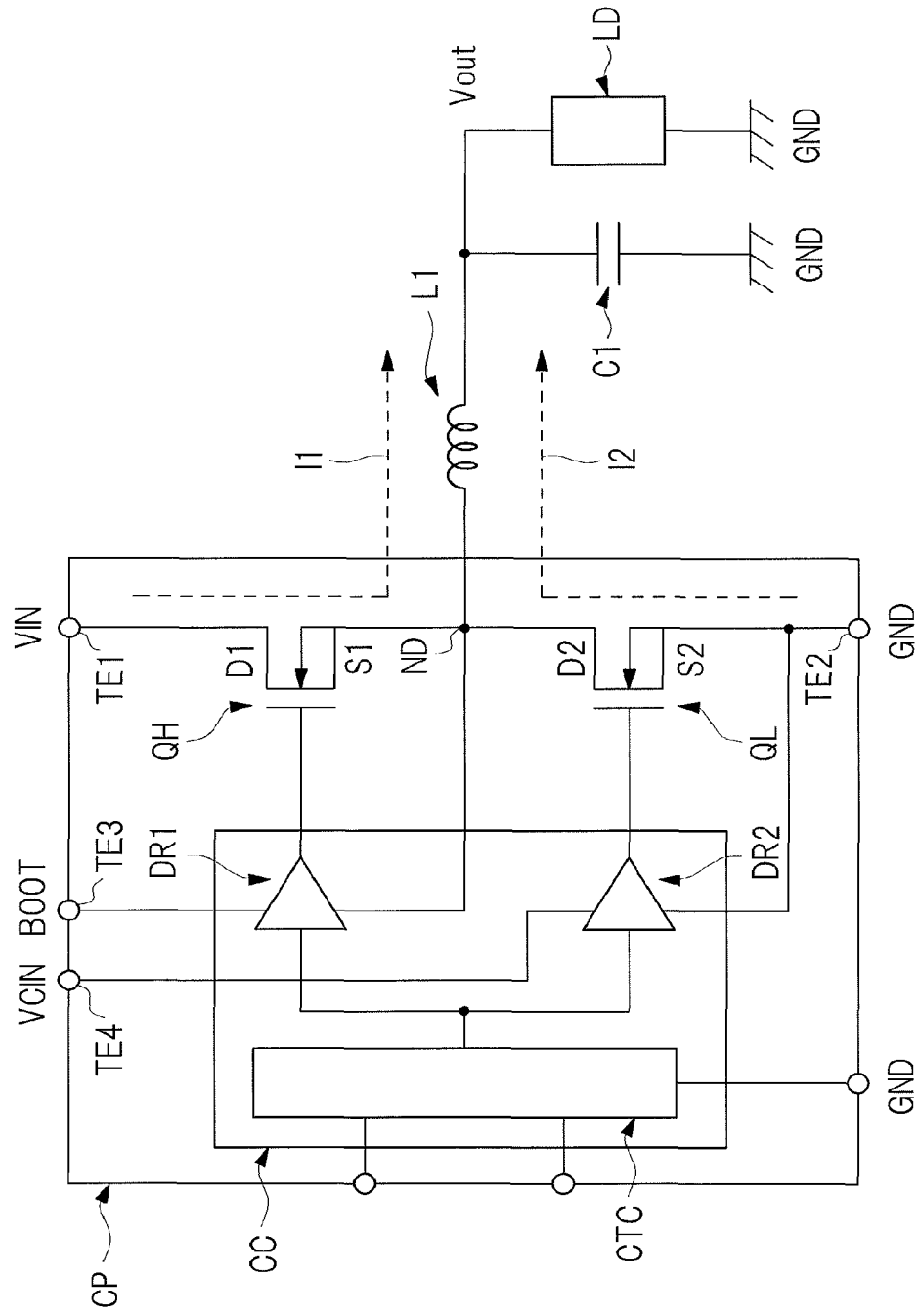
FIG. 1 is a circuit diagram showing an example of an electronic device using a semiconductor device of an embodiment.

In the embodiments described below, the invention will be described in a plurality of sections or embodiments when required as a matter of convenience. However, these sections or embodiments are not irrelevant to each other unless otherwise stated, and the one relates to the entire or apart of the other as a modified example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments.

In the drawings used in the following embodiments, hatching is sometimes omitted even in a sectional view so as to make the drawings easy to see. Also, hatching is sometimes used even in a plan view so as to make the drawings easy to see.

Embodiment

<Circuit Configuration Example>

FIG. 1 is a circuit diagram showing an example of an electronic device using a semiconductor device (semiconductor chip) of an embodiment of the present invention, and it shows a circuit diagram in a case where a non-insulated DC-DC converter is constructed by using a semiconductor device (semiconductor chip) CP of this embodiment.

The non-insulated DC-DC converter shown in FIG. 1 is used in, for example, a power circuit or the like of electronic equipment such as a desktop PC, notebook PC, server, and game machine.

The non-insulated DC-DC converter shown in FIG. 1 includes two power MOSFETs (Metal Oxide Semiconductor Field Effect Transistor) QH and QL, a control circuit CC, a capacitor (output capacitor) C1, and a coil (inductor) L1. In FIG. 1, a reference character VIN denotes an input power source (input power source potential), GND denotes a reference potential (for example, ground potential of 0 V), and Vout denotes an output voltage. Hereinafter, the power MOSFET is referred to as power MOS transistor.

The control circuit CC, the power MOS transistor QH, and the power MOS transistor QL are formed in the same semiconductor device (semiconductor chip) CP.

The control circuit CC includes circuits which control the operations of the power MOS transistors QH and QL, that is, includes a driver circuit (drive circuit) DR1 which drives or controls the power MOS transistor QH and a driver circuit (drive circuit) DR2 which drives or controls the power MOS transistor QL. The driver circuits DR1 and DR2 control the potentials of the gate terminals of the power MOS transistors QH and QL to control the operations of the power MOS transistors QH and QL, respectively.

Also, the control circuit CC further includes a control circuit CTC which controls the driver circuits DR1 and DR2. According to a signal (pulse width modulation (PWM) signal) supplied from the control circuit CTC, the driver circuits DR1 and DR2 control the potentials of the gate terminals of the power MOS transistors QH and QL to control the operations of the power MOS transistors QH and QL, respectively. The output of the control circuit CTC is electrically connected to the inputs of the driver circuits DR1 and DR2. More specifically, the output of the driver circuit DR1 is electrically connected to the gate terminal of the power MOS transistor QH, and the output of the driver circuit DR2 is electrically connected to the gate terminal of the power MOS transistor QL. The driver circuit DR1 can be regarded as the driver circuit (drive circuit) for the power MOS transistor QH, and the driver circuit DR2 can be regarded as the driver circuit (drive circuit) for the power MOS transistor QL.

The power MOS transistor QH and the power MOS transistor QL are connected in series between an input voltage supply terminal TE1 and a reference potential supply terminal TE2. More specifically, the power MOS transistor QH has a source-drain path connected in series between the input voltage supply terminal TE1 and an output node (output terminal) ND, and the power MOS transistor QL has a source-drain path connected in series between the output node ND and the reference potential supply terminal TE2. A high-side potential (input power source potential) VIN from the input power source (e.g., 12 V) is supplied to the input voltage supply terminal TE1, and a reference potential lower than the input voltage (potential VIN) supplied to the input voltage supply terminal TE1, for example, a ground potential (ground potential of 0 V) is supplied to the reference potential supply terminal TE2. Therefore, the power MOS transistor QH and the power MOS transistor QL are connected in series between the input power source (VIN) and the reference potential (GND) lower than the input power source.

The output node ND between the power MOS transistor QH and the power MOS transistor QL is connected to a load LD via the coil (inductor) L1. More specifically, between the output node ND and the reference potential GND, the coil L1 and the load LD are connected in series (the coil L1 is interposed between the output node ND and the load LD), and the capacitor C1 is connected in parallel with the load DL. The load LD is, for example, a hard disc drive, ASIC (Application Specific Integrated Circuit), FPGA (Field Programmable Gate Array), expansion card (PCI CARD), memory (DDR memory, DRAM, flash memory, etc.), CPU (Central Processing Unit), etc.

In FIG. 1, a reference character D1 denotes the drain of the power MOS transistor QH, S1 denotes the source of the power MOS transistor QH, D2 denotes the drain of the power MOS transistor QL, and S2 denotes the source of the power MOS transistor QL. The drain D1 of the power MOS transistor QH is connected to the input voltage supply terminal TE1 and is therefore connected to the input power source potential (VIN). The source S1 of the power MOS transistor QH is connected to the output node ND and is therefore connected to the coil L1. The drain D2 of the power MOS transistor QL is connected to the output node ND and is therefore connected to the coil L1. The source S2 of the power MOS transistor QL is connected to the reference potential supply terminal TE2 and is therefore connected to the reference potential (GND). Also, the driver circuit DR1 is connected to a terminal TE3 for a power source potential BOOT and to the output node ND, and the driver circuit DR2 is connected to a terminal TE4 for a power source potential VCIN and to the terminal TE2 for the reference potential (GND). The terminal TE3 is connected to the power source potential BOOT and the terminal TE4 is connected to the power source potential VCIN.

Here, each of the terminals TE1, TE2, TE3, and TE4 and the output node ND is formed of a bump electrode BP described later. Concretely, a drain bump electrode BPD described later connected to the drain of the power MOS transistor QH makes up the terminal TE1, and a source bump electrode BPS described later connected to the source of the power MOS transistor QL makes up the terminal TE2. Both of the source bump electrode BPS described later connected to the source of the power MOS transistor QH and the drain bump electrode BPD described later connected to the drain of the power MOS transistor QL make up the output nodes ND. The source bump electrode BPS connected to the source of the power MOS transistor QH and the drain bump electrode BPD connected to the drain of the power MOS transistor QL are electrically connected to each other via, for example, a re-wiring M4 described later.

The power MOS transistor QH is a field effect transistor for high-side switch (high-potential side: first operating voltage; hereinafter simply referred to as "high side"), and it has a switching function for accumulating energy in the coil L1. In other words, the power MOS transistor QH serves as a switching transistor (switching element). The coil L1 is an element which supplies power to an output of the non-insulated DC-DC converter (that is, input of the load LD).

On the other hand, the power MOS transistor QL is a field effect transistor for low-side switch (low-potential side: second operating voltage; hereinafter simply referred to as "low side"), and it has a function of performing rectification by lowering the resistance of the transistor. In other words, the power MOS transistor QL serves as a rectifying transistor (for synchronous rectification) and is a rectifying transistor for the non-insulated DC-DC converter in this case.

The high-side power MOS transistor QH can be regarded as a high-side MOSFET (MOSFET for high side) for a DC-DC converter (here, non-insulated DC-DC converter). Also, the low-side power MOS transistor QL can be regarded as a low-side MOSFET (MOSFET for low side) for a DC-DC converter (here, non-insulated DC-DC converter).

In the non-insulated DC-DC converter described above, the power source voltage is converted by alternately turning on and off the power MOS transistors QH and QL at synchronized timing. More specifically, when the high-side power MOS transistor QH is on, a current I1 flows from the terminal TE1 through the power MOS transistor QH to the output node ND. Meanwhile, when the high-side power MOS transistor QH is off, a current I2 is generated by the counter electromotive voltage of the coil L1, and by turning on the low-side power MOS transistor QL while the current I2 flows, the voltage drop can be reduced.

The operation of the DC-DC converter shown in FIG. 1 will be briefly described below.

The gate electrode of the power MOS transistor QH and the gate electrode of the power MOS transistor QL are connected to the control circuit CC (driver circuits DR1 and DR2), and turning on and off of the power MOS transistor QH and the power MOS transistor QL is controlled by the control circuit CC (driver circuits DR1 and DR2). Concretely, the control circuit CC performs the control so as to turn off the power MOS transistor QL when turning on the power MOS transistor QH and to turn on the power MOS transistor QL when turning off the power MOS transistor QH.

For example, when the power MOS transistor QH is on and the power the MOS transistor QL is off, a current flows from the input terminal TE1 through the power MOS transistor QH and the coil L1 to the load LD. Thereafter, when the power MOS transistor QH is turned off and the power MOS transistor QL is turned on, since the power MOS transistor QH is first turned off, the current flowing from the input terminal TE1 through the power MOS transistor QH and the coil L1 to the load LD is cut off. More specifically, the current flowing through the coil L1 is cut off. However, when the current is reduced (cut off), the coil L1 tries to maintain the current flowing therein (that is, an induced electromotive force is generated to try to create a flow of induced current). At this point, since the power MOS transistor QL is on, a current flows from the terminal TE2, which is connected to the reference potential GND, through the power MOS transistor QL and the coil L1 to the load LD. Then, the power MOS transistor QH is tuned on and the power the MOS transistor QL is turned off again. By repeating the operation described above, in the DC-DC converter shown in FIG. 1, when the input power source potential VIN is input to the input terminal TE1, the output voltage Vout lower than the input power source potential VIN is applied to both ends of the load LD.

<Structure of Semiconductor Device>

The structure of the semiconductor device of this embodiment will be described with reference to drawings.

Figure 7:
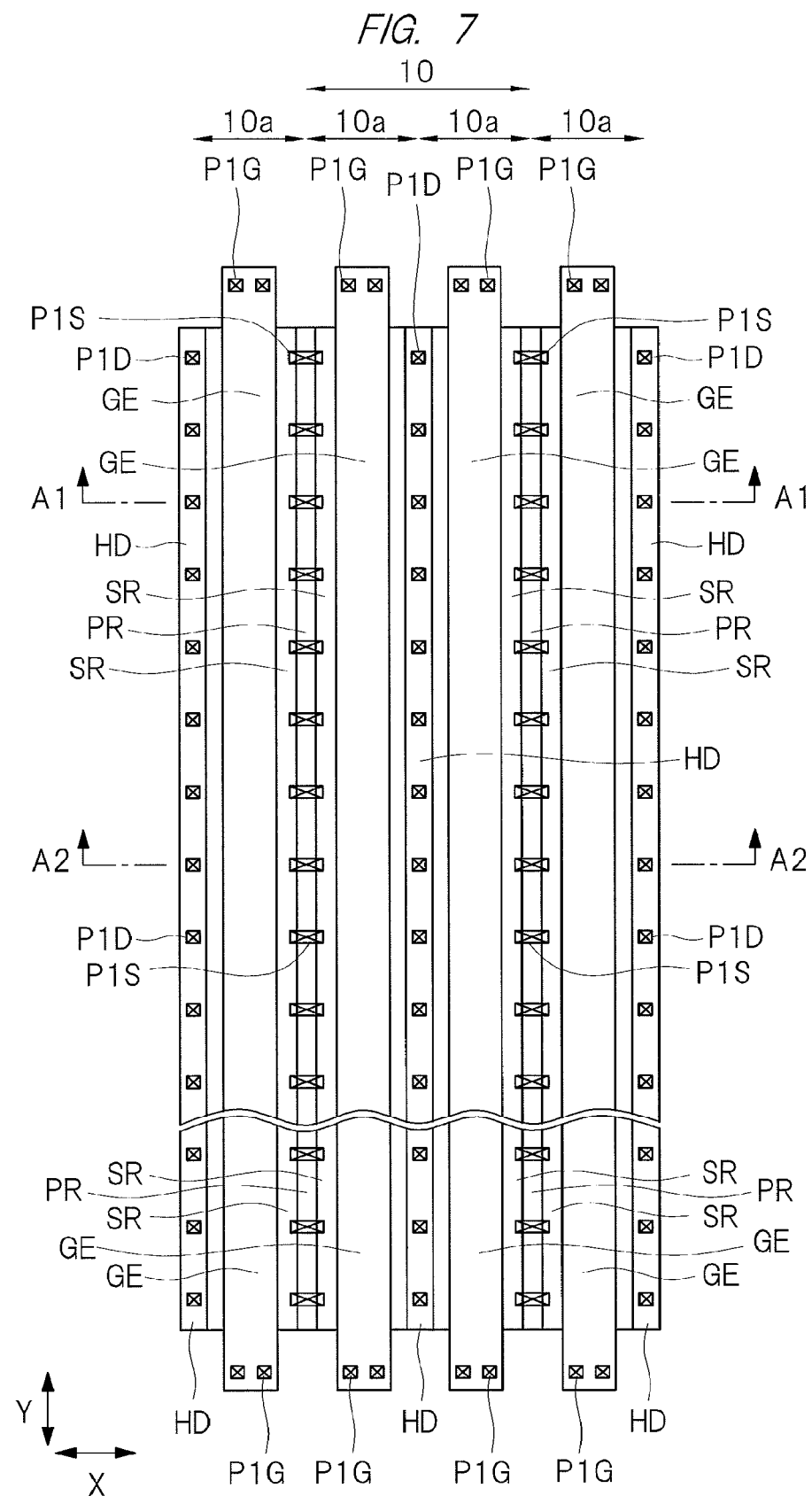
FIG. 7 is a partially enlarged plan view of the semiconductor device of the embodiment.
Figure 8:
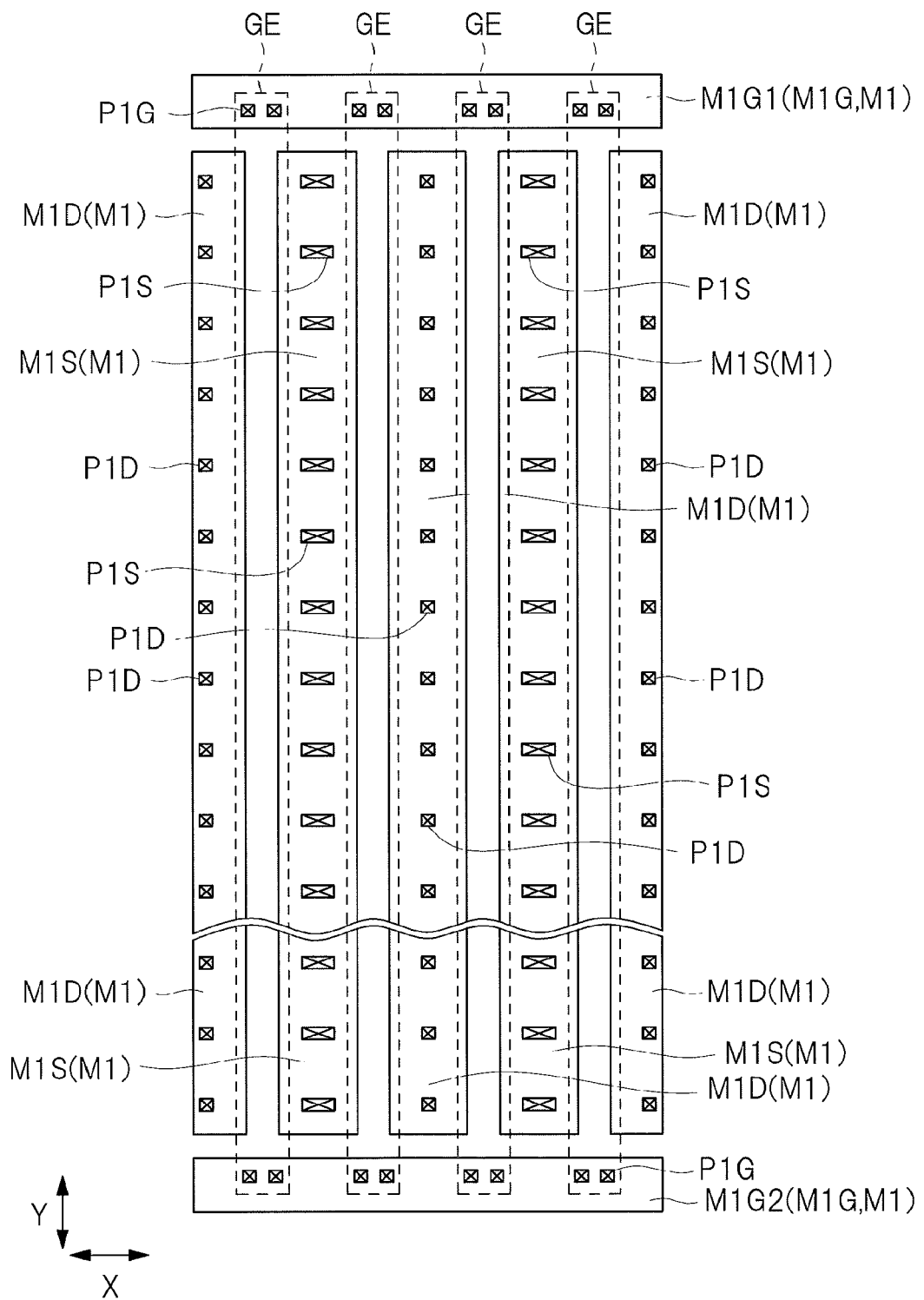
FIG. 8 is a partially enlarged plan view of the semiconductor device of the embodiment.
Figure 9:
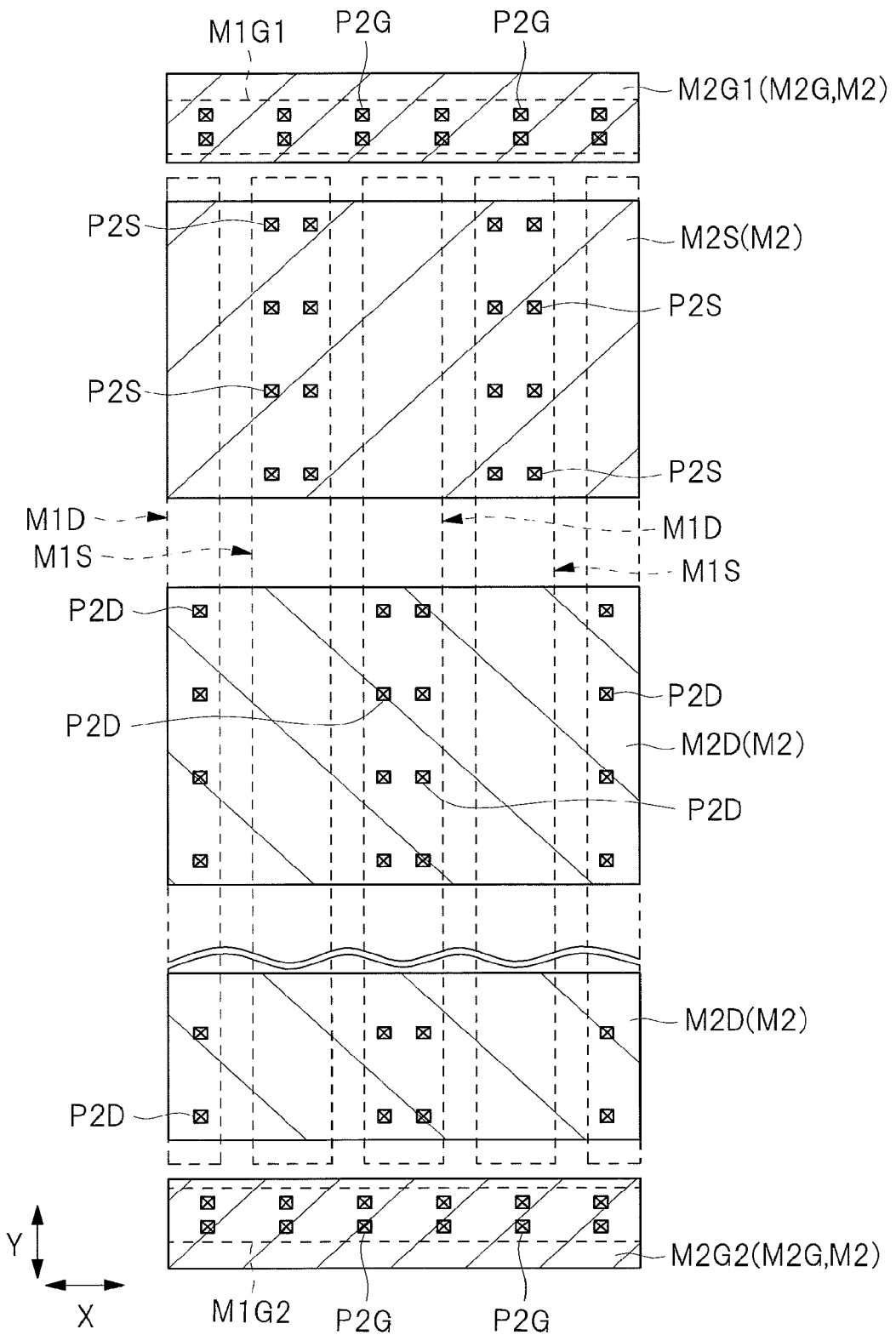
FIG. 9 is a partially enlarged plan view of the semiconductor device of the embodiment.

FIGS. 2 to 6 are plan views of principle parts of the semiconductor device (semiconductor chip) CP of this embodiment, and they show the plan views of an LDMOSFET (Laterally Diffused Metal-Oxide-Semiconductor Field Effect Transistor) forming region LR and a driver circuit region DR in the semiconductor device (semiconductor chip) CP of this embodiment. FIGS. 7 to 9 are partially enlarged plan views showing parts of the LDMOSFET forming region LR in an enlarged manner. FIGS. 10 to 16 are sectional views of principle parts of the semiconductor device (semiconductor chip) CP of this embodiment.

Figure 2:
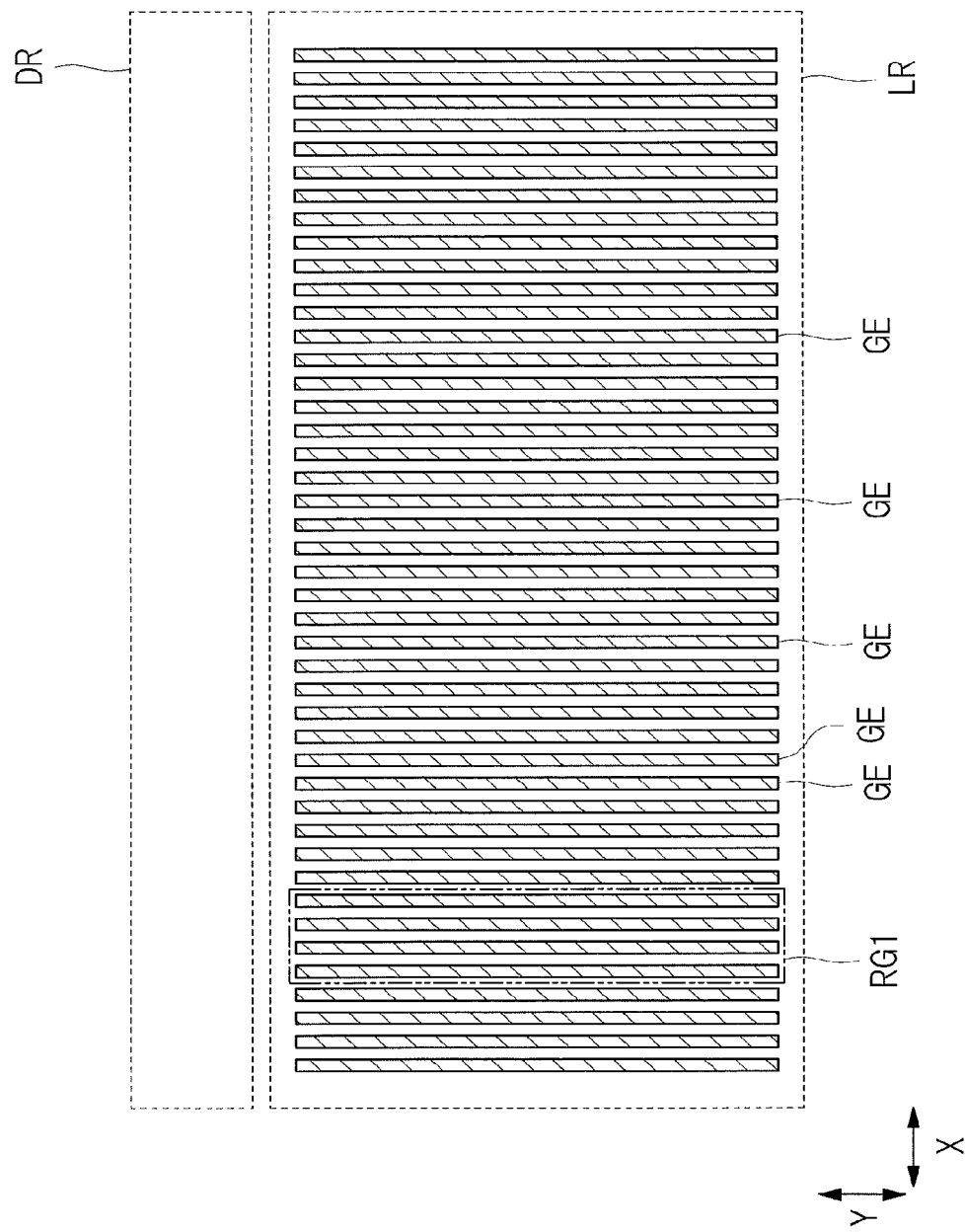
FIG. 2 is a plan view of a principle part of the semiconductor device of the embodiment.
Figure 3:
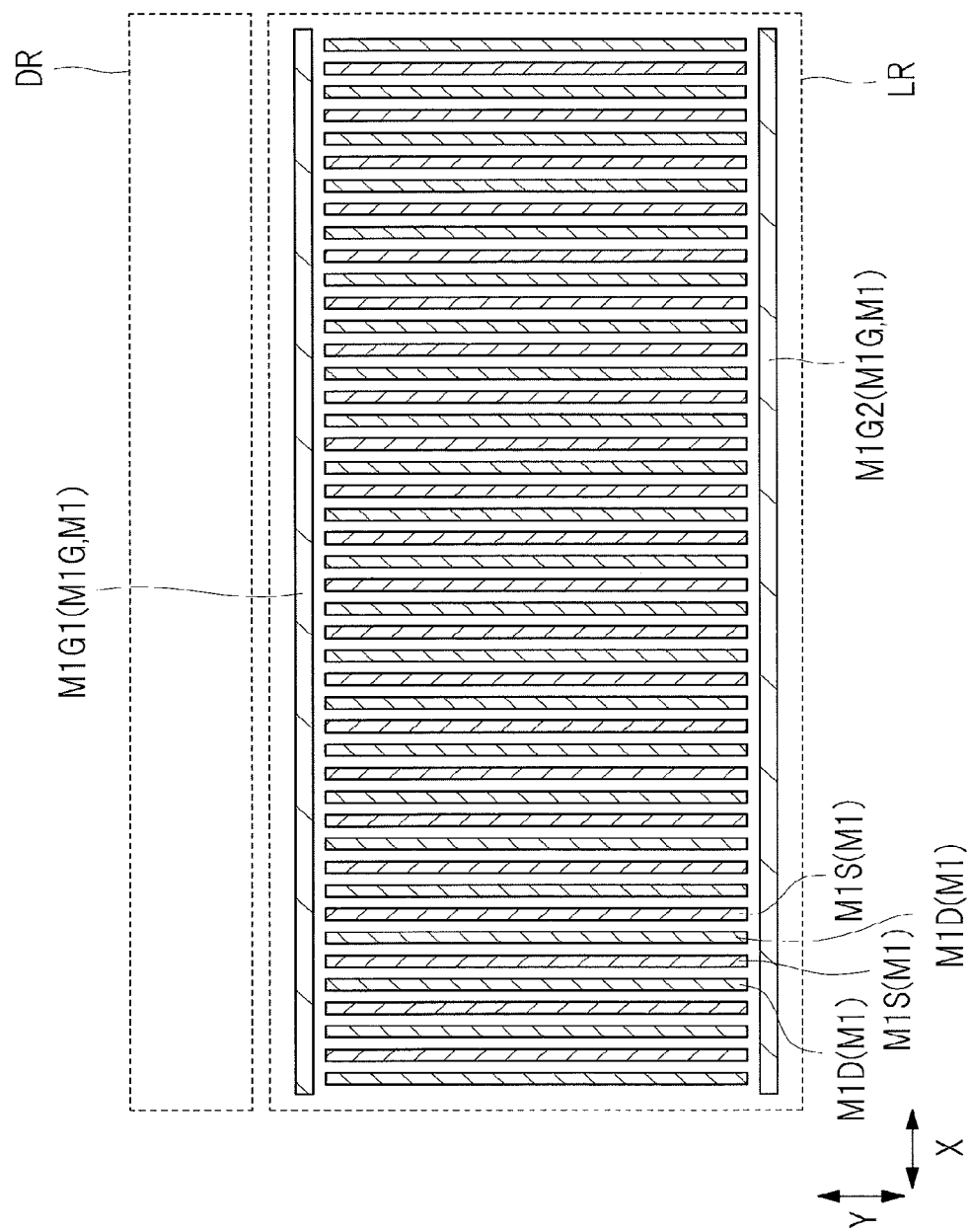
FIG. 3 is a plan view of a principle part of the semiconductor device of the embodiment.
Figure 4:
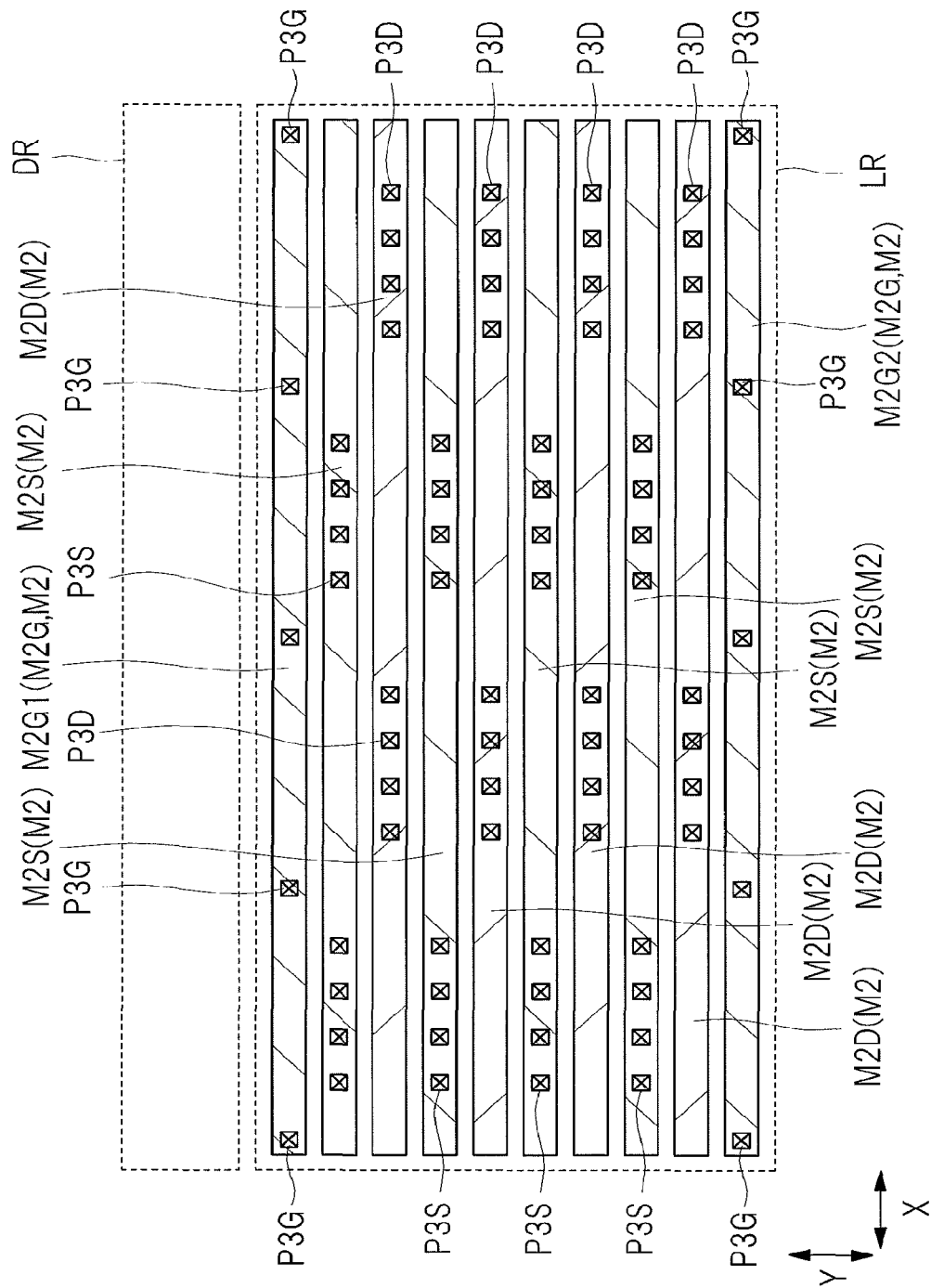
FIG. 4 is a plan view of a principle part of the semiconductor device of the embodiment.
Figure 5:
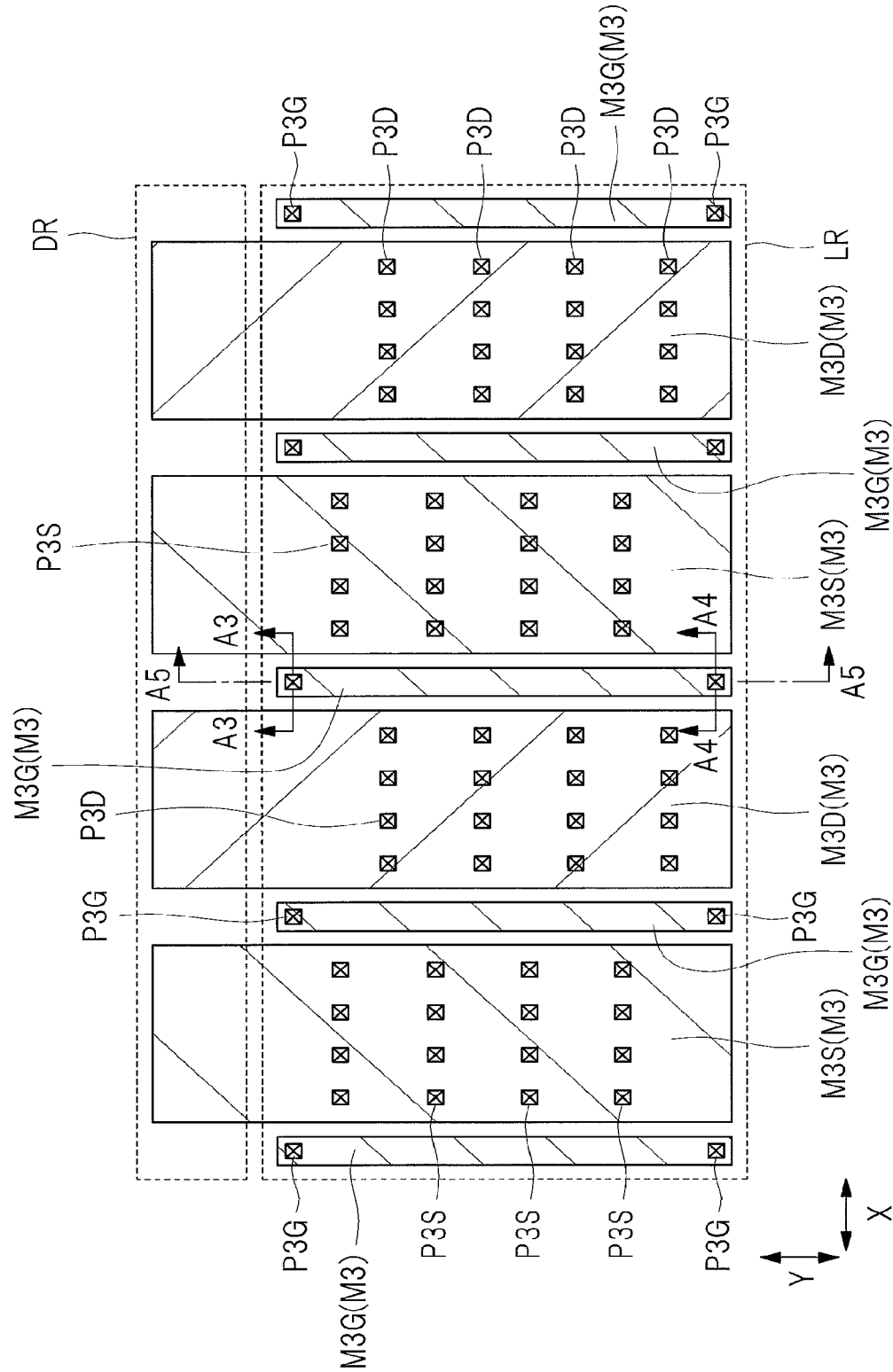
FIG. 5 is a plan view of a principle part of the semiconductor device of the embodiment.
Figure 6:
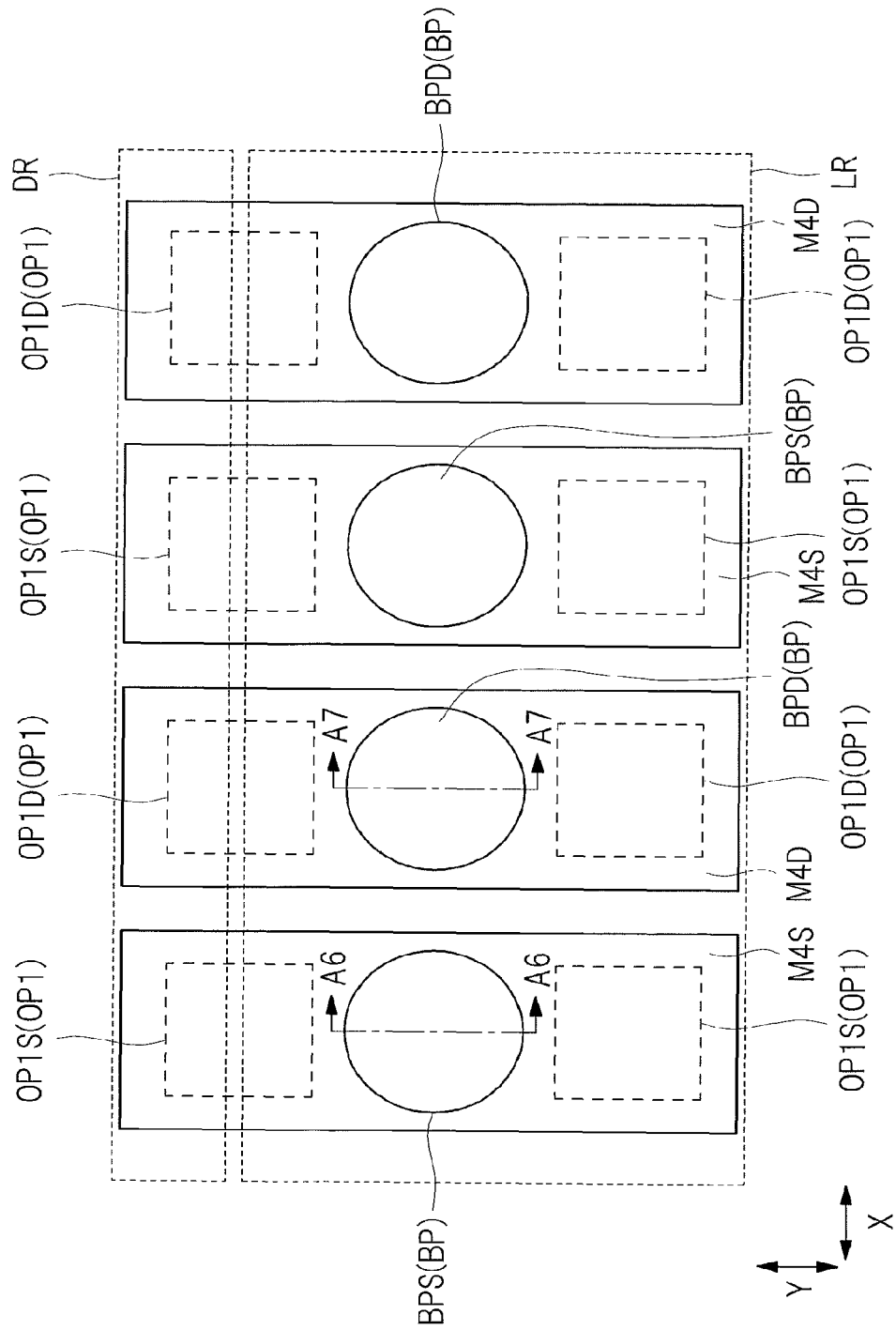
FIG. 6 is a plan view of a principle part of the semiconductor device of the embodiment.

FIGS. 2 to 6 show the same planar region in the semiconductor device CP, but layers to be shown are different from each other in FIGS. 2 to 6. More specifically, FIG. 2 shows a planar layout of gate electrodes GE in the LDMOSFET forming Region LR. FIG. 3 shows a planar layout of wirings M1 (source wirings M1S, drain wirings M1D, gate wirings M1G) in the LDMOSFET forming Region LR. FIG. 4 shows a planar layout of wirings M2 (source wirings M2S, drain wirings M2D, gate wirings M2G) in the LDMOSFET forming Region LR. FIG. 5 shows a planar layout of wirings M3 (source wirings M3S, drain wirings M3D, gate wirings M3G) in the LDMOSFET forming Region LR. Also, FIGS. 4 and 5 further show the planar positions of plugs P3S, P3D, and P3G. FIG. 6 shows a planar layout of re-wirings M4

(source re-wirings M4S, drain re-wirings M4D) and bump electrodes BP (source bump electrodes BPS, drain bump electrodes BPD) in the LDMOSFET forming Region LR. Also, FIG. 6 further shows the planar positions of source openings OP1S and drain openings OP1D indicated by broken lines.

Although semiconductor elements (e.g., MISFET elements) and wirings M1 and M2 making up the driver circuit (drive circuit) are formed in the driver circuit region DR, these components are not shown in FIGS. 2 to 4.

An enlarged view of a region RG1 surrounded by a two-dotted chain line in FIG. 2 corresponds to each of FIGS. 7 to 9, but layers to be shown are different from each other in FIGS. 7 to 9. More specifically, FIG. 7 shows a planar layout of gate electrodes GE, $n^+$-type semiconductor regions HD (high concentration drain regions), $n^+$-type semiconductor regions SR (source regions), and $p^+$-type semiconductor regions PR that make up LDMOSFETs. FIG. 8 shows a planar layout of the wirings M1 (source wirings M1S, drain wirings M1D, gate wirings M1G). FIG. 9 shows a planar layout of wirings M2 (source wirings M2S, drain wirings M2D, gate wirings M2G). In order to facilitate understanding of the positional relation between the layout of FIG. 7 and the layout of FIG. 8, the gate electrodes GE are indicated by broken lines in FIG. 8. Also, in order to facilitate understanding of the positional relation between the layout of FIG. 8 and the layout of FIG. 9, the wirings M1 (source wirings M1S, drain wirings M1D, gate wirings M1G) are indicated by broken lines in FIG. 9. FIGS. 7 and 8 further show the planar positions of plugs P1S, P1D, and P1G, and FIG. 9 further shows the planar positions of plugs P2S, P2D, and P2G. FIGS. 2, 3, and 4 are plan views, but in order to facilitate understanding, hatching is used for the gate electrodes GE in FIG. 2, for the wirings M1 (source wirings M1S, drain wirings M1D, gate wirings M1G) in FIG. 3, and for the wirings M2 (source wirings M2S, drain wirings M2D, gate wirings M2G) in FIG. 4. Also, FIGS. 5 and 9 are plan views, but in order to facilitate understanding, hatching is used for the wirings M3 (source wirings M3S, drain wirings M3D, gate wirings M3G) in FIG. 5 and for the wirings M2 (source wirings M2S, drain wirings M2D, gate wirings M2G) in FIG. 9.

Also, an X direction and a Y direction indicated in plan views (FIGS. 2 to 9 and FIGS. 19 to 29 and 31 to 34 described later) are directions intersecting each other, or preferably directions intersecting at right angles. The Y direction corresponds to the extending direction of the gate electrodes (GE), drain regions ($n^+$-type semiconductor regions HD), and source regions ($n^+$-type semiconductor regions SR) of LDMOSFETs formed in the LDMOSFET forming region LR.

Figure 10:
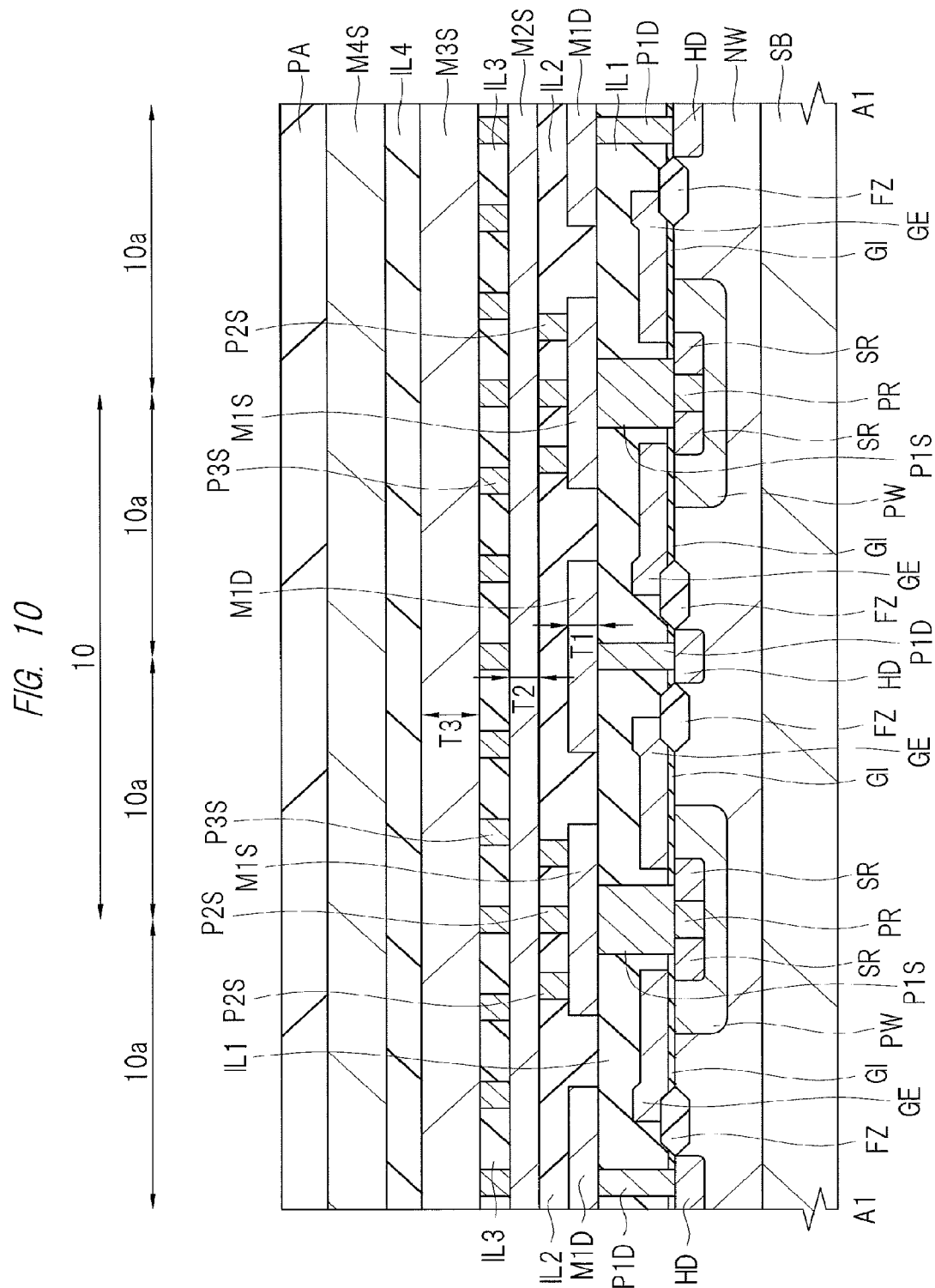
FIG. 10 is a sectional view of a principle part of the semiconductor device of the embodiment.
Figure 11:
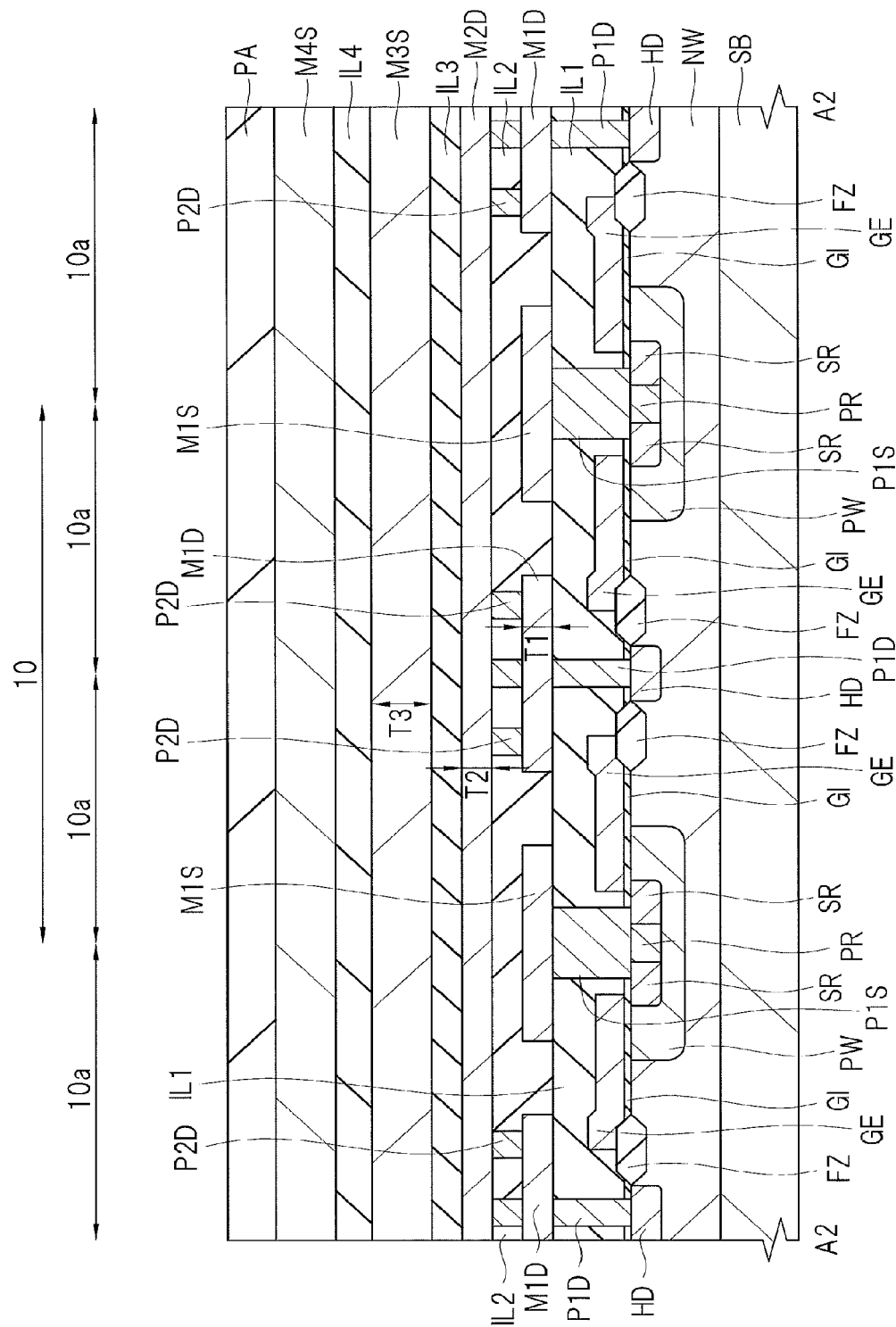
FIG. 11 is a sectional view of a principle part of the semiconductor device of the embodiment.
Figure 12:
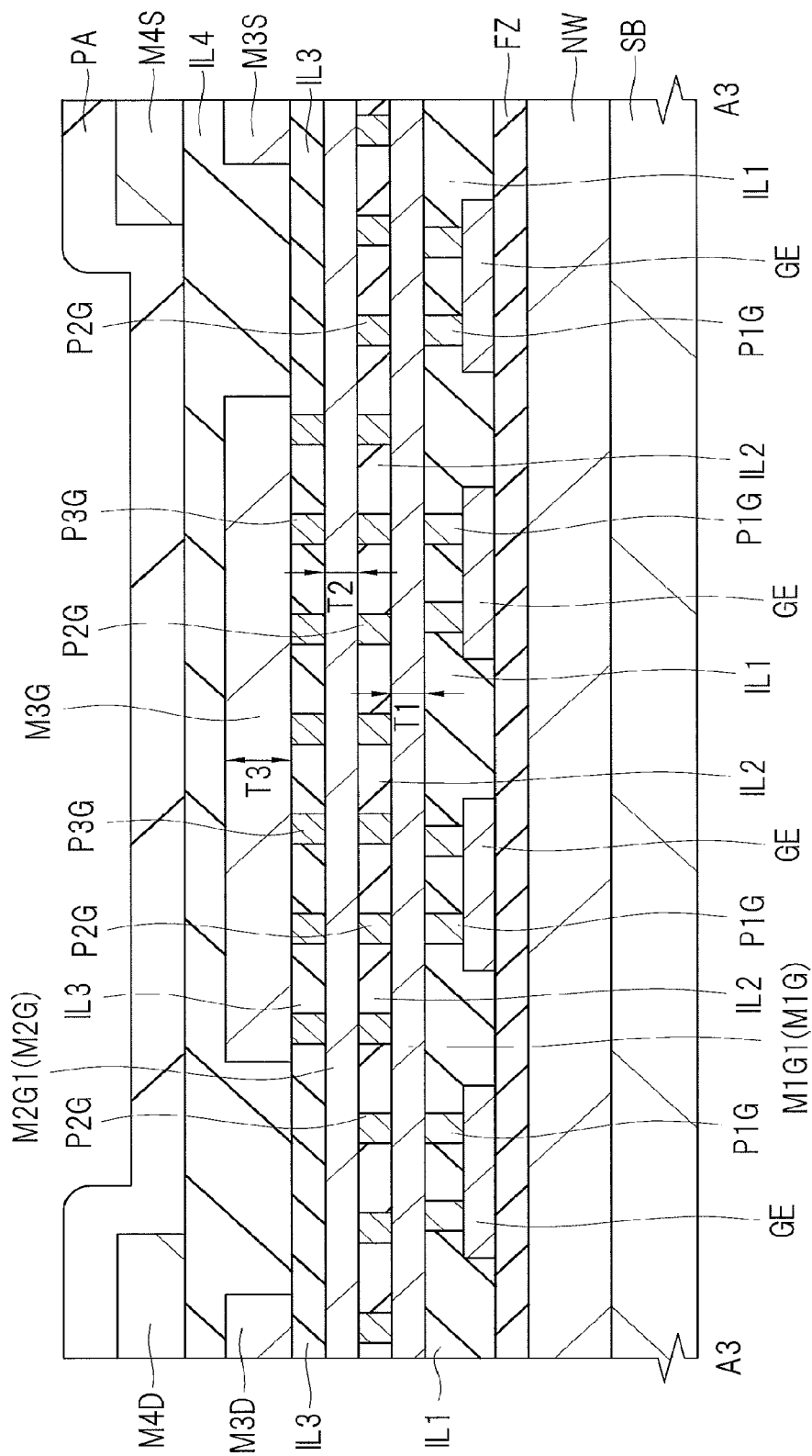
FIG. 12 is a sectional view of a principle part of the semiconductor device of the embodiment.
Figure 13:
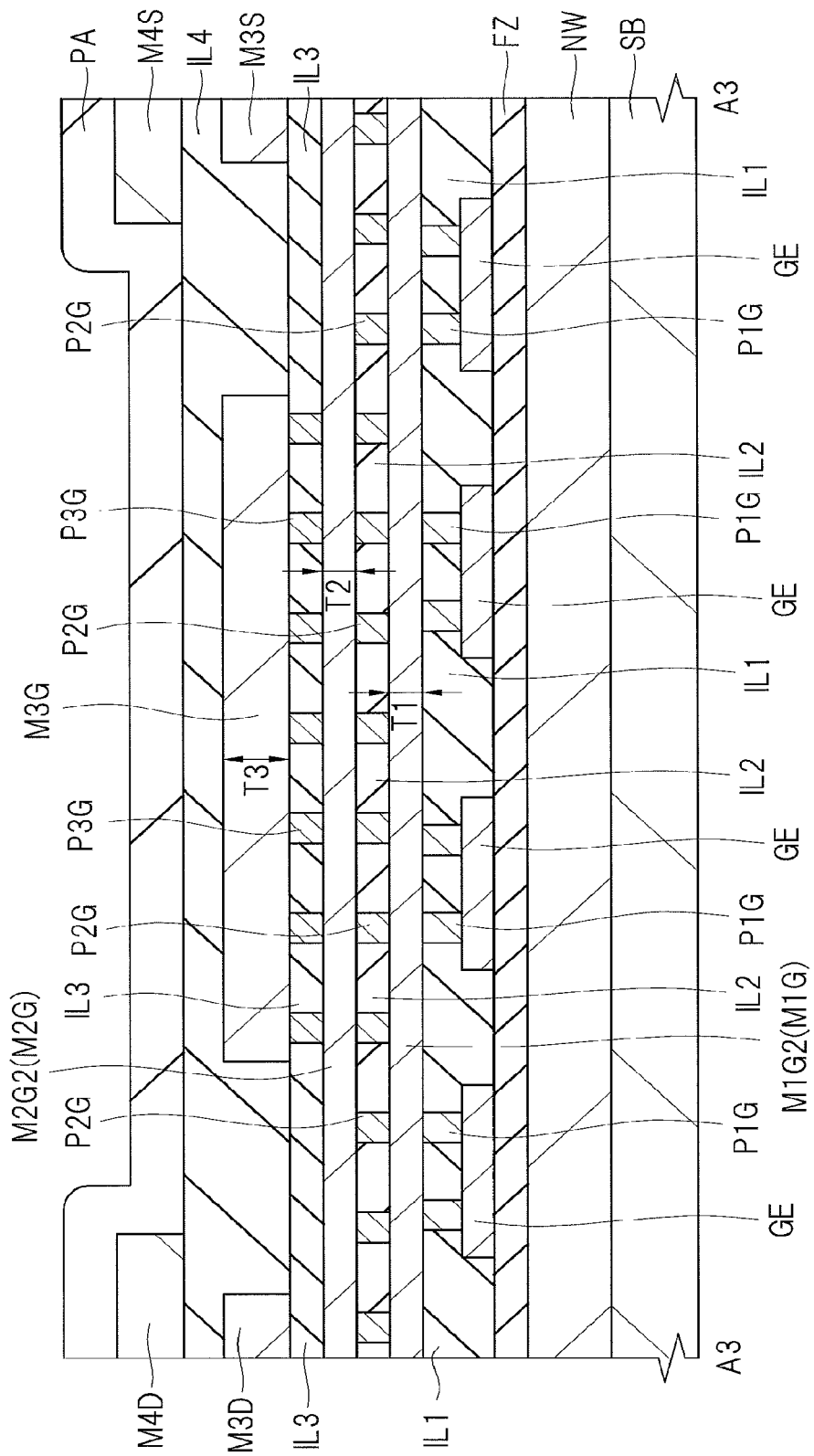
FIG. 13 is a sectional view of a principle part of the semiconductor device of the embodiment.

FIG. 10 substantially corresponds to a sectional view taken along the line A1-A1 in FIG. 7 and FIG. 11 substantially corresponds to a sectional view taken along the line A2-A2 in FIG. 7. Also, FIG. 12 substantially corresponds to a sectional view taken along the line A3-A3 in FIG. 5, FIG. 13 substantially corresponds to a sectional view taken along the line A4-A4 in FIG. 5, and FIG. 14 substantially corresponds to a sectional view taken along the line A5-A5 in FIG. 5. Also, FIG. 15 substantially corresponds to a sectional view taken along the line A6-A6 in FIG. 6 and FIG. 16 substantially corresponds to a sectional view taken along the line A7-A7 in FIG. 6.

As shown in FIGS. 10 to 16, a semiconductor substrate SB making up the semiconductor device (semiconductor chip) CP is made of, for example, a p-type single crystal silicon to which a p-type impurity is introduced. In the upper part (upper layer part or surface layer part) of the semiconductor substrate SB, an n-type semiconductor region (n-type drift layer) NW is formed. The n-type semiconductor region NW may be regarded as an n-type well. In the LDMOSFET forming region LR, the n-type semiconductor region NW can be formed on the entire surface layer part of the semiconductor substrate SB. The n-type semiconductor region NW may be regarded as an n-type semiconductor layer. The n-type semiconductor region NW can be formed by introducing an n-type impurity (by, for example, ion implantation) into the upper part (upper layer part or surface layer part) of the semiconductor substrate SB. In another aspect, an n-type semiconductor layer (epitaxial semiconductor layer) formed by epitaxial growth on the semiconductor substrate SB can be used as the n-type semiconductor layer NW.

In the LDMOSFET forming region LR, a plurality of LDMOSFET cells, that is, unit LDMOSFET elements are formed on the main surface of the semiconductor substrate SB. This structure will be described in detail below.

As shown in FIGS. 10 and 11 and others, in the n-type semiconductor region NW of the semiconductor substrate SB, p-type semiconductor regions (p-type body layers) PW serving as p-type wells and $n^+$-type semiconductor regions for drain (drain regions) HD are formed. In the p-type semiconductor region PW, an $n^+$-type semiconductor region for source (source region) SR and a $p^+$-type semiconductor region PR for supplying power to the p-type semiconductor region PW are formed.

The p-type semiconductor region PW and the $p^+$-type semiconductor region PR are p-type semiconductor regions (p-type impurity diffusion regions) formed in the semiconductor substrate SB, and the $n^+$-type semiconductor region (drain region) HD and the $n^+$-type semiconductor region (source region) SR are n-type semiconductor regions (n-type impurity diffusion regions) formed in the semiconductor substrate SB.

The impurity concentration (n-type impurity concentration) of the $n^+$-type semiconductor region (drain region) HD and the $n^+$-type semiconductor region (source region) SR is higher than the impurity concentration (n-type impurity concentration) of the n-type semiconductor region NW. Also, the impurity concentration (p-type impurity concentration) of the $p^+$-type semiconductor region PR is higher than the impurity concentration (p-type impurity concentration) of the p-type semiconductor region PW.

Each of the $n^+$-type semiconductor region (source region) SR and the $p^+$-type semiconductor region PR is formed to be shallower than the p-type semiconductor region PW, and the bottom surface and the side surface of the $n^+$-type semiconductor region (source region) SR are in contact with the p-type semiconductor region PW, and the bottom surface and the side surface of the $p^+$-type semiconductor region PR are in contact with the p-type semiconductor region PW. In the p-type semiconductor region PW of the semiconductor substrate SB, the $n^+$-type semiconductor region (source region) SR and the $p^+$-type semiconductor region PR may be formed so as to be adjacent to each other. In this case, the side surface of the $p^+$-type semiconductor region PR and the side surface of the $n^+$-type semiconductor region (source region) SR are in contact with each other. Also, in the p-type semiconductor region PW of the semiconductor substrate SB, the $n^+$-type semiconductor region (source region) SR and the $p^+$-type semiconductor region PR may be separated from each other with a part of the p-type semiconductor region PW interposed therebetween.

The bottom surface and side surface of the p-type semiconductor region PW are in contact with the n-type semiconductor region NW, and the bottom surface and side surface of the n⁺-type semiconductor region (drain region) HD are in contact with the n-type semiconductor region NW. The n⁺-type semiconductor region (drain region) HD and the p-type semiconductor region PW formed on the semiconductor substrate SB are separated from each other, and when viewed in a gate length direction, the n-type semiconductor region NW is present between the n⁺-type semiconductor region (drain region) HD and the p-type semiconductor region PW.

Note that "gate length direction" means the gate length direction of the gate electrode GE. Also, "gate width direction" means the gate width direction of the gate electrode GE. Since the gate electrode GE extends in the Y direction, the gate length direction of the gate electrode GE corresponds to the X direction, and the gate width direction of the gate electrode GE corresponds to the Y direction.

The gate electrodes GE of the LDMOSFETs are formed on the surface of the semiconductor substrate SB via a gate insulating film GI. The gate insulating film GI is made of, for example, a silicon oxide film or the like. The gate electrode GE is made of, for example, a single n-type polycrystalline silicon film or a laminated film of an n-type polycrystalline silicon film and a metal silicide layer.

Also, field insulating films FZ are formed on the surface of the semiconductor substrate SB by a LOCOS (Local Oxidization of Silicon) method. When viewed in the gate length direction (corresponding to the X direction), each field insulating film FZ is formed at a position adjacent (in the X direction) to the n⁺-type semiconductor region (drain region) HD. When viewed in the gate length direction (corresponding to the X direction), the field insulating film FZ adjacent to the n⁺-type semiconductor region (drain region) HD is separated from the p-type semiconductor region PW and a part of the n-type semiconductor region NW is interposed between a planar region in which the field insulating film FZ is formed and a planar region in which the p-type semiconductor region PW is formed.

The case in which the field insulating film FZ formed by the LOCOS method is used is described here, but an element isolation region may also be formed by an STI (Shallow Trench Isolation) method in another aspect.

When viewed in the gate length direction (corresponding to the X direction), the gate electrode GE is formed on the semiconductor substrate SB between the n⁺-type semiconductor region (drain region) HD and the n⁺-type semiconductor region (source region) SR via the gate insulating film, and a part of the gate electrode GE overlaps the field insulating film FZ. More specifically, the source-side end of the gate electrode GE is located on the n⁺-type semiconductor region (source region) SR, and the drain-side end of the gate electrode GE is located on the field insulating film FZ. It is unnecessary to form the gate insulating film GI between the gate electrode GE and the field insulating film FZ.

When viewed in the gate length direction (corresponding to the X direction), a part of the gate electrode GE is located above the p-type semiconductor region PW, and a channel forming region (region in which the channel of a transistor is formed) corresponds to the surface region of the p-type semiconductor region PW just below the gate electrode GE.

When viewed in the gate length direction (corresponding to the X direction), the gate electrode GE has the part formed on the p-type semiconductor region PW via the gate insulating film GI, the part formed on the n-type semiconductor region NW via the gate insulating film GI, and the part formed on the field insulating film FZ as a continuous (integrated) structure. No gate electrode GE is formed on the n⁺-type semiconductor region (drain region) HD, and the drain-side end of the gate electrode GE is located on the field insulating film FZ between the n⁺-type semiconductor region (drain region) HD and the p-type semiconductor region PW.

The p-type semiconductor region PW can be regarded as a p-type well. Also, the p-type semiconductor region PW functions also as a punch-through stopper which suppresses the spread of a depletion layer from the drain to the source of the LDMOSFET, and the p-type semiconductor region PW is formed on the source-side of the LDMOSFET and the channel forming region.

The source region of the LDMOSFET is formed of the n⁺-type semiconductor region SR. The drain region of the LDMOSFET is formed of the n⁺-type semiconductor region HD, and the part of the n-type semiconductor region NW interposed between the n⁺-type semiconductor region HD and the channel forming region also functions as an n-type low concentration drain region.

More specifically, it can be considered that the n⁺-type semiconductor region HD functions as an n-type high concentration drain region and the part of n-type semiconductor region NW interposed between the n⁺-type semiconductor region HD and the channel forming region functions as the n-type low concentration drain region (n-type drift region, n-type offset drain region), so that the n-type low concentration drain region and the n-type high concentration drain region make up the drain region of the LDMOSFET. As described above, the impurity concentration (n-type impurity concentration) of the n⁺-type semiconductor region HD is higher than the impurity concentration (n-type impurity concentration) of the n-type semiconductor region NW. Therefore, the impurity concentration (n-type impurity concentration) of the part of the n-type low concentration drain region (n-type semiconductor region NW) interposed between the n-type high concentration drain region (n⁺-type semiconductor region HD) and the channel forming region can be made lower than the impurity concentration (n-type impurity concentration) of the n-type high concentration drain region (n⁺-type semiconductor region HD). Apart of the low concentration drain region overlaps the gate electrode GE when seen in a plan view.

The n⁺-type semiconductor region (source region) SR is formed in a self-aligning manner relative to the source-side side wall of the gate electrode GE, or a part of the n⁺-type semiconductor region (source region) SR overlaps the gate electrode GE when seen in a plan view. The drain-side side wall of the gate electrode GE and source-side side wall of the gate electrode GE are the side walls of the gate electrode GE that are opposite to each other (on opposite sides in the gate length direction). The n-type low concentration drain region and the n⁺-type semiconductor region (source region) SR are separated from each other via the channel forming region (surface area of the p-type semiconductor region PW just below the gate electrode GE).

In this specification, MOSFET or LDMOSFET refers not only to a MISFET (Metal Insulator Semiconductor Field Effect Transistor) using an oxide film (silicon oxide film) as a gate insulating film but also to a MISFET using an insulating film other than the oxide film (silicon oxide film) as a gate insulating film. Also, the LDMOSFET is one type of the MISFET element.

In the LDMOSFET, in order to achieve the high-voltage operation with a short channel length, an LDD (Lightly Doped Drain) region is formed on the drain-side of the gate electrode GE. More specifically, the drain of the LDMOS-FET is made up of the $n^+$-type region with a high impurity concentration ($n^+$-type semiconductor region HD as the n-type high concentration drain region) and the LDD region with an impurity concentration lower than that of the $n^+$-type region (n-type semiconductor region NW as the n-type low concentration drain region), and the $n^+$-type region ($n^+$-type semiconductor region HD) is formed so as to be separated from the channel forming region via the LDD region. In this manner, the high withstand voltage can be achieved. The charge amount (impurity concentration) in the drain-side LDD region and the distance along the surface (main surface of the semiconductor substrate SB) between an end of the channel forming region and the $n^+$-type region ($n^+$-type semiconductor region HD) are preferably optimized so that the breakdown voltage of the LDMOSFET is maximized.

In the LDMOSFET, the source (source region made up of the $n^+$-type semiconductor region SR) and the drain (drain region made up of the n-type semiconductor region NW and the $n^+$-type semiconductor region HD) are asymmetrical with respect to the gate electrode GE.

In the p-type semiconductor region PW of the semiconductor substrate SB, the $p^+$-type semiconductor region PR is formed at a position adjacent to the $n^+$-type semiconductor region (source region) SR. This $p^+$-type semiconductor region PR is formed on an opposite side of the channel forming region. More specifically, the $n^|$-type semiconductor region (source region) SR is adjacent to the channel forming region, and the $p^+$-type semiconductor region PR is formed on a side opposite to the channel forming region so as to be adjacent to the $n^+$-type semiconductor region (source region) SR.

If necessary, a metal silicide layer (not shown) may be formed on the $n^+$-type semiconductor region (source region) SR, the $p^+$-type semiconductor region PR, the $n^+$-type semiconductor region (drain region) HD, and the gate electrode GE. When the metal silicide layer (not shown) is formed, a salicide (self-aligned silicide) technique may be employed.

On the main surface of the semiconductor substrate SB, an insulating film IL1 is formed as an interlayer insulating film so as to cover the gate electrode GE. The insulating film IL1 is made of, for example, a silicon oxide film. The upper surface of the insulating film IL1 is planarized.

Contact holes (openings, through-holes) are formed in the insulating film IL1, and conductive plugs (embedded conductors for connection) P1D, P1G, and P1S made mainly of, for example, a tungsten (W) film are formed in the contact holes. The plugs P1D, P1G, and P1S, which are embedded in the contact holes formed in the insulating film IL1, are formed on each of the drain ($n^+$-type semiconductor region HD), the gate electrode GE, and the source ($n^+$-type semiconductor region SR).

The plug P1D is embedded in the contact hole formed on the $n^+$-type semiconductor region (drain region) HD and is electrically connected to the $n^+$-type semiconductor region (drain region) HD, and is therefore referred to as drain plug P1D. Also, the plug P1G is embedded in the contact hole formed on the gate electrode GE and is electrically connected to the gate electrode GE, and is therefore referred to as gate plug P1G. Furthermore, the plug P1S is embedded in the contact hole formed on the $n^+$-type semiconductor region (source region) SR and is electrically connected to the $n^+$-type semiconductor region (source region) SR, and is therefore referred to as source plug P1S.

The contact hole in which the drain plug P1D is embedded is formed on the $n^+$-type semiconductor region (drain region) HD, and at the bottom of this contact hole, the $n^+$-type semiconductor region (drain region) HD is exposed. The drain plug P1D embedded in the contact hole is in contact with the $n^+$-type semiconductor region (drain region) HD and is thus electrically connected to the $n^+$-type semiconductor region (drain region) HD.

The contact hole in which the gate plug P1G is embedded is formed on the gate electrode GE, and at the bottom of this contact hole, the gate electrode GE is exposed. The gate plug P1G embedded in the contact hole is in contact with the gate electrode GE and is thus electrically connected to the gate electrode GE.

The contact hole in which the source plug P1S is embedded is formed on the $n^+$-type semiconductor region (source region) SR and $p^+$-type semiconductor region PR adjacent thereto. More specifically, the source plug P1S is formed to extend over the $n^+$-type semiconductor region (source region) SR and the $p^+$-type semiconductor region PR adjacent thereto. At the bottom of the contact hole in which the source plug P1S is embedded, both of the $n^+$-type semiconductor region (source region) SR and the $p^+$-type semiconductor region PR are exposed, and the source plug P1S embedded in the contact hole is in contact with both of the $n^+$-type semiconductor region SR and the $p^+$-type semiconductor region PR and is electrically connected to both of the $n^+$-type semiconductor region SR and the $p^+$-type semiconductor region PR. Since the source plug P1S is electrically connected not only to the $n^+$-type semiconductor region (source region) SR but also to the $p^+$-type semiconductor region PR, the same potential as the source potential supplied from the source plug P1S to the $n^+$-type semiconductor region (source region) SR is supplied also from the source plug P1S to the $p^+$-type semiconductor region PR, and is therefore supplied also to the p-type semiconductor region PW in contact with the $p^+$-type semiconductor region PR.

When a metal silicide layer (not shown) is formed on the $n^|$-type semiconductor region (drain region) HD, the drain plug P1D is in contact with the metal silicide layer (not shown) on the $n^+$-type semiconductor region (drain region) HD and is therefore electrically connected to the $n^+$-type semiconductor region (drain region) HD via the metal silicide layer (not shown). Also, when a metal silicide layer (not shown) is formed on the $n^+$-type semiconductor region (source region) SR and the $p^|$-type semiconductor region PR, the source plug P1S is in contact with the metal silicide layer (not shown) on the $n^+$-type semiconductor region SR and the $p^|$-type semiconductor region PR and is therefore electrically connected to the $n^+$-type semiconductor region SR and the $p^|$-type semiconductor region PR via the metal silicide layer (not shown). Also, when a metal silicide layer (not shown) is formed on the gate electrode GE, the gate plug P1G is in contact with the metal silicide layer (not shown) on the gate electrode GE and is therefore electrically connected to the gate electrode GE via the metal silicide layer (not shown).

On the insulating film IL1 in which the plugs P1D, P1G, and P1S are embedded, a wiring (first layer wiring) M1 formed of a conductive film made mainly of aluminum (Al) or aluminum alloy is formed. Therefore, the wiring M1 can be regarded as an aluminum wiring. When an aluminum alloy film is used as a conductive film for the wiring M1, the aluminum alloy film is preferably aluminum-rich, and an aluminum-rich Al—Cu alloy film can be used. The aluminum-rich alloy film mentioned here means an alloy film having an aluminum (Al) composition ratio of 50 atom % or more. The wiring M1 is the wiring in a first wiring layer.

The wiring M1 is formed by, for example, forming a conductive film on the insulating film IL1 in which the plugs P1D, P1G, and P1S are embedded and then patterning the conductive film. An aluminum wiring is preferable as the wiring M1.

The wiring M1 has a drain wiring M1D electrically connected to the n$^+$-type semiconductor region (drain region) HD via the drain plug P1D, a gate wiring M1G electrically connected to the gate electrode GE via the gate plug P1G, and a source wiring (source electrode) M1S electrically connected to both of the n$^+$-type semiconductor region (source region) SR and p$^+$-type semiconductor region PR via the source plug P1S. More specifically, the drain wiring M1D is electrically connected to the n$^+$-type semiconductor region (drain region) HD via the drain plug P1D, the gate wiring M1G is electrically connected to the gate electrode GE via the gate plug P1G, and the source wiring M1S is electrically connected to both of the n$^+$-type semiconductor region (source region) SR and the p$^+$-type semiconductor region PR via the source plug P1S.

The drain wiring M1D, the gate wiring M1G, and the source wiring M1S are the wirings in the same layer that are made of the same material and formed by the same process, but these wirings are separated from each other.

On the insulating film IL1, an insulating film IL2 is formed as an interlayer insulating film so as to cover the wiring M1. The insulating film IL2 is made of, for example, a silicon oxide film. The upper surface of the insulating film IL2 is planarized.

Through-holes (openings) at the bottom of which a part of the wiring M1 is exposed are formed in the insulating film IL2, and conductive plugs (embedded conductors for connection) P2D, P2G, and P2S made mainly of, for example, a tungsten (W) film are formed in the through-holes of the insulating film IL2.

The plug P2D is embedded in the through-hole at the bottom of which the drain wiring M1D is exposed and is electrically connected to the drain wiring M1D, and is thus referred to as drain plug P2D. Also, the plug P2G is embedded in the through-hole at the bottom of which the gate wiring M1G is exposed and is electrically connected to the gate wiring M1G, and is thus referred to as gate plug P2G. Also, the plug P2S is embedded in the through-hole at the bottom of which the source wiring M1S is exposed and is electrically connected to the source wiring M1S, and is thus referred to as source plug P2S.

On the insulating film IL2 in which the plugs P2D, P2G, and P2S are embedded, a wiring (second layer wiring) M2 formed of a conductive film made mainly of aluminum (Al) or aluminum alloy is formed. Therefore, the wiring M2 can be regarded as an aluminum wiring. When an aluminum alloy film is used as a conductive film for the wiring M2, the aluminum alloy film is preferably aluminum-rich, and for example, an aluminum-rich Al—Cu alloy film can be used.

The wiring M2 is formed by, for example, forming a conductive film on the insulating film IL2 in which the plugs P2D, P2G, and P2S are embedded and then patterning the conductive film. An aluminum wiring is preferable as the wiring M2.

The wiring M2 has a drain wiring M2D electrically connected to the drain wiring M1D via the drain plug P2D, a gate wiring M2G electrically connected to the gate wiring M1G via the gate plug P2G, and a source wiring M2S electrically connected to the source wiring M1S via the source plug P2S. More specifically, the drain wiring M2D is electrically connected to the drain wiring M1D via the drain plug P2D, the gate wiring M2G is electrically connected to the gate wiring M1G via the gate plug P2G, and the source wiring M2S is electrically connected to the source wiring M1S via the source plug P2S.

The drain plug P2D is disposed at a position where the drain wiring M2D and the drain wiring M1D overlap when seen in a plan view, and the upper surface of the drain plug P2D is in contact with the drain wiring M2D and the lower surface of the drain plug P2D is in contact with the drain wiring M1D, so that the drain wiring M2D is electrically connected to the drain wiring M1D through the drain plug P2D. Also, the gate plug P2G is disposed at a position where the gate wiring M2G and the gate wiring M1G overlap when seen in a plan view, and the upper surface of the gate plug P2G is in contact with the gate wiring M2G and the lower surface of the gate plug P2G is in contact with the gate wiring M1G, so that the gate wiring M2G is electrically connected to the gate wiring M1G through the gate plug P2G. Furthermore, the source plug P2S is disposed at a position where the source wiring M2S and the source wiring M1S overlap when seen in a plan view, and the upper surface of the source plug P2S is in contact with the source wiring M2S and the lower surface of the source plug P2S is in contact with the source wiring M1S, so that the source wiring M2S is electrically connected to the source wiring M1S through the source plug P2S.

The drain wiring M2D, the gate wiring M2G, and the source wiring M2S are the wirings in the same layer that are made of the same material and formed by the same process, but these wirings are separated from each other.

In this case, the plugs P2D, P2G, and P2S are formed by a process different from a process of forming the wiring M2. More specifically, after the plugs P2D, P2G, and P2S are formed in the through-holes of the insulating film IL2, the wiring M2 is formed. Therefore, the drain wiring M2D and the drain plug P2D are not integrated together, the gate plug P2G and the gate wiring M2G are not integrated together, and the source plug P2S and the source wiring M2S are not integrated together.

In another aspect, the plugs P2D, P2G, and P2S can be formed by the same process by which the wiring M2 is formed. More specifically, it is also possible to form the wiring M2 by forming the though-holes in the insulating film IL2, forming a conductive film on the insulating film IL2 so as to fill the through-holes, and then patterning the conductive film. In this case, the drain plug P2D is integrated with the drain wiring M2D, the gate plug P2G is integrated with the gate wiring M2G, and the source plug P2S is integrated with the source wiring M2S. More specifically, a part of the drain wiring M2D is embedded in the through-hole of the insulating film IL2 to form a via portion integrally formed with the drain wiring M2D (via portion equivalent to the drain plug P2D), and the drain wiring M2D is electrically connected to the drain wiring M1D through the via portion. Also, a part of the gate wiring M2G is embedded in the through-hole of the insulating film IL2 to form a via portion integrally formed with the gate wiring M2G (via portion equivalent to the gate plug P2G), and the gate wiring M2G is electrically connected to the gate wiring M1G through the via portion. Also, a part of the source wiring M2S is embedded in the through-hole of the insulating film IL2 to form a via portion integrally formed with the source wiring M2S (via portion equivalent to the source plug P2S), and the source wiring M2S is electrically connected to the source wiring M1S through the via portion. When the plugs P2D, P2G, and P2S are formed by the same process by which the wiring M2 is formed as described above, since the wiring M2 and the plugs P2D, P2G, and P2S are made of the same conductive film, the plugs P2D, P2G, and P2S are also made mainly of an aluminum film when the wiring M2 is made mainly of an aluminum film.

On the insulating film IL2, an insulating film IL3 is formed as an interlayer insulating film so as to cover the wiring M2. The insulating film IL3 is made of, for example, a silicon oxide film. The upper surface of the insulating film IL3 is planarized.

Through-holes (openings) at the bottom of which a part of the wiring M2 is exposed are formed in the insulating film IL3, and conductive plugs (embedded conductors for connection) P3D, P3G, and P3S made mainly of, for example, a tungsten (W) film are formed in the through-holes of the insulating film IL3.

The plug P3D is embedded in the through-hole at the bottom of which the drain wiring M2D is exposed and is electrically connected to the drain wiring M2D, and is thus referred to as drain plug P3D. Also, the plug P3G is embedded in the through-hole at the bottom of which the gate wiring M2G is exposed and is electrically connected to the gate wiring M2G, and is thus referred to as gate plug P3G. Also, the plug P3S is embedded in the through-hole at the bottom of which the source wiring M2S is exposed and is electrically connected to the source wiring M2S, and is thus referred to as source plug P3S.

On the insulating film IL3 in which the plugs P3D, P3G, and P3S are embedded, a wiring (third layer wiring) M3 formed of a conductive film made mainly of aluminum (Al) or aluminum alloy is formed. Therefore, the wiring M3 can be regarded as an aluminum wiring. When an aluminum alloy film is used as a conductive film for the wiring M3, the aluminum alloy film is preferably aluminum-rich, and for example, an aluminum-rich Al—Cu alloy film can be used.

The wiring M3 is formed by, for example, forming a conductive film on the insulating film IL3 in which the plugs P3D, P3G, and P3S are embedded and then patterning the conductive film. An aluminum wiring is preferable as the wiring M3.

The wiring M3 has a drain wiring M3D electrically connected to the drain wiring M2D via the drain plug P3D, agate wiring M3G electrically connected to the gate wiring M2G via the gate plug P3G, and a source wiring M3S electrically connected to the source wiring M2S via the source plug P3S. More specifically, the drain wiring M3D is electrically connected to the drain wiring M2D via the drain plug P3D, the gate wiring M3G is electrically connected to the gate wiring M2G via the gate plug P3G, and the source wiring M3S is electrically connected to the source wiring M2S via the source plug P3S.

The drain plug P3D is disposed at a position where the drain wiring M3D and the drain wiring M2D overlap when seen in a plan view, and the upper surface of the drain plug P3D is in contact with the drain wiring M3D and the lower surface of the drain plug P3D is in contact with the drain wiring M2D, so that the drain wiring M3D is electrically connected to the drain wiring M2D through the drain plug P3D. Also, the gate plug P3G is disposed at a position where the gate wiring M3G and the gate wiring M2G overlap when seen in a plan view, and the upper surface of the gate plug P3G is in contact with the gate wiring M3G and the lower surface of the gate plug P3G is in contact with the gate wiring M2G, so that the gate wiring M3G is electrically connected to the gate wiring M2G through the gate plug P3G. Furthermore, the source plug P3S is disposed at a position where the source wiring M3S and the source wiring M2S overlap when seen in a plan view, and the upper surface of the source plug P3S is in contact with the source wiring M3S and the lower surface of the source plug P3S is in contact with the source wiring M2S, so that the source wiring M3S is electrically connected to the source wiring M2S through the source plug P3S.

The drain wiring M3D, the gate wiring M3G, and the source wiring M3S are the wirings in the same layer that are made of the same material and formed by the same process, but these wirings are separated from each other.

In this case, the plugs P3D, P3G, and P3S are formed by a process different from a process of forming the wiring M3. More specifically, after the plugs P3D, P3G, and P3S are formed in the through-holes of the insulating film IL3, the wiring M3 is formed. Therefore, the drain wiring M3D and the drain plug P3D are not integrated together, the gate plug P3G and the gate wiring M3G are not integrated together, and the source plug P3S and the source wiring M3S are not integrated together.

In another aspect, the plugs P3D, P3G, and P3S can be formed by the same process by which the wiring M3 is formed. More specifically, it is also possible to form the wiring M3 by forming the though-holes in the insulating film IL3, forming a conductive film on the insulating film IL3 so as to fill the through-holes, and then patterning the conductive film. In this case, the drain plug P3D is integrated with the drain wiring M3D, the gate plug P3G is integrated with the gate wiring M3G, and the source plug P3S is integrated with the source wiring M3S. More specifically, a part of the drain wiring M3D is embedded in the through-hole of the insulating film IL3 to form a via portion integrally formed with the drain wiring M3D (via portion equivalent to the drain plug P3D), and the drain wiring M3D is electrically connected to the drain wiring M2D through the via portion. Also, a part of the gate wiring M3G is embedded in the through-hole of the insulating film IL3 to form a via portion integrally formed with the gate wiring M3G (via portion equivalent to the gate plug P3G), and the gate wiring M3G is electrically connected to the gate wiring M2G through the via portion. Also, a part of the source wiring M3S is embedded in the through-hole of the insulating film IL3 to form a via portion integrally formed with the source wiring M3S (via portion equivalent to the source plug P3S), and the source wiring M3S is electrically connected to the source wiring M2S through the via portion. When the plugs P3D, P3G, and P3S are formed by the same process by which the wiring M3 is formed as described above, since the wiring M3 and the plugs P3D, P3G, and P3S are made of the same conductive film, the plugs P3D, P3G, and P3S are also made mainly of an aluminum film when the wiring M3 is made mainly of an aluminum film.

The wiring M1 is the wiring in a first wiring layer, the wiring M2 is the wiring in a second wiring layer that is an upper layer than the first wiring layer, and the wiring M3 is the wiring in a third wiring layer that is an upper layer than the second wiring layer. Therefore, on the semiconductor substrate SB, a wiring structure having the first wiring layer (wiring M1), the second wiring layer (wiring M2) that is an upper layer than the first wiring layer (wiring M1), and the third wiring layer (wiring M3) that is an upper layer than the second wiring layer (wiring M2) is formed.

In the first wiring layer (wiring M1), the second wiring layer (wiring M2), and the third wiring layer (wiring M3), the main component making up the wirings is the same (same metal element). More specifically, the wiring M1, the wiring M2, and the wiring M3 contain the same metal element as their main component, and preferably contain aluminum (Al) as their main component. Therefore, the first wiring layer (wiring M1), the second wiring layer (wiring M2), and the third wiring layer (wiring M3) are the wiring layers each made of the same metal material. More specifically, if the first wiring layer is an aluminum wiring layer, the second wiring layer and the third wiring layer are also aluminum wiring layers. The aluminum wiring layer is the wiring layer in which an aluminum wiring is formed.

The thickness T3 of the wiring M3 is larger than the thickness T1 of the wiring M1 and the thickness T2 of the wiring M2 (the wiring M3 is thicker than the wirings M1 and M2). In other words, the thickness T1 of the wiring M1 and the thickness T2 of the wiring M2 are smaller than the thickness T3 of the wiring M3 (the wirings M1 and M2 are thinner than the wiring M3). More specifically, when comparing the thickness T3 of the wiring M3, the thickness T2 of the wiring M2, and the thickness T1 of the wiring M1 with each other, the relations T3>T2 and T3>T1 are established. The thickness T2 of the wiring M2 and the thickness T1 of the wiring M1 may be substantially the same (T1=T2) or may be different from each other. For example, the thickness T2 of the wiring M2 may be larger than the thickness T1 of the wiring M1.

The thickness T3 of the wiring M3 is larger than respective thicknesses T1 and T2 of the wirings M1 and M2 (the wiring M3 is thicker than the wirings M1 and M2), and it is more preferable if the thickness T3 of the wiring M3 is equal to or larger than twice the respective thicknesses T1 and T2 of the wirings M1 and T2. For example, the thickness T3 of the wiring M3 can be 1 μm or more.

On the insulating film IL3, an insulating film IL4 is formed as an interlayer insulating film so as to cover the wiring M3. The insulating film IL4 is made of, for example, a silicon oxide film. The upper surface of the insulating film IL4 is planarized.

Openings (through-holes) OP1 at the bottom of which a part of the wiring M3 is exposed are formed in the insulating film IL4. The openings OP1 of the insulating film IL4 have a source opening OP1S formed on the source wiring M3S and a drain opening OP1D formed on the drain wiring M3D. The source opening OP1S formed on the source wiring M3S is included in the source wiring M3S when seen in a plan view, and the drain opening OP1D formed on the drain wiring M3D is included in the drain wiring M3D when seen in a plan view. An opening OP1 through which the gate wiring M3G is exposed is not formed.

On the insulating film IL4 including the wiring M3 exposed through the opening OP1, a re-wiring (wiring, dissimilar wiring) M4 formed of a conductive film made mainly of copper (Cu) or copper alloy is formed. Therefore, the re-wiring M4 can be regarded as a copper wiring. When a copper alloy film is used as a conductive film for the re-wiring M4, the copper alloy film is preferably copper-rich. The copper-rich alloy film mentioned here means an alloy film having a copper (Cu) composition ratio of 50 atom % or more.

The re-wiring M4 can be regarded as the wiring in a fourth wiring layer that is an upper layer than the third wiring layer. However, although the main component of the first to third wiring layers (M1, M2, M3) is the same (same metal element) and the first to third wiring layers (M1, M2, M3) can be regarded as the wiring layers made of the same metal material, the fourth wiring layer (M4) is a dissimilar wiring layer made of a metal material different from the metal material of the first to third wiring layers (M1, M2, M3). More specifically, the main component forming the wirings is the same in the first wiring layer (wiring M1), the second wiring layer (wiring M2), and the third wiring layer (wiring M3), but the main component forming the fourth wiring layer (re-wiring M4) is different from that of the first to third wiring layers (wirings M1, M2, and M3). In other words, the wirings M1, M2, and M3 contain the same metal element as their main component, but the metal element serving as the main component of the wirings M1, M2, and M3 is different from the metal element serving as the main component of the re-wiring M4. It is preferable that the wirings M1, M2, and M3 contain aluminum (Al) as their main component and the re-wiring M4 contains copper (Cu) as its main component. More specifically, the first to third wiring layers (M1, M2, M3) are preferably aluminum wiring layers and the fourth wiring layer (M4) is preferably a copper wiring layer. The copper wiring layer is the wiring layer in which a copper wiring is formed.

The re-wiring M4 is formed in the following manner. That is, a seed layer is formed on the insulating film IL4 including the wiring M3 exposed through the opening OP1, and then a photoresist pattern is formed on the seed layer by photolithography. This photoresist pattern is formed in a region other than the region in which the re-wiring M4 is to be formed and has an opening at a position corresponding to the region in which the re-wiring M4 is to be formed, and the seed layer is exposed through the opening. Then, on the seed layer exposed without being covered with the photoresist pattern, a copper layer (copper plating layer) is formed by plating (preferably, by electrolytic plating). Thereafter, the photoresist pattern is removed, and the part not cover with the copper plating layer (that is, the part of the seed layer covered with the photoresist pattern before it is removed) is removed by etching. In this manner, the re-wiring M4 made up of a laminated film including the seed layer and the copper layer (copper plating layer) on the seed layer is formed.

The re-wiring M4 has a drain re-wiring M4D electrically connected to the drain wiring M3D and a source re-wiring M4S electrically connected to the source wiring M3S. The drain re-wiring M4D is in contact with the drain wiring M3D exposed through the drain opening OP1D of the insulating film IL4, and is electrically connected to the drain wiring M3D. The source re-wiring M4S is in contact with the source wiring M3S exposed through the source opening OP1S of the insulating film IL4, and is electrically connected to the source wiring M3S. The drain re-wiring M4D and the source re-wiring M4S are made of the same material and formed by the same process in the same layer, but are separated from each other. A re-wiring M4 connected to the gate wiring M3G through a conductor is not formed.

The drain opening OP1D is disposed at a position where the drain wiring M3D and the drain re-wiring M4D overlap when seen in a plan view, and the drain re-wiring M4D is in contact with the drain wiring M3D exposed through the drain opening OP1D, so that the drain wiring M3D is electrically connected to the drain re-wiring M4D.

Also, the source opening OP1S is disposed at a position where the source wiring M3S and the source re-wiring M4S overlap when seen in a plan view, and the source re-wiring M4S is in contact with the source wiring M3S exposed through the source opening OP1S, so that the source wiring M3S is electrically connected to the source re-wiring M4S.

On the insulating film IL4, an insulating film (surface protective film) PA is formed so as to cover the re-wiring M4. This insulating film PA is made of, for example, a laminated film of a silicon oxide film and a silicon nitride film formed thereon, and it can function as a protective film (passivation film) of the outermost surface (uppermost layer) of the semiconductor device (semiconductor chip) CP. A resin film (organic insulating film) such as polyimide resin film can be used as the insulating film PA.

A bump opening OP2 is formed in the insulating film PA, and the bump opening OP2 penetrates the insulating film PA, so that the re-wiring M4 is exposed at the bottom of the opening OP2. The bump opening OP2 has a drain opening OP2D through which the drain re-wiring M4D is exposed and a source opening OP2S through which the source re-wiring M4S is exposed.

A bump electrode BP is formed on the re-wiring M4 exposed through the opening OP2 of the insulating film PA. For example, a bump electrode made of solder (solder bump) can be used as the bump electrode BP. It is also possible to form the bump electrode BP on the re-wiring M4 exposed through the opening OP2 via a UBM (Under Bump Metal) film 11 made of a conductive material. The UBM film 11 serving as a bump-base metal layer can be formed of, for example, a laminated film of a palladium (Pd) film and a titanium (Ti) film or a laminated film of a chromium (Cr) film, a nickel (Ni)-based alloy film, and a gold (Au) film. The UBM film 11 may be regarded as a part of the bump electrode BP.

The bump electrode BP includes a drain bump electrode (drain bump) BPD and a source bump electrode (source bump) BPS. The drain bump electrode BPD is the bump electrode BP that is formed on the drain re-wiring M4D exposed through the drain opening OP2D, and the source bump electrode BPS is the bump electrode BP that is formed on the source re-wiring M4S exposed through the source opening OP2S. More specifically, the bump electrode BP connected to the drain wiring M3D through a conductor (here, drain re-wiring M4D) is the drain bump electrode BPD, and the bump electrode BP connected to the source wiring M3S through a conductor (here, source re-wiring M4S) is the source bump electrode BPS. However, a bump electrode BP connected to the gate wiring M3G through a conductor is not formed.

The drain ($n^+$-type semiconductor region HD) of the LDMOSFET formed on the semiconductor substrate SB is electrically connected to the drain bump electrode BPD via the drain plug P1D, drain wiring M1D, drain plug P2D, drain wiring M2D, drain plug P3D, drain wiring M3D, and drain re-wiring M4D. Also, the source ($n^+$-type semiconductor region SR) of the LDMOSFET formed on the semiconductor substrate SB is electrically connected to the source bump electrode BPS via the source plug P1S, source wiring M1S, source plug P2S, source wiring M2S, source plug P3S, source wiring M3S, and source re-wiring M4S. Also, the gate electrode GE of the LDMOSFET formed on the semiconductor substrate SB is electrically connected to the gate wiring M3G via the gate plug P1G, gate wiring M1G, gate plug P2G, gate wiring M2G, and gate plug P3G, but a re-wiring M4 and a bump electrode BP that are connected to the gate electrode GE of the LDMOSFET through a conductor are not formed.

<Configuration Example of Semiconductor Package>

Figure 17:
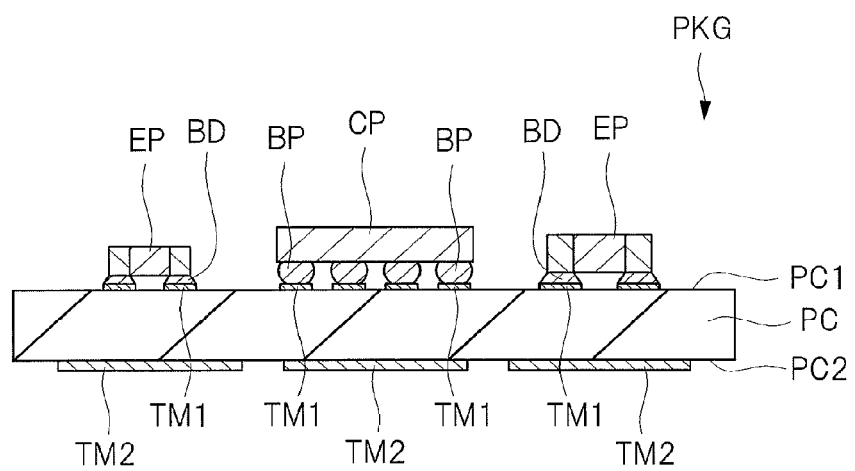
FIG. 17 is a sectional view schematically showing an example of a semiconductor device obtained by packaging the semiconductor device of the embodiment.

FIG. 17 is a sectional view schematically showing an example of a semiconductor device (semiconductor package) PKG obtained by packaging the semiconductor device (semiconductor chip) CP of this embodiment.

As shown in FIG. 17, the semiconductor device (semiconductor package) PKG includes a circuit board PC, the semiconductor device (semiconductor chip) CP mounted on an upper surface PC1 of the circuit board PC, and an electronic component EP mounted on the upper surface PC1 of the circuit board PC.

Since the configuration of the semiconductor device (semiconductor chip) CP has already been described above, the repetitive description thereof is omitted here.

For example, a multilayer circuit board (multilayer board) obtained by laminating and integrating a plurality of insulator layers (dielectric layers) and a plurality of conductive layers or wiring layers can be used as the circuit board PC. In FIG. 17, the plurality of insulator layers making up the circuit board PC are not shown as individual layers but shown as an integrated layer and illustration of an internal wiring layer in the circuit board PC is omitted for simplicity.

The semiconductor device (semiconductor chip) CP is connected to the upper surface (main surface) PC1 of the circuit board PC by flip-chip bonding. More specifically, the semiconductor device (semiconductor chip) CP is mounted on the upper surface PC1 of the circuit board PC so that the back surface of the semiconductor device CP is directed upward and the front surface thereof faces the upper surface PC1 of the circuit board PC. Therefore, the semiconductor device (semiconductor chip) CP is bonded facedown on the upper surface PC1 of the circuit board PC. The front surface of the semiconductor device (semiconductor chip) CP corresponds to its main surface on which bump electrodes BP are formed, and the back surface of the semiconductor device (semiconductor chip) CP corresponds to its main surface opposite to the main surface on which the bump electrodes BP are formed. The bump electrodes BP on the surface of the semiconductor device (semiconductor chip) CP are bonded to terminals (electrodes) TM1 on the upper surface PC1 of the circuit board PC and are electrically connected thereto.

The electronic component EP is, for example, a passive component such as a chip component. The electronic component EP is mounted on the upper surface PC1 of the circuit board PC, and the electrodes of the electronic component EP are electrically connected to terminals (electrodes) TM1 on the upper surface PC1 of the circuit board PC. For example, the electrodes of the electronic component EP are bonded to the terminals TM1 on the upper surface PC1 of the circuit board PC by a conductive bonding material BD such as solder, and are electrically connected thereto.

The terminals TM1 on the upper surface PC1 of the circuit board PC to which the semiconductor device (semiconductor chip) CP or the electronic component EP is electrically connected are coupled via the wiring on the upper surface PC1 or inside the circuit board PC when necessary, and are electrically connected to terminals (external connection terminals) TM2 on the lower surface PC2 of the circuit board PC. The terminals TM2 on the lower surface PC2 of the circuit board PC can function as external connection terminals of the semiconductor device PKG.

The semiconductor device PKG can be mounted on an external circuit board or mother board (not shown).

In another aspect, in the semiconductor device PKG, a sealing resin (not shown) may be formed on the upper surface PC1 of the circuit board PC so as to cover the semiconductor device (semiconductor chip) CP and the electronic component EP.

<Layout of LDMOSFET and Wiring>

Next, a planar layout of LDMOSFETs formed in the semiconductor substrate SB and wirings formed on the semiconductor substrate SB will be described.

As shown in FIGS. 2 and 7, LDMOSFETs making up a power MISFET are formed in the LDMOSFET forming region LR on the main surface of the semiconductor substrate SB. The LDMOSFET forming region LR mentioned here is the planar region in which LDMOSFETs making up the power MISFET are formed on the main surface of the semiconductor substrate SB. Though details thereof will be described later, a plurality of unit LDMOSFETs 10a are formed in the LDMOSFET forming region LR, and one power MISFET is formed by connecting the plurality of unit LDMOSFETs 10*a* formed in the LDMOSFET forming region LR in parallel. Therefore, the LDMOSFET forming region LR can be regarded as the region in which the power MISFET is formed (power MISFET forming region).

As shown in FIG. 2 and others, the driver circuit region DR is disposed adjacent to the LDMOSFET forming region LR on the main surface of the semiconductor substrate SB. The driver circuit region DR is preferably adjacent to the LDMOSFET forming region LR in the Y direction (extending direction of gate electrodes GE in the LDMOSFET forming region LR).

On the main surface of the semiconductor substrate SB, the driver circuit region DR is the region in which a driver circuit (drive circuit) for the power MISFET formed in the LDMOSFET forming region LR is formed. More specifically, the power MISFET formed in the LDMOSFET forming region LR is driven or controlled by the driver circuit (drive circuit) formed in the driver circuit region DR. In other words, the driver circuit (drive circuit) formed in the driver circuit region DR is the circuit that controls the potential of the gate electrode of the power MISFET formed in the LDMOSFET forming region LR, thereby controlling the operation of the power MISFET. Therefore, the output of the driver circuit (drive circuit) formed in the driver circuit region DR is electrically connected to the gate electrode of the power MISFET formed in the LDMOSFET forming region LR.

The planar shape of each of the LDMOSFET forming region LR and the driver circuit region DR is, for example, a substantially rectangular shape (more specifically, a rectangular shape having sides parallel with the X direction and sides parallel with the Y direction) or a semi-rectangular shape obtained by slightly modifying a basic rectangular shape.

In the LDMOSFET forming region LR, the sources ($n^+$-type semiconductor regions SR) and drains ($n^+$-type semiconductor regions HD) of the LDMOSFETs are formed on the semiconductor substrate SB, and the gate electrodes GE are formed on the semiconductor substrate SB between the sources and the drains via the gate insulating films GI.

As shown in FIG. 7, the gate electrode GE of the LDMOSFET extends in the Y direction in the LDMOSFET forming region LR. Also, the drain ($n^+$-type semiconductor region HD) of the LDMOSFET is formed in a region between the adjacent gate electrodes GE and extends in the Y direction in the LDMOSFET forming region LR. The source ($n^+$-type semiconductor region SR) of the LDMOSFET is formed in a different region between the adjacent gate electrodes GE and extends in the Y direction in the LDMOSFET forming region LR.

In the LDMOSFET forming region LR, the structure (layout) of a unit cell (repetitive unit, repetitive pitch, basic cell, unit region, unit cell of LDMOSFET) 10 as shown in FIGS. 7, 10 and 11 is repeated in the X direction. One unit cell 10 forms two unit LDMOSFETs (unit LDMOSFET element, LDMOSFET cell, unit MISFET element) 10*a*. More specifically, although the repetitive unit is the unit cell 10, each unit cell 10 is made up of two unit LDMOSFETs 10*a* which are symmetrical with each other in the X direction and share the $n^+$-type semiconductor region HD serving as the high concentration drain region. Since the LDMOSFET is a MISFET element, the unit LDMOSFET 10*a* can be regarded as a unit MISFET element.

In the LDMOSFET forming region LR, a large number (plurality) of unit LDMOSFETs 10*a* are formed (arranged) by repeating the structure (layout) of the unit cell 10 in the X direction, and the large number (plurality) of unit LDMOSFETs 10*a* are connected in parallel. More specifically, in the LDMOSFET forming region LR, the unit LDMOSFETs 10*a* are repeatedly arranged in the X direction, and the plurality of unit LDMOSFETs 10*a* arranged in the LDMOSFET forming region LR are connected in parallel with each other.

In order to connect the plurality of unit LDMOSFETs 10*a* formed in the LDMOSFET forming region LR in parallel with each other, the gate electrodes GE of the plurality of unit LDMOSFETs 10*a* in the LDMOSFET forming region LR are electrically connected to each other via the gate plugs P1G, P2G, and P3G and the gate wirings M1G, M2G, and M3G. Also, the sources ($n^+$-type semiconductor regions SR) of the plurality of unit LDMOSFETs 10*a* formed in the LDMOSFET forming region LR are electrically connected to each other via the source plugs P1S, P2S, and P3S and the source wirings M1S, M2S, and M3S. Also, the drains ($n^l$-type semiconductor regions HD) of the plurality of unit LDMOSFETs 10*a* formed in the LDMOSFET forming region LR are electrically connected to each other via the drain plugs P1D, P2D, and P3D and the drain wirings M1D, M2D, and M3D.

As described above, the output of the driver circuit (drive circuit) formed in the driver circuit region DR needs to be electrically connected to the gate electrode of the power MISFET formed in the LDMOSFET forming region LR. More specifically, the output of the driver circuit (drive circuit) formed in the driver circuit region DR needs to be electrically connected to the gate electrodes GE of the plurality of unit LDMOSFETs 10*a* formed in the LDMOSFET forming region LR. Therefore, a wiring (any one of the wirings M1, M2, and M3) connected to the driver circuit formed in the driver circuit region DR needs to be connected to any one of the gate wirings M1G, M2G, and M3G.

Figure 14:
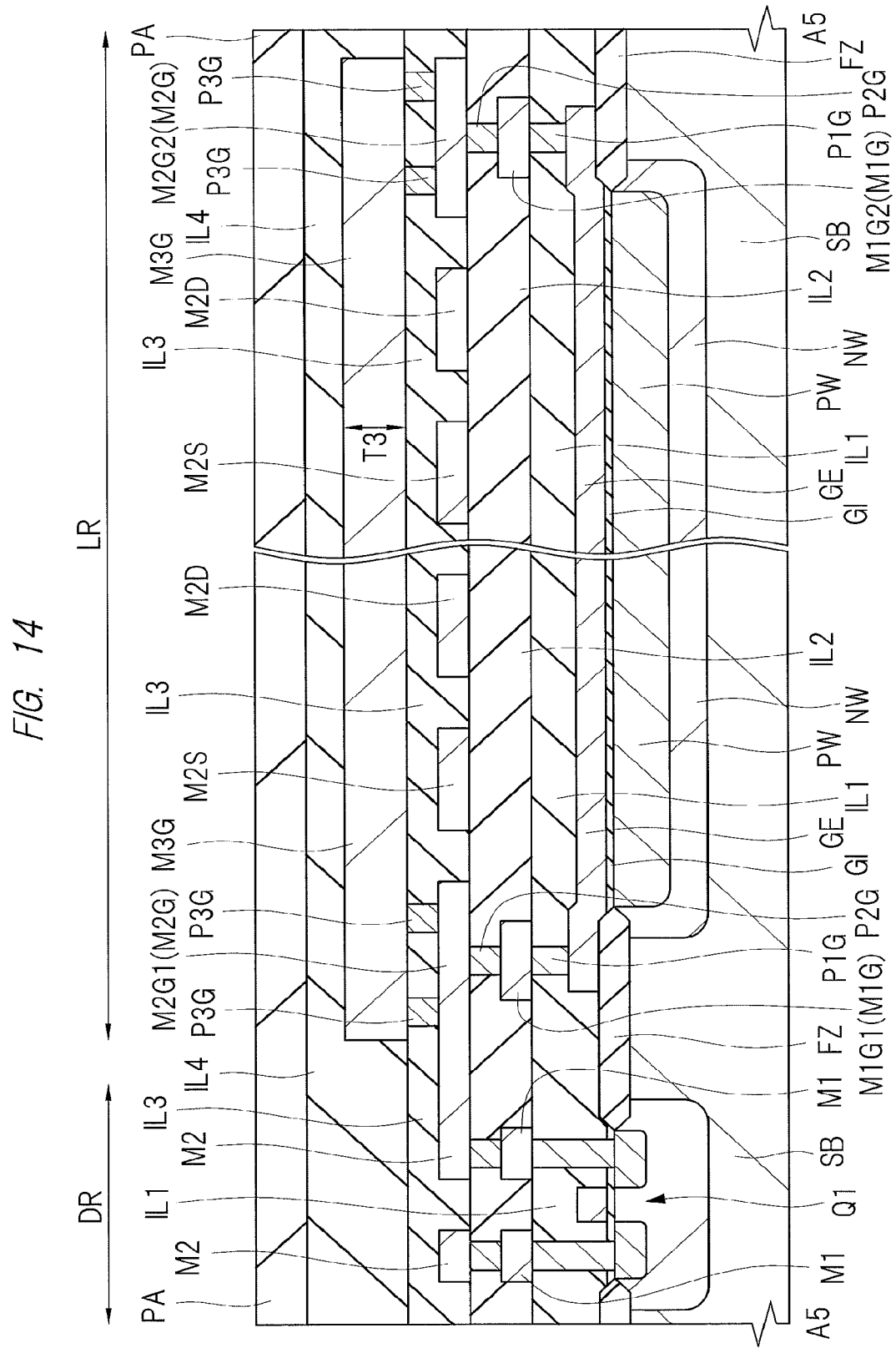
FIG. 14 is a sectional view of a principle part of the semiconductor device of the embodiment.

For example, as shown in FIG. 14, the wiring M2 integrally formed with the gate wiring M2G1 is extended to the driver circuit region DR, so that the gate wiring M2G1 can be electrically connected to the driver circuit formed in the driver circuit region DR via the wiring M2 and the wiring M1 in a lower layer of the wiring M2. In other words, a part of the gate wiring M2G1 is extended to the driver circuit region DR, so that the gate wiring M2G1 can be electrically connected to the driver circuit formed in the driver circuit region DR via the gate wiring M2G1 extended to the driver circuit region DR and the wiring M1 in a lower layer of the gate wiring M2G1. In this manner, the gate electrodes GE of the plurality of unit LDMOSFETs 10*a* formed in the LDMOSFET forming region LR are electrically connected to each other via the gate plugs P1G, P2G, and P3G and the gate wirings M1G, M2G, and M3G, and are electrically connected to the driver circuit formed in the driver circuit region DR via the gate wiring M2G and others. FIG. 14 schematically shows a semiconductor element Q1 (for example, MISFET element) for the output of the driver circuit, and this output of the semiconductor element Q1 is connected to any one of the gate wirings M1G, M2G, and M3G (gate wiring M2G1 in the case of FIG. 14) via one or more of the wirings M1, M2, and M3.

One power MISFET is formed by connecting the plurality of unit LDMOSFETs 10*a* formed in the LDMOSFET forming region LR in parallel with each other. This power MISFET functions as, for example, a switching power MISFET and corresponds to any one of the power MOS transistor QH and the power MOS transistor QL described above. When the power MISFET formed in the LDMOS- FET forming region LR is the power MOS transistor QH described above, the driver circuit formed in the driver circuit region DR corresponds to the driver circuit DR1 described above. When the power MISFET formed in the LDMOSFET forming region LR is the power MOS transistor QL described above, the driver circuit formed in the driver circuit region DR corresponds to the driver circuit DR2 described above.

Also, by forming a plurality of unit MISFETs in the LDMOSFET forming region LR and connecting the plurality of unit MISFETs in parallel, the power MISFET is formed. In this case, when the LDMOSFET is used as the unit MISFET, the advantage of the improvement in withstand voltage can be achieved. However, if it is not necessary to care about the withstand voltage, the power MISFET can be formed by forming a plurality of ordinary MISFETs other than the LDMOSFET as the unit MISFETs in the LDMOSFET forming region LR and connecting the plurality of unit MISFETs in parallel. Therefore, in this embodiment, it is preferable to use the LDMOSFETs as the unit MISFETs connected in parallel to form the power MISFET, but ordinary MISFETs other than the LDMOSFETs may also be used as the unit MISFETs in another aspect. Furthermore, in still another aspect, various types of LDMOSFETs (for example, LDMOSFET using no field insulating film FZ) other than the LDMOSFET with the configuration described above may be used as the unit MISFETs connected in parallel to form the power MISFET.

The case where n-channel type MISFETs are used as the unit MISFETs connected in parallel to form the power MISFET has been described in this embodiment. In another aspect, p-channel type MISFETs can also be used as the unit MISFETs.

Next, the layout of the wirings M1 (source wiring M1S, drain wiring M1D, gate wiring M1G) in the LDMOSFET forming region LR will be described.

As shown in FIGS. 3, 8, and 10 to 16, in the LDMOSFET forming region LR, the source wiring M1S, the drain wiring M1D, and the gate wiring M1G are formed in the first wiring layer.

The source wiring M1S is formed above the source ($n^+$-type semiconductor regions SR) of the LDMOSFET formed in the LDMOSFET forming region LR, and the source wiring M1S is electrically connected to the source ($n^|$-type semiconductor regions SR) of the LDMOSFET below the source wiring M1S via the source plug P1S.

As shown in FIGS. 7, 10, and 11, between two gate electrodes GE adjacent to each other in the X direction across the source, the $n^+$-type semiconductor region SR, the $p^+$-type semiconductor region PR, and the $n^+$-type semiconductor region SR are arranged in this order in the X direction and extend in the Y direction. More specifically, between two gate electrodes GE adjacent to each other in the X direction across the source, a structure in which the $p^+$-type semiconductor region PR extending in the Y direction is sandwiched between a pair of the $n^+$-type semiconductor regions SR each extending in the Y direction is disposed. The source plug P1S is disposed between the two gate electrodes GE adjacent to each other in the X direction across the source, and the source plug P1S is in contact with and electrically connected to the $p^+$-type semiconductor region PR and the pair of $n^+$-type semiconductor regions SR sandwiching the $p^-$-type semiconductor region PR.

The source wiring M1S is continuously formed from above one of the two gate electrodes GE adjacent to each other in the X direction across the source to above the other of the two gate electrodes GE. Therefore, the source wiring M1S extends above the region between the two gate electrodes GE adjacent to each other in the X direction across the source, and this source wiring M1S is electrically connected via the source plug P1S to the $p^+$-type semiconductor region PR and the pair of $n^+$-type semiconductor regions SR sandwiching the $p^+$-type semiconductor region PR disposed between the two gate electrodes GE adjacent to each other in the X direction across the source.

FIGS. 7, 10, and 11 show the case where one source plug P1S is connected to the $p^+$-type semiconductor region PR and the pair of $n^|$-type semiconductor regions SR sandwiching the $p^|$-type semiconductor region PR. In another aspect, a plug connecting the $p^|$-type semiconductor region PR to the source wiring M1S and a plug connecting the $n^+$-type semiconductor regions SR to the source wiring M1S may be provided separately.

Also, the drain wiring M1D is formed above the drain ($n^+$-type semiconductor regions HD) of the LDMOSFET formed in the LDMOSFET forming region LR, and the drain wiring M1D is electrically connected to the drain ($n^+$-type semiconductor regions HD) of the LDMOSFET below the drain wiring M1D via the drain plug P1D.

As shown in FIGS. 7, 10, and 11, between two gate electrodes GE adjacent to each other in the X direction across the drain, the $n^+$-type semiconductor region HD serving as the high concentration drain region extends in the Y direction. The drain plug P1D is disposed between the two gate electrodes GE adjacent to each other in the X direction across the drain, and the drain plug P1D is in contact with and electrically connected to the $n^+$-type semiconductor region HD serving as the high concentration drain region.

The drain wiring M1D is continuously formed from above one of the two gate electrodes GE adjacent to each other in the X direction across the drain to above the other of the two gate electrodes GE. Therefore, the drain wiring M1D extends above the region between the two gate electrodes GE adjacent to each other in the X direction across the drain, and this drain wiring M1D is electrically connected via the drain plug P1D to the $n^+$-type semiconductor region HD disposed between the two gate electrodes GE adjacent to each other in the X direction across the drain.

In the LDMOSFET forming region LR, the gate electrode GE extends in the Y direction, the $n^+$-type semiconductor region SR serving as the source region also extends in the Y direction, and the $n^+$-type semiconductor region HD serving as the high concentration drain region also extends in the Y direction. Therefore, the source wiring M1S that extends above the $n^+$-type semiconductor region SR (source region) extending in the Y direction and is connected to the $n^+$-type semiconductor region SR (source region) via the source plug P1S also extends in the Y direction. The drain wiring M1D that extends above the $n^|$-type semiconductor region HD (high concentration drain region) extending in the Y direction and is connected to the $n^+$-type semiconductor region HD (high concentration drain region) via the drain plug P1D also extends in the Y direction. Thus, four elements such as the $n^+$-type semiconductor region SR (source region), the gate electrode GE, the $n^+$-type semiconductor region HD (high concentration drain region), and the gate electrode GE each extending in the Y direction are arranged in this order in the X direction, and this array of the four elements is repeated in the X direction. Therefore, in the LDMOSFET forming region LR, the source wirings M1S extending in the Y direction and the drain wirings M1D extending in the Y direction are arranged alternately in the X direction. However, the source wiring M1S and the drain wirings M1D are separated from each other with the insulating film IL2 interposed therebetween. Each of the source wirings M1S and the drain wirings M1D can be formed into a substantially rectangular pattern (planar shape) with long sides extending in the Y direction.

As describe above, a plurality of unit cells 10 (unit LDMOSFETs 10a) are formed in the LDMOSFET forming region LR. The source ($n^+$-type semiconductor region SR) of each of the plurality of unit cells 10 (unit LDMOSFETs 10a) is electrically connected to the source wiring M1S via the source plug P1S, and the drain ($n^+$-type semiconductor region HD) of each of the plurality of unit cells 10 (unit LDMOSFETs 10a) is electrically connected to the drain wiring M1D via the drain plug P1D. Also, two unit LDMOSFETs 10a adjacent to each other across the source share the $n^+$-type semiconductor region SR (source region), and two unit LDMOSFETs 10a adjacent to each other across the drain share the $n^+$-type semiconductor region HD (high concentration drain region). Therefore, one source wiring M1S and one drain wiring M1D are formed for each two unit LDMOSFETs 10a. In other words, one source wiring M1S and one drain wiring M1D are formed for each unit cell 10. Therefore, in the LDMOSFET forming region LR, a plurality of source wirings M1S extending in the Y direction and a plurality of drain wirings M1D extending in the Y direction are arranged alternately in the X direction, and the number of the source wirings M1S extending in the Y direction and the number of the drain wirings M1D extending in the Y direction approximately corresponds to the number of unit cells 10 arranged in the X direction in the LDMOSFET forming region LR. In other words, in the LDMOSFET forming region LR, a plurality of source wirings M1S extending in the Y direction and a plurality of drain wirings M1D extending in the Y direction are arranged alternately in the X direction, and the number of the source wirings M1S extending in the Y direction and the number of the drain wirings M1D extending in the Y direction approximately corresponds to the half of the number of unit LDMOSFETs 10a arranged in the X direction in the LDMOSFET forming region LR.

As shown in FIGS. 2, 3, 7, 8, 12 to 14, in the LDMOSFET forming region LR, a plurality of gate electrodes GE extend in the Y direction, and the plurality of gate electrodes GE are each electrically connected to the gate wiring M1G extending in the X direction via the gate plugs P1G. More specifically, the gate wiring M1G extends in the X direction so as to overlap a part of each of the gate electrodes GE extending in the Y direction when seen in a plan view, and by disposing the gate plugs P1G at positions where each gate electrode GE overlaps the gate wiring M1G when seen in a plan view, each gate electrode GE is electrically connected to the common gate wiring M1G extending in the X direction. Therefore, the plurality of gate electrodes GE formed in the LDMOSFET forming region LR and extending in the Y direction are electrically connected to each other via the gate wiring M1G extending in the X direction (and the gate plugs P1G).

The gate wiring M1G is disposed at each of both ends of the LDMOSFET forming region LR in the Y direction so as to extend in the X direction. More specifically, there are a gate wiring M1G (M1G1) extending in the X direction so as to overlap one ends of the gate electrodes GE extending in the Y direction when seen in a plan view and a gate wiring M1G (M1G2) extending in the X direction so as to overlap the other ends of the gate electrodes GE extending in the Y direction when seen in a plan view. In other words, the gate wirings M1G extending in the X direction are disposed at a predetermined interval in the Y direction (equivalent to the dimension of the gate electrode GE in the Y direction), and a plurality of source wirings M1S and drain wirings M1D extending in the Y direction are disposed between the two gate wirings M1G. Here, one of the two gate wirings M1G disposed at a predetermined interval in the Y direction (gate wiring M1G on a side close to the driver circuit region DR) is denoted by M1G1 and is referred to as gate wiring M1G1, and the other of the two gate wirings M1G (gate wiring M1G on a side distant from the driver circuit region DR) is denoted by M1G2 and is referred to as gate wiring M1G2. Therefore, of the gate wirings M1G1 and M1G2, the gate wiring M1G1 is closer to the driver circuit region DR.

Therefore, in the LDMOSFET forming region LR, a plurality of gate electrodes GE extending in the Y direction are formed, and one ends of the gate electrodes GE in the Y direction are connected to the gate wiring M1G1 extending in the X direction via the gate plugs P1G and the other ends of the gate electrodes GE in the Y direction are connected to the gate wiring M1G2 extending in the X direction via the gate plugs P1G. More specifically, the plurality of gate electrodes GE formed in the LDMOSFET forming region LR and extending in the Y direction have one ends connected with each other via the gate plugs P1G and the gate wiring M1G1 and the other ends connected with each other via the gate plugs P1G and the gate wiring M1G2. The ends of the gate electrodes GE that are connected to the gate wiring M1G1 via the gate plugs P1G correspond to the ends on a side close to the driver circuit region DR, and the ends thereof that are connected to the gate wiring M1G2 via the gate plugs P1G correspond to the ends on a side distant from the driver circuit region DR. Also, the gate wiring M1G1 extending in the X direction and the gate wiring M1G2 extending in the X direction are arranged so as to face each other in the Y direction, and the plurality of source wirings M1S and drain wirings M1D extending in the Y direction are arranged between the gate wiring M1G1 and the gate wiring M1G2. The gate wirings M1G, the source wirings M1S, and the drain wirings M1D are separated from each other via a part of the insulating film IL2.

The gate plugs P1G are disposed on both ends of the gate electrodes GE extending in the Y direction, and it is also possible to locate both ends of the gate electrodes GE on an element isolation region (here, field insulating film FZ) and dispose the gate plugs P1G on the part of gate electrodes GE located on the element isolation region (here, field insulating film FZ). In this manner, even if the positions to form the contact holes for embedding the gate plugs P1G therein are shifted from intended design positions when forming the contact holes in the insulating film IL1, the occurrence of a problem (for example, the gate plugs P1G are connected to the semiconductor substrate SB) can be prevented more readily.

As shown in FIGS. 4 and 9 to 16, in the LDMOSFET forming region LR, the source wiring M2S, the drain wiring M2D, and the gate wiring M2G are formed in the second wiring layer that is an upper layer than the first wiring layer.

In the LDMOSFET forming region LR, the source wirings M2S extending in the X direction and the drain wirings M2D extending in the X direction are arranged alternately in the Y direction. More specifically, in the LDMOSFET forming region LR, the plurality of source wirings M2S extending in the X direction and the plurality of drain wirings M2D extending in the X direction are disposed, and the source wirings M2S and the drain wirings M2D are arranged alternately in the Y direction. Each of the source wirings M2S and the drain wirings M2D can be formed into a substantially rectangular pattern (planar shape) with long sides extending in the X direction. The source wirings M2S and the drain wirings M2D are separated from each other via the insulating film IL3 interposed therebetween.

In other words, in the LDMOSFET forming region LR, the source wirings M1S extending in the Y direction and the drain wirings M1D extending in the Y direction are arranged alternately in the X direction in the first wiring layer, and the source wirings M2S extending in the X direction and the drain wirings M2D extending in the X direction are arranged alternately in the Y direction in the second wiring layer. Hence, when seen in a plan view, the plurality of source wirings M2S and drain wirings M2D extending in the X direction are formed in the second wiring layer so as to intersect the plurality of source wirings M1S and drain wirings M1D formed in the first wiring layer and extending in the Y direction. Also, the source plugs P2S are disposed at positions where each source wiring M2S and each source wiring M1S overlap (intersect) when seen in a plan view, and the drain plugs P2D are disposed at positions where each drain wiring M2D and each drain wiring M1D overlap (intersect) when seen in a plan view. In this manner, each source wiring M1S is connected to each source wiring M2S via the source plug P2S and each drain wiring M1D is connected to each drain wiring M2D via the drain plug P2D.

Therefore, the plurality of source wirings M1S formed in the LDMOSFET forming region LR are electrically connected to each other via the plurality of source wirings M2S formed in the LDMOSFET forming region LR, and the plurality of drain wirings M1D formed in the LDMOSFET forming region LR are electrically connected to each other via the plurality of drain wirings M2D formed in the LDMOSFET forming region LR. Hence, the source regions ($n^+$-type semiconductor regions SR) of the plurality of unit LDMOSFETs 10*a* formed in the LDMOSFET forming region LR are electrically connected to each other via the source plugs P1S and P2S and the source wirings M1S and M2S. Also, the drain regions ($n^+$-type semiconductor regions HD) of the plurality of unit LDMOSFETs 10*a* formed in the LDMOSFET forming region LR are electrically connected to each other via the drain plugs P1D and P2D and the drain wirings M1D and M2D.

The source wiring M2S is connected to the source wiring M1S but is not connected to the drain wiring M1D. For this reason, the source plugs P2S are disposed at positions where the source wirings M2S and the source wirings M1S overlap (intersect) each other when seen in a plan view, but no element corresponding to the source plug P2S is formed at positions where the source wirings M2S and the drain wirings M1D overlap (intersect) each other when seen in a plan view. Also, the drain wiring M2D is connected to the drain wiring M1D but is not connected to the source wiring M1S. For this reason, the drain plugs P2D are disposed at positions where the drain wirings M2D and the drain wirings M1D overlap (intersect) each other when seen in a plan view, but no element corresponding to the drain plug P2D is formed at positions where the drain wirings M2D and the source wirings M1S overlap (intersect) each other when seen in a plan view.

Above the gate wiring M1G extending in the X direction, the gate wiring M2G is disposed, and the gate wiring M1G is electrically connected to the gate wiring M2G via the gate plugs P2G. More specifically, the gate wiring M2G extending in the X direction is disposed above each of the gate wirings M1G1 and M1G2 extending in the X direction. Here, the gate wiring M2G disposed above the gate wiring M1G1 and connected to the gate wiring M1G1 via the gate plugs P2G is denoted by M2G1 and is referred to as gate wiring M2G1, and the gate wiring M2G disposed above the gate wiring M1G2 and connected to the gate wiring M1G2 via the gate plugs P2G is denoted by M2G2 and is referred to as gate wiring M2G2.

The gate wiring M2G1 extending in the X direction and the gate wiring M2G2 extending in the X direction are arranged at a predetermined interval so as to face each other in the Y direction, and between the gate wiring M2G1 and the gate wiring M2G2, the source wirings M2S extending in the X direction and the drain wirings M2D extending in the X direction are arranged alternately in the Y direction.

The width (dimension in the Y direction) of the source wiring M2S extending in the X direction is preferably larger than the width (dimension in the X direction) of the source wiring M1S extending in the Y direction, and the width (dimension in the Y direction) of the drain wiring M2D extending in the X direction is preferably larger than the width (dimension in the X direction) of the drain wiring M1D extending in the Y direction. Further, the width (dimension in the Y direction) of the gate wiring M2G extending in the X direction is preferably larger than the width (dimension in the Y direction) of the gate wiring M1G extending in the X direction.

As shown in FIGS. 5 and 10 to 16, in the LDMOSFET forming region LR, the source wirings M3S, the drain wirings M3D, and the gate wirings M3G are formed in the third wiring layer that is an upper layer than the second wiring layer.

In the LDMOSFET forming region LR, the source wirings M3S extending in the Y direction and the drain wirings M3D extending in the Y direction are arranged alternately in the X direction. More specifically, in the LDMOSFET forming region LR, the plurality of source wirings M3S extending in the Y direction and the plurality of drain wirings M3D extending in the Y direction are disposed, and the source wirings M3S and the drain wirings M3D are arranged alternately in the X direction. Each of the source wirings M3S and the drain wirings M3D can be formed into a substantially rectangular pattern (planar shape), and for example, can have a substantially rectangular pattern (planar shape) with long sides extending in the Y direction.

The source wirings M3S and the drain wirings M3D are arranged in the X direction so as to be separated at a predetermined interval, and between the source wiring M3S and the drain wiring M3D adjacent to each other in the X direction, the gate wiring M3G extending in the Y direction is disposed. More specifically, each source wiring M3S and each drain wiring M3D are arranged adjacent to each other in the X direction across each gate wiring M3G.

In other words, in the LDMOSFET forming region LR, the source wirings M2S extending in the X direction and the drain wirings M2D extending in the X direction are arranged alternately in the Y direction in the second wiring layer, and the source wirings M3S extending in the Y direction and the drain wirings M3D extending in the Y direction are arranged alternately in the X direction in the third wiring layer. Hence, when seen in a plan view, the plurality of source wirings M3S and drain wirings M3D extending in the Y direction are formed in the third wiring layer so as to intersect the plurality of source wirings M2S and drain wirings M2D formed in the second wiring layer and extending in the X direction. Also, the source plugs P3S are disposed at positions where each source wiring M3S and each source wiring M2S overlap (intersect) when seen in a plan view, and the drain plugs P3D are disposed at positions where each drain wiring M3D and each drain wiring M2D overlap (intersect) when seen in a plan view. In this manner, each source wiring M2S is connected to each source wiring M3S via the source plug P3S and each drain wiring M2D is connected to each drain wiring M3D via the drain plug P3D.

Therefore, the source wirings M3S formed in the LDMOSFET forming region LR are electrically connected to the plurality of source wirings M2S formed in the LDMOSFET forming region LR, and the drain wirings M3D formed in the LDMOSFET forming region LR are electrically connected to the plurality of drain wirings M2D formed in the LDMOSFET forming region LR. In other words, in the LDMOSFET forming region LR, the source wirings M1S, M2S, and M3S are formed, the source wirings M1S, M2S, and M3S are electrically connected to each other, the source wirings M1S are electrically connected to each other, the source wirings M2S are electrically connected to each other, and the source wirings M3S are electrically connected to each other. Similarly, in the LDMOSFET forming region LR, the drain wirings M1D, M2D, and M3D are formed, the drain wirings M1D, M2D, and M3D are electrically connected to each other, the drain wirings M1D are electrically connected to each other, the drain wirings M2D are electrically connected to each other, and the drain wirings M3D are electrically connected to each other.

Therefore, the source regions ($n^+$-type semiconductor regions SR) of the plurality of unit LDMOSFETs 10a formed in the LDMOSFET forming region LR are electrically connected to each other via the source plugs P1S, P2S, and P3S and the source wirings M1S, M2S, and M3S. Also, each source wiring M3S is electrically connected to the source regions ($n^+$-type semiconductor regions SR) of the plurality of unit LDMOSFETs 10a formed in the LDMOSFET forming region LR via the source plugs P3S, P2S, and P1S and the source wirings M2S and M1S. Furthermore, the drain regions ($n^+$-type semiconductor regions HD) of the plurality of unit LDMOSFETs 10a formed in the LDMOSFET forming region LR are electrically connected to each other via the drain plugs P1D, P2D, and P3D and the drain wirings M1D, M2D, and M3D. Each drain wiring M3D is electrically connected to the drain regions ($n^+$-type semiconductor regions HD) of the plurality of unit LDMOSFETs 10a formed in the LDMOSFET forming region LR via the drain plugs P3D, P2D, and P1D and the drain wirings M2D and M1D.

The source wiring M3S is connected to the source wiring M2S but is not connected to the drain wiring M2D. For this reason, the source plugs P3S are disposed at positions where the source wirings M3S and the source wirings M2S overlap (intersect) each other when seen in a plan view, but no element corresponding to the source plug P3S is formed at positions where the source wirings M3S and the drain wirings M2D overlap (intersect) each other when seen in a plan view. Also, the drain wiring M3D is connected to the drain wiring M2D but is not connected to the source wiring M2S. For this reason, the drain plugs P3D are disposed at positions where the drain wirings M3D and the drain wirings M2D overlap (intersect) each other when seen in a plan view, but no element corresponding to the drain plug P3D is formed at positions where the drain wirings M3D and the source wirings M2S overlap (intersect) each other when seen in a plan view.

The width (dimension in the X direction) of each source wiring M3S extending in the Y direction is preferably larger than the width (dimension in the Y direction) of each source wiring M2S extending in the X direction, and the width (dimension in the X direction) of each drain wiring M3D extending in the Y direction is preferably larger than the width (dimension in the Y direction) of each drain wiring M2D extending in the X direction.

Each gate wiring M3G extends in the Y direction between the source wiring M3S and the drain wiring M3D adjacent to each other in the X direction, and one end of the gate wiring M3G extending in the Y direction is connected to the gate wiring M2G1 via the gate plugs P3G and the other end thereof is connected to the gate wiring M2G2 via the gate plugs P3G. More specifically, in the gate wiring M3G extending in the Y direction, one end thereof overlaps the gate wiring M2G1 when seen in a plan view and the gate plugs P3G are disposed at the overlapping part, and the other end thereof overlaps the gate wiring M2G2 when seen in a plan view and the gate plugs P3G are disposed at the overlapping part. Hence, the gate wiring M2G1 and the gate wiring M2G2 are electrically connected to each other via the gate plugs P3G and the gate wirings M3G extending in the Y direction.

In other words, the gate wiring M1G1 and the gate wiring M2G1 are electrically connected to each other via the gate plugs P2G disposed therebetween, and the gate wiring M1G2 and the gate wiring M2G2 are electrically connected to each other via the gate plugs P2G disposed therebetween. Also, the gate wiring M2G1 and the gate wiring M2G2 are electrically connected to each other via the gate plugs P3G and the gate wirings M3G extending in the Y direction. Therefore, the gate wiring M1G1, the gate wiring M2G1, the gate wiring M1G2, the gate wiring M2G2, and the gate wiring M3G are electrically connected to one another. More specifically, the gate wiring M1G (M1G1, M1G2), the gate wiring M2G (M2G1, M2G2), and the gate wiring M3G are electrically connected to one another. The gate wirings M3G extending in the Y direction can have a function to electrically connect the gate wirings M1G1 and M2G1 and the gate wirings M1G2 and M2G2, which are separated from each other in the Y direction, with low resistance.

The function of the gate wirings M3G extending in the Y direction to electrically connect the gate wirings M1G1 and M2G1 and the gate wirings M1G2 and M2G2, which are separated from each other in the Y direction, with low resistance is enhanced if the thickness of the gate wiring M3G is large. More specifically, since the thickness T3 of the wiring M3 is larger than the thickness T1 of the wiring M1 and the thickness T2 of the wiring M2 (the wiring M3 is thicker than the wirings M2 and M1) as described above, the thickness (T3) of the gate wiring M3G is larger than respective thicknesses (T1 and T2) of the gate wirings M1G and M2G (the gate wiring M3G is thicker than the gate wirings M1G and M2G). The wirings M1, M2, and M3 are each made of the same kind of wirings and are specifically aluminum wirings, and the wiring resistance of the same kind of wirings can be reduced as the thickness of the wiring is increased. For this reason, the wiring resistance of the gate wiring M3G which is thicker than the gate wirings M1G and M2G can be made lower than the wiring resistances of the gate wirings M1G and M2G. Therefore, by connecting the gate wirings M1G1 and M2G1 and the gate wirings M1G2 and M2G2, which are separated from each other in the Y direction, by the gate wirings M3G with a large thickness, the gate wirings M1G1 and M2G1 and the gate wirings M1G2 and M2G2 which are separated from each other in the Y direction can be electrically connected with low resistance.

It is also possible to connect the gate wiring M1G1 and the gate wiring M1G2 separated from each other in the Y direction by a gate wiring (M1G) formed integrally with the gate wirings M1G1 and M1G2. Similarly, it is also possible to connect the gate wiring M2G1 and the gate wiring M2G2 separated from each other in the Y direction by a gate wiring (M2G) formed integrally with the gate wirings M2G1 and M2G2.

However, it is particularly effective to connect the gate wirings M1G1 and M2G1 and the gate wirings M1G2 and M2G2, which are separated from each other in the Y direction, by the gate wirings M3G having a large thickness for reducing the total resistance of the gate wirings, and by adopting this method, the plurality of gate electrodes GE formed in the LDMOSFET forming region LR can be electrically connected with low resistance. Also, the plurality of gate electrodes GE formed in the LDMOSFET forming region LR and the driver circuit formed in the driver circuit region DR can be electrically connected with lower resistance.

The gate wiring M3G can be formed into a substantially rectangular pattern (planar shape) with long sides extending in the Y direction. The width (dimension in the X direction) of the gate wiring M3G extending in the Y direction is preferably smaller than the width (dimension in the X direction) of the source wiring M3S and the width (dimension in the X direction) of the drain wiring M3D. In other words, respective widths (dimension in the X direction) of the source wiring M3S and the drain wiring M3D are preferably larger than the width (dimension in the X direction) of the gate wiring M3G extending in the Y direction.

Also, since the source wiring M3S and the drain wiring M3D need to be separated from each other so as to be electrically isolated from each other, it is necessary to provide a space between the source wiring M3S and the drain wiring M3D. Therefore, by disposing the gate wiring M3G between the source wiring M3S and the drain wiring M3D, the reduction in the planar dimension (planar area) of the source wiring M3S and the drain wiring M3D due to providing the gate wiring M3G can be suppressed. As a result, the increase in the source resistance and drain resistance due to providing the gate wiring M3G can be suppressed or prevented.

Also, it is preferable that a plurality of gate wirings M3G extending in the Y direction are formed. The more the number of the gate wirings M3G extending in the Y direction are, the lower the gate resistance becomes. Therefore, in the LDMOSFET forming region LR, there are a plurality of locations where the source wirings M3S and the drain wirings M3D are adjacent to each other in the X direction, and at the locations where the source wirings M3S and the drain wirings M3D are adjacent to each other in the X direction, the gate wirings M3G are preferably extended between the source wirings M3S and the drain wirings M3D. More specifically, in the LDMOSFET forming region LR, the source wirings M3S and the drain wirings M3D are arranged alternately in the X direction, and the gate wirings M3G are disposed (extended) in the regions between the source wirings M3S and the drain wirings M3D. In this manner, in the LDMOSFET forming region LR, a plurality of gate wirings M3G extending in the Y direction are formed, and each gate wiring M3G is disposed between the source wiring M3S and the drain wiring M3D adjacent to each other in the X direction. Also, one end of the gate wiring M3G is connected to the gate wiring M2G1 via the gate plug P3G and the other end thereof is connected to the gate wiring M2G2 via the gate plug P3G. More specifically, the gate wirings M1G1 and M1G2 and the gate wirings M2G1 and M2G2 are electrically connected via the plurality of gate wirings M3G extending in the Y direction.

Also, in the LDMOSFET forming region LR, the gate wiring M3G extending in the Y direction is disposed not only between the source wiring M3S and the drain wiring M3D adjacent to each other in the X direction but also at each of both ends of the LDMOSFET forming region LR in the X direction. In this manner, since the number of the gate wirings M3G extending in the Y direction can be increased, the gate resistance can be further reduced.

Each of the gate electrodes GE of the plurality of unit LDMOSFETs 10a formed in the LDMOSFET forming region LR extends in the Y direction, and one end thereof is connected to the gate wiring M1G1 via the gate plugs P1G and the other end thereof is connected to the gate wiring M1G2 via the gate plugs P1G. Also, the gate wiring M1G1 is connected to the gate wiring M2G1 via the gate plugs P2G, the gate wiring M1G2 is connected to the gate wiring M2G2 via the gate plugs P2G, and the gate wiring M2G1 and the gate wiring M2G2 are connected to each other via the gate plugs P3G and the gate wiring M3G. Hence, the gate electrodes GE of the plurality of unit LDMOSFETs 10a formed in the LDMOSFET forming region LR are electrically connected to each other via the gate plugs P1G, P2G, and P3G and the gate wirings M1G (M1G1, M1G2), M2G (M2G1, M2G2), and M3G. Therefore, the gate wirings M1G (M1G1, M1G2), M2G (M2G1, M2G2), and M3G are electrically connected to the gate electrodes GE of the plurality of unit LDMOSFETs 10a formed in the LDMOSFET forming region LR.

Therefore, the overall layout of the source wirings M1S, M2S, and M3S, the drain wirings M1D, M2D, and M3D, and the gate wirings M1G, M2G, and M3G in the LDMOSFET forming region LR is summarized as follows. That is, in the first wiring layer, the gate wiring M1G1 extending in the X direction and the gate wiring M1G2 extending in the X direction are arranged in the Y direction at a predetermined interval and the plurality of source wirings M1S extending in the Y direction and the plurality of drain wirings M1D extending in the Y direction are arranged alternately in the X direction between the gate wiring M1G1 extending in the X direction and the gate wiring M1G2 extending in the X direction. In the second wiring layer, the gate wiring M2G1 extending in the X direction and the gate wiring M2G2 extending in the X direction are arranged in the Y direction at a predetermined interval and the plurality of source wirings M2S extending in the X direction and the plurality of drain wirings M2D extending in the X direction are arranged alternately in the Y direction between the gate wiring M2G1 extending in the X direction and the gate wiring M2G2 extending in the X direction. In the third wiring layer, the plurality of source wirings M3S extending in the Y direction and the plurality of drain wirings M3D extending in the Y direction are arranged alternately in the X direction and the gate wirings M3G extending in the Y direction are disposed between the source wirings M3S and the drain wirings M3D adjacent to each other in the X direction. Also, the source plugs P2S are disposed at the positions where each source wiring M1S and each source wiring M2S overlap (intersect) each other when seen in a plan view, so that each source wiring M1S and each source wiring M2S are electrically connected to each other via the source plugs P2S. The source plugs P3S are disposed at the positions where each source wiring M2S and each source wiring M3S overlap (intersect) each other when seen in a plan view, so that each source wiring M2S and each source wiring M3S are electrically connected to each other via the source plugs P3S. The drain plugs P2D are disposed at the positions where each drain wiring M1D and each drain wiring M2D overlap (intersect) each other when seen in a plan view, so that each drain wiring M1D and each drain wiring M2D are electrically connected to each other via the drain plugs P2D. The drain plugs P3D are disposed at the positions where each drain wiring M2D and each drain wiring M3D overlap (intersect) each other when seen in a plan view, so that each drain wiring M2D and each drain wiring M3D are electrically connected to each other via the drain plugs P3D. Also, the gate wiring M2G1 and the gate wiring M1G1 are electrically connected to each other via the gate plugs P2G disposed at the position where the gate wiring M2G1 and the gate wiring M1G1 overlap each other when seen in a plan view, and the gate wiring M2G2 and the gate wiring M1G2 are electrically connected to each other via the gate plugs P2G disposed at the position where the gate wiring M2G2 and the gate wiring M1G2 overlap each other when seen in a plan view. The gate wiring M2G1 and the gate wiring M2G2 are electrically connected to each other via the gate plugs P3G disposed at the position where the gate wiring M2G1 and the gate wiring M3G overlap each other when seen in a plan view, the gate plugs P3G disposed at the position where the gate wiring M2G2 and the gate wiring M3G overlap each other when seen in a plan view, and the gate wiring M3G.

Figure 15:
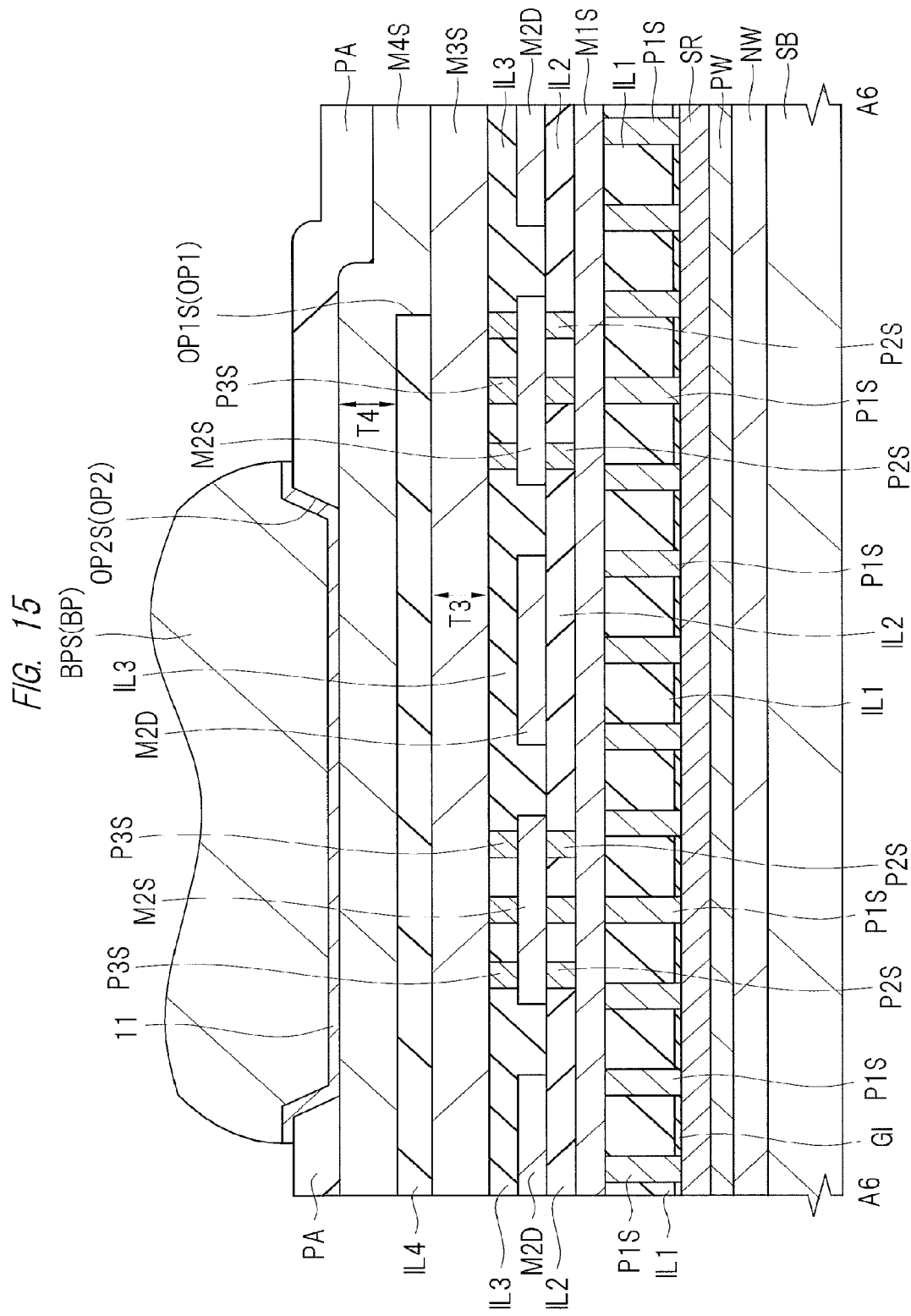
FIG. 15 is a sectional view of a principle part of the semiconductor device of the embodiment.
Figure 16:
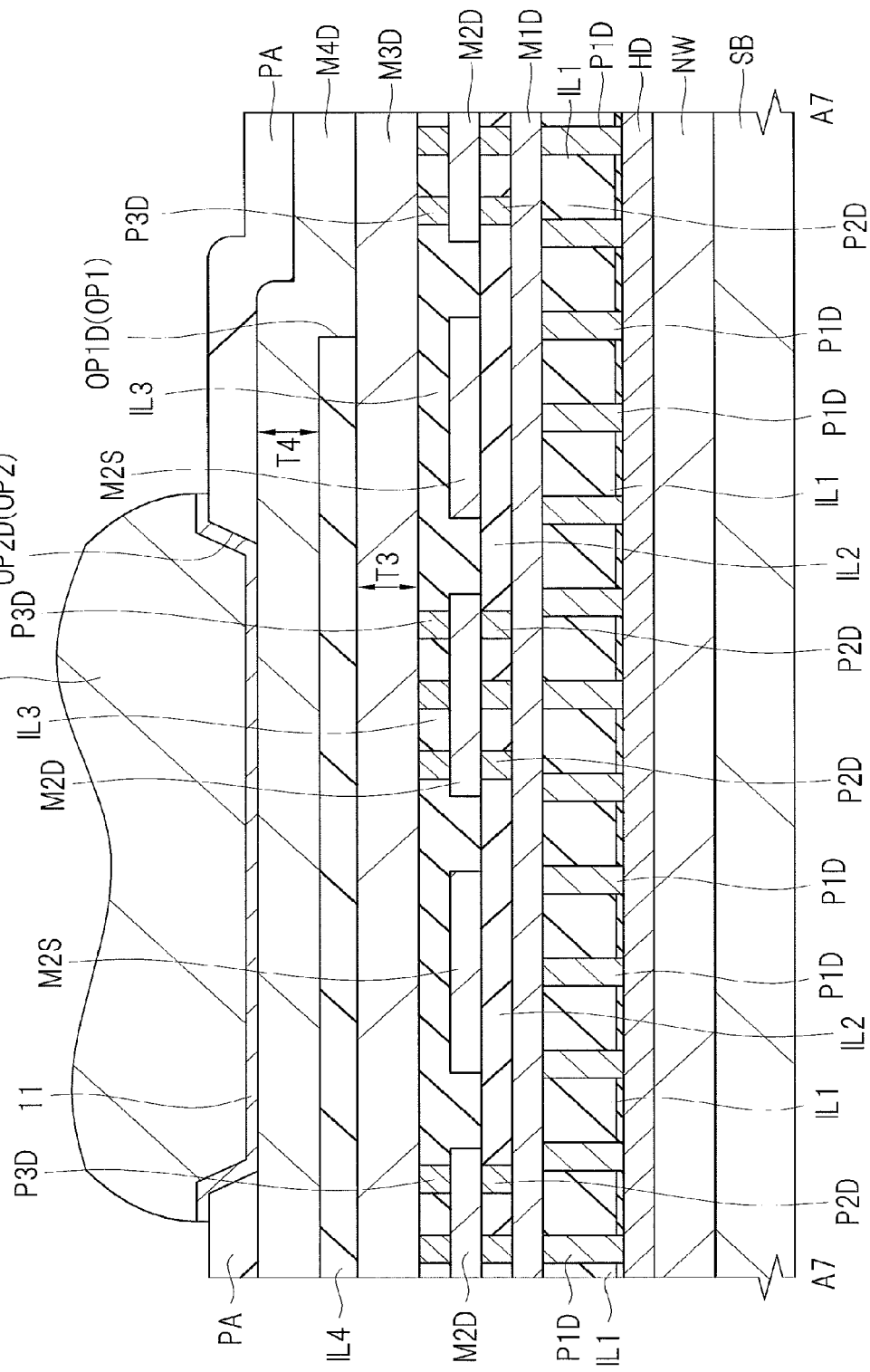
FIG. 16 is a sectional view of a principle part of the semiconductor device of the embodiment.

As shown in FIGS. 6, 15, and 16, in an upper layer than the third wiring layer, the source re-wirings M4S and the drain re-wirings M4D are formed, and the source bump electrodes BPS are formed on the source re-wirings M4S and the drain bump electrodes BPD are formed on the drain re-wirings M4D. The source re-wirings M4S are in contact with the source wirings M3S exposed through the source openings OP1S of the insulating film IL4 and are electrically connected to the source wirings M3S. Hence, the source bump electrodes BPS are electrically connected to the source wirings M3S via the source re-wirings M4S, and are therefore electrically connected to the source regions (n$^+$-type semiconductor regions SR) of the plurality of unit LDMOSFETs 10a formed in the LDMOSFET forming region LR via the source wirings M3S, M2S, and M1S and the source plugs P3S, P2S, and P1S. The drain re-wirings M4D are in contact with the drain wirings M3D exposed through the drain openings OP1D of the insulating film IL4 and are electrically connected to the drain wirings M3D. Hence, the drain bump electrodes BPD are electrically connected to the drain wirings M3D via the drain re-wirings M4D, and are therefore electrically connected to the drain regions (n$^+$-type semiconductor regions HD) of the plurality of unit LDMOSFETs 10a formed in the LDMOSFET forming region LR via the drain wirings M3D, M2D, and M1D and the drain plugs P3D, P2D, and P1D.

Hence, the common source potential (source voltage) can be supplied from the source bump electrodes BPS through the source re-wirings M4S, the source wirings M3S, M2S, and M1S, and the source plugs P3S, P2S, and P1S to the source regions (n$^+$-type semiconductor regions SR) of the plurality of unit LDMOSFETs 10a formed in the LDMOSFET forming region LR. Alternatively, output (output voltage or output current) from the source regions (n$^+$-type semiconductor regions SR) of the plurality of unit LDMOSFETs 10a formed in the LDMOSFET forming region LR can be delivered from the source bump electrodes BPS through the source plugs P1S, P2S, and P3S, the source wirings M1S, M2S, and M3S, and the source re-wirings M4S.

Also, the common drain potential (drain voltage) can be supplied from the drain bump electrodes BPS through the drain re-wirings M4D, the drain wirings M3D, M2D, and M1D, and the drain plugs P3D, P2D, and P1D to the drain regions (n$^+$-type semiconductor regions HD) of the plurality of unit LDMOSFETs 10a formed in the LDMOSFET forming region LR. Alternatively, output (output voltage or output current) from the drain regions (n$^+$-type semiconductor regions HD) of the plurality of unit LDMOSFETs 10a formed in the LDMOSFET forming region LR can be delivered from the drain bump electrodes BPD through the drain plugs P1D, P2D, and P3D, the drain wirings M1D, M2D, and M3D, and the drain re-wirings M4D.

<Background of Examination>

For the miniaturization of an electronic device using a power MISFET as a switching element or the like, the formation of the power MISFET used as the switching element and a control circuit for controlling the power MISFET in one semiconductor chip has been examined.

In a semiconductor chip having a power MISFET formed therein, the source and drain of the power MISFET need to input from or output to the outside of the semiconductor chip. Therefore, bump electrodes are formed as external terminals on the surface of the semiconductor chip, and the source of the power MISFET is connected to a source bump electrode and the drain of the power MISFET is connected to a drain bump electrode. Meanwhile, the gate of the power MISFET needs to be connected to a control circuit that controls the power MISFET. Therefore, when the power MISFET and the control circuit that controls the power MISFET are formed in one semiconductor chip, the gate of the power MISFET is connected to the control circuit through internal wirings of the semiconductor chip.

In view of reducing the on-resistance of the power MISFET, it is desired to reduce the source resistance and the drain resistance. Therefore, a configuration in which an internal wiring in a lower layer having a small thickness is assigned as a gate wiring and an internal wiring in an upper layer having a large thickness is assigned as a source wiring and a drain wiring in a wiring structure formed on a semiconductor substrate making up the semiconductor chip has been first examined. This configuration is proposed when attention is paid to the object of reducing the on-resistance of the power MISFET by reducing the source resistance and the drain resistance.

However, the inventors of the present invention have focused attention on the importance of the reduction of the gate resistance, and have further examined the wiring structure. More specifically, when a plurality of unit MISFETs formed on the semiconductor substrate are connected in parallel to form one power MISFET, it is desired to reduce the gate resistance as much as possible. When the gate resistance is large, the operation speed of the power MISFET is lowered, so that the performance of the semiconductor device is degraded. Also, when the gate resistance is large, the resistance (gate resistance) from each gate electrode GE in the LDMOSFET forming region LR to the control circuit (corresponding to the driver circuit in the driver circuit region DR) significantly varies among the respective gate electrodes GE. For example, a significant difference is caused between the resistance (gate resistance) from a gate electrode GE located close to the driver circuit region DR in the LDMOSFET forming region LR to the driver circuit in the driver circuit region DR and the resistance (gate resistance) from a gate electrode GE located distant from the driver circuit region DR in the LDMOSFET forming region LR to the driver circuit in the driver circuit region DR. In this case, a phase difference is caused between the gate electrodes GE formed in the LDMOSFET forming region LR and this phase difference becomes large. This also degrades the performance of the semiconductor device. In recent years, a demand for high-frequency operation has also been increasing. For example, an inductor element equivalent to the coil L1 described above is formed as an electronic component outside the semiconductor chip, and the miniaturization of the electronic components making up the inductor element has also been demanded, and in conjunction with this, the further improved high-frequency operation of the power MISFET has also been demanded. Accordingly, it is desired to prevent the phase difference between the gate electrodes GE formed in the LDMOSFET forming region LR as much as possible.

In such a circumstance, in the configuration in which the internal wiring of the lower layer having a small thickness is assigned as the gate wiring and the internal wiring of the upper layer having a large thickness is assigned as the source wiring and the drain wiring in the wiring structure formed on the semiconductor substrate making up the semiconductor chip, the reduction of the gate resistance by increasing the width (wiring width) of the gate wiring made of the internal wiring of the lower layer has been examined. However, the increase of the width of the gate wiring (M2G, M1G, GE) made of the internal wiring of the lower layer leads to the increase of the planar area of the gate wiring made of the internal wiring of the lower layer, and this leads to the increase in parasitic resistance between the gate wiring made of the internal wiring of the lower layer and the semiconductor substrate. The increase in the parasitic resistance invites the degradation of the performance of the semiconductor device, and it has an adverse effect on, for example, the high-frequency operation of the power MISFET. Also, since the source region and the drain region cannot be formed just below the gate wiring (GE), the increase of the width of the gate wiring (GE) leads to the reduction of an effective area in the LDMOSFET forming region LR and further leads to the decrease in the number of unit LDMOSFETs which can be disposed in the LDMOSFET forming region LR. This consequently leads to the increase of the planar dimensions of the semiconductor device or the increase of the on-resistance of the power MISFET.

<Major Features and Ingenuities>

The semiconductor device CP of this embodiment includes the semiconductor substrate SB, the plurality of unit LDMOSFETs 10a (unit MISFET elements) formed in the LDMOSFET forming region LR (first MISFET forming region) on the main surface of the semiconductor substrate SB, and the control circuit (driver circuit) formed in the driver circuit region DR (first control circuit forming region) on the main surface of the semiconductor substrate SB. The plurality of unit LDMOSFETs 10a (unit MISFET elements) formed in the LDMOSFET forming region LR (first MISFET forming region) are connected in parallel with each other to form the power MISFET, and the control circuit (driver circuit) formed in the driver circuit region DR (first control circuit forming region) controls the gate voltage of the power MISFET. The semiconductor device CP of this embodiment further includes the wiring structure having the plurality of wiring layers (M1, M2, M3) made of the same metal material and formed on the semiconductor substrate SB. The gate electrodes GE of the plurality of unit LDMOSFETs 10a (unit MISFET elements) formed in the LDMOSFET forming region LR (first MISFET forming region) are electrically connected to each other via the gate wirings (M1G, M2G, M3G) formed in all of the wiring layers (M1, M2, M3) made of the same metal material, respectively.

One of the major features of this embodiment is that the wiring structure having the plurality of wiring layers (M1, M2, M3) made of the same metal material is formed on the semiconductor substrate SB and the gate wirings (M1G, M2G, M3G) are formed in all of the wiring layers (M1, M2, M3) made of the same metal material, respectively.

Concretely, the plurality of wiring layers made of the same metal material, that is, the first wiring layer having the wiring M1 formed therein, the second wiring layer having the wiring M2 formed therein, and the third wiring layer having the wiring M3 formed therein are formed on the semiconductor substrate SB making up the semiconductor device CP. Also, the gate wirings are provided in all of the first, second, and third wiring layers, and the gate wiring M1G, the gate wiring M2G, and the gate wiring M3G are provided in the first wiring layer, the second wiring layer, and the third wiring layer, respectively.

In the case where the gate wirings are provided only in the first and second wiring layers and no gate wiring is provided in the third wiring layer unlike this embodiment, the gate resistance is increased. As described in <Background of Examination> above, when the gate resistance is large, the performance of the semiconductor device having the power MISFET is degraded. For example, when the gate resistance is large, the operation speed (switching speed) of the power MISFET is lowered. Also, since a phase difference is caused between the gate electrodes GE formed in the LDMOSFET forming region LR and this phase difference becomes large, the large gate resistance has an adverse effect on the high-frequency operation.

Also, when the width of the gate wiring is increased in order to reduce the gate resistance in the case where the gate wirings are provided only in the first and second wiring layers and no gate wiring is provided in the third wiring layer unlike this embodiment, as described in <Background of Examination> above, the parasitic resistance between the gate wiring and the semiconductor substrate is increased. The increase of the parasitic resistance leads to the degradation of the performance of the semiconductor device, and it has an adverse effect on, for example, the high-frequency operation of the power MISFET. Also, when the width of the gate wiring is increased in order to reduce the gate resistance in the case where the gate wirings are provided only in the first and second wiring layers and no gate wiring is provided in the third wiring layer unlike this embodiment, as described in <Background of Examination> above, the effective area in the LDMOSFET forming region LR is reduced, and the number of the unit LDMOSFETs which can be disposed in the LDMOSFET forming region LR is also reduced. This consequently leads to the increase of the planar dimensions of the semiconductor device or the increase of the on-resistance of the power MISFET.

Meanwhile, in this embodiment, the gate wirings are provided not only in the first and second wiring layers but also in the third wiring layer. More specifically, the gate wirings are formed in all of the first, second, and third wiring layers. Since the gate wiring (here, gate wiring M3G) is formed also in the third wiring layer, the gate resistance can be reduced, and thus, the performance of the semiconductor device having the power MISFET can be improved. For example, by reducing the gate resistance, the operation speed (switching speed) of the power MISFET can be improved. In addition, the occurrence of a phase difference between the gate electrodes formed in the LDMOSFET forming region LR can be suppressed or prevented. Therefore, the high-frequency operation can be reliably performed.

As described above, in this embodiment, since the wiring structure having the plurality of wiring layers (M1, M2, M3) made of the same metal material is formed on the semiconductor substrate SB and the gate wirings (M1G, M2G, M3G) are formed in all of the plurality of wiring layers (M1, M2, M3) made of the same metal material, the gate resistance can be reduced. As a result, the performance of the semiconductor device having the power MISFET can be improved. For example, by reducing the gate resistance, the operation speed (switching speed) of the power MISFET can be improved. In addition, the occurrence of the phase difference between the plurality of gate electrodes (GE) connected in parallel to form the power MISFET can be suppressed or prevented. Therefore, the high-frequency operation can be reliably performed.

Also, in the wiring structure having the plurality of wiring layers (M1, M2, M3) made of the same metal material formed on the semiconductor substrate SB, the wiring thickness (T3) of the uppermost wiring layer (M3) of plurality of wiring layers (M1, M2, M3) is preferably larger than the wiring thicknesses (T1, T2) of the wiring layers (M1, M2) other than the uppermost wiring layer (M3). Concretely, in the wiring structure having the first, second, and third wiring layers made of the same metal material formed on the semiconductor substrate SB, the thickness T3 of the wiring M3 of the third wiring layer, which is the uppermost wiring layer among the first, second, and third wiring layers, is larger than the thickness T1 of the wiring M1 of the first wiring layer and the thickness T2 of the wiring M2 of the second wiring layer (the wiring M3 is thicker than the wirings M1 and M2).

When wirings are made of the same material, the resistance of each wiring can be reduced as the thickness thereof is increased. Therefore, since the gate wiring (M3G) formed in the third wiring layer has a large thickness, the gate wiring (M3G) can function as a low-resistance wiring. Hence, by forming the gate wiring (M3G) in the third wiring layer having the wiring thickness larger than the wiring thicknesses of the first and second wiring layers, the plurality of gate electrodes (GE) formed in the LDMOSFET forming region LR can be electrically connected to each other via not only the gate wirings (M1G, M2G) of the first and second wiring layers but also the gate wiring (M3G) of the third wiring layer having a larger thickness and lower resistance than the gate wirings (M1G, M2G). As a result, the gate resistance can be reliably reduced.

Furthermore, the wiring structure having the plurality of wiring layers (M1, M2, M3) made of the same metal material is formed on the semiconductor substrate SB. The gate wiring (M3G) formed in the uppermost wiring layer (M3) among the plurality of wiring layers (M1, M2, M3) made of the same metal material functions as a conductive path from the driver circuit (control circuit) formed in the driver circuit region DR to at least some of the plurality of gate electrodes (GE) formed in the LDMOSFET forming region LR. This will be described with reference to FIG. 18.

Figure 18:
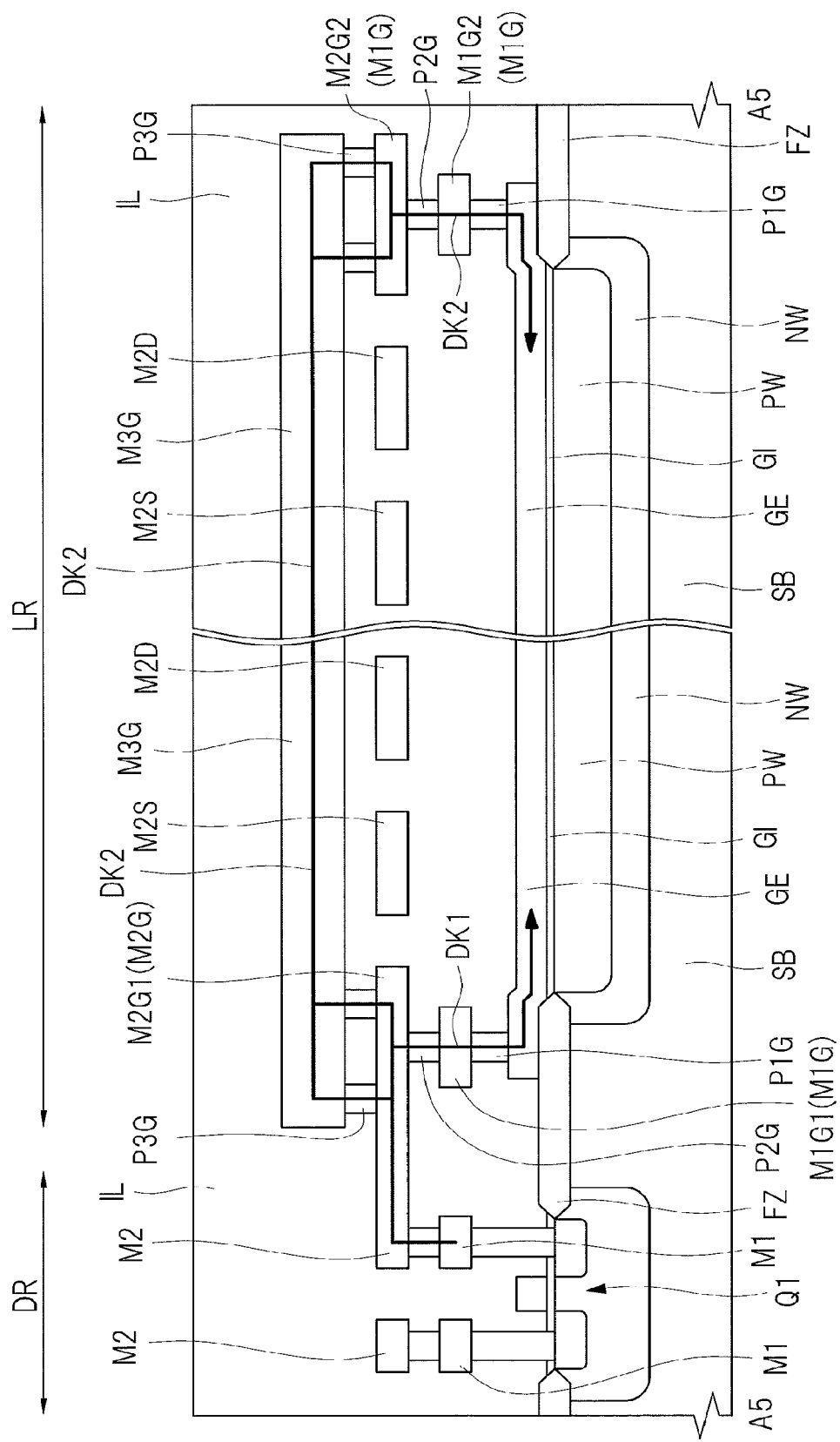
FIG. 18 is an explanatory diagram of the semiconductor device of the embodiment.

FIG. 18 is an explanatory diagram of the semiconductor device CP of this embodiment, and it shows the same sectional region as that of FIG. 14. In FIG. 18, in order to make the diagram easy to see, hatching is omitted even in the sectional view, and the insulating films IL1, IL2, IL3, IL4, and PA are shown as a single integrated insulating layer IL without separating them into respective layers.

The driver circuit formed in the driver circuit region DR applies a gate voltage to the plurality of gate electrodes GE formed in the LDMOSFET forming region LR. The plurality of gate electrodes GE formed in the LDMOSFET forming region LR are electrically connected to the driver circuit via the gate wirings formed in the first to third wiring layers, that is, the gate wirings M1G (M1G1, M1G2), M2G (M2G1, M2G2), and M3G. Therefore, the common gate voltage is applied from the driver circuit formed in the driver circuit region DR to the plurality of gate electrodes GE formed in the LDMOSFET forming region LR.

In FIG. 18, conductive paths (conductive paths through which gate voltage is applied) DK1 and DK2 from the driver circuit formed in the driver circuit region DR to the gate electrode GE formed in the LDMOSFET forming region LR are schematically represented by black lines and arrows. The conductive path DK1 is the conductive path from the driver circuit formed in the driver circuit region DR through the wirings M1 and M2, the gate wirings M2G1 and M1G1, and the gate plugs P2G and P1G to reach one end of the gate electrode GE (one end close to the driver circuit region DR). The conductive path DK2 is the conductive path from the driver circuit formed in the driver circuit region DR through the wirings M1 and M2, the gate wirings M2G1, M3G, M2G2, and M1G2, and the gate plugs P2G and P1G to reach the other end of the gate electrode GE (the other end distant from the driver circuit region DR). The gate wirings (M1G, M2G) of the first and second wiring layers contribute to the conductive path DK1 but the gate wiring (M3G) of the third wiring layer hardly contributes to the same. On the other hand, not only the gate wirings (M1G, M2G) of the first and second wiring layers but also the gate wiring (M3G) of the third wiring layer contributes to the conductive path DK2. At this time, if the resistance of the gate wiring (M3G) of the third wiring layer is large, the resistance of the conductive path DK2 becomes large, which invites the reduction of the operation speed. Also, since the difference between the resistance of the conductive path DK1 and the resistance of the conductive path DK2 becomes large, the phase difference is likely to be caused between the gate electrodes GE. However, since the gate wiring (M3G) of the third wiring layer has a large thickness, the resistance thereof is low. Therefore, since the resistance of the conductive path DK2 to which the gate wiring (M3G) of the third wiring layer contributes can be reduced, the reduction of the operation speed can be suppressed or prevented. Also, since it is possible to reduce the difference between the resistance of the conductive path DK1 and the resistance of the conductive path DK2, the occurrence of the phase difference between the gate electrodes GE can be suppressed or prevented.

In other words, when the gate wiring (M3G) of the third wiring layer having a large thickness is made to function as the conductive path from the driver circuit (control circuit) formed in the driver circuit region DR to at least some of the plurality of gate electrodes (GE) formed in the LDMOSFET forming region LR, the resistance of the conductive path can be reduced. Thus, it is possible to adequately obtain the effect resulting from forming the gate wiring (M3G) in the third wiring layer having a large thickness (for example, effect of the reduction of the gate resistance).

Therefore, in this embodiment, the plurality of wiring layers (M1, M2, M3) made of the same metal material are formed on the semiconductor substrate SB, and based on the fact that the uppermost wiring layer (M3) among those wiring layers has a large thickness, the thick gate wiring (M3G) is provided in the uppermost wiring layer (M3) and is used as the conductive path from the driver circuit to the gate electrodes GE. In this manner, it is possible to adequately obtain the effect of reducing the gate resistance.

Also, in this embodiment, the wiring structure having the plurality of wiring layers (M1, M2, M3) made of the same metal material is formed on the semiconductor substrate SB. By forming the plurality of wiring layers (M1, M2, M3)

made of the same metal material, a metal material adequate for the wiring can be adopted for the plurality of wiring layers (M1, M2, M3). More specifically, the plurality of wiring layers (M1, M2, M3) can be formed by using the metal material adequate for the wiring, and the plurality of wiring layers (M1, M2, M3) can be formed by the same manufacturing apparatus.

Here, each of the plurality of wiring layers (M1, M2, M3) made of the same metal material and formed on the semiconductor substrate SB is preferably an aluminum wiring layer. Concretely, the first, second, and third wiring layers made of the same metal material are formed on the semiconductor substrate SB, and all of the first to third wiring layers are preferably aluminum wiring layers. In other words, all of the wiring M1 formed in the first wiring layer, the wiring M2 formed in the second wiring layer, and the wiring M3 formed in the third wiring layer are preferably aluminum wirings. The aluminum wiring is preferable as an internal wiring of the semiconductor device, and is particularly preferable as an internal wiring of the semiconductor device incorporating the power MISFET. Therefore, it is preferable for the semiconductor device of this embodiment incorporating the power MISFET to use aluminum wiring layers as the first to third wiring layers formed on the semiconductor substrate SB.

Also, in this embodiment, the plurality of wiring layers (M1, M2, M3) made of the same metal material are formed on the semiconductor substrate SB, the gate wirings (M1G, M2G, M3G) are formed in the plurality of wiring layers (M1, M2, M3), respectively, and the gate wiring formed in any one of the plurality of wiring layers (M1, M2, M3) is connected to the driver circuit formed in the driver circuit region DR. In this manner, a gate voltage can be supplied from the driver circuit formed in the driver circuit region DR to the plurality of gate electrodes GE formed in the LDMOSFET forming region LR.

In FIGS. 14 and 15, the gate wiring (M2G) formed in the second wiring layer is connected to the driver circuit formed in the driver circuit region DR. However, the gate wiring (M1G) formed in the first wiring layer may be connected to the driver circuit, the gate wiring (M3G) formed in the third wiring layer may be connected to the driver circuit, or the gate wirings of some of the first to third wiring layers may be connected to the driver circuit.

Also, in this embodiment, the plurality of wiring layers (M1, M2, M3) made of the same metal material are formed on the semiconductor substrate SB and the source wirings (M1S, M2S, M3S) are formed in all of the plurality of wiring layers (M1, M2, M3) made of the same metal material. The source regions ($n^+$-type semiconductor regions SR) of the plurality of unit LDMOSFETs 10$a$ formed in the LDMOSFET forming region LR are electrically connected to each other via the source wirings (M1S, M2S, M3S). Hence, the source regions ($n^+$-type semiconductor regions SR) of the plurality of unit LDMOSFETs 10$a$ formed in the LDMOSFET forming region LR are electrically connected to each other and the source resistance can be reduced.

Also, in this embodiment, the plurality of wiring layers (M1, M2, M3) made of the same metal material are formed on the semiconductor substrate SB and the drain wirings (M1D, M2D, M3D) are formed in all of the plurality of wiring layers (M1, M2, M3) made of the same metal material. The drain regions ($n^+$-type semiconductor regions HD) of the plurality of unit LDMOSFETs 10$a$ formed in the LDMOSFET forming region LR are electrically connected to each other via the drain wirings (M1D, M2D, M3D). Hence, the drain regions ($n^+$-type semiconductor regions HD) of the plurality of unit LDMOSFETs 10$a$ formed in the LDMOSFET forming region LR are electrically connected to each other and the drain resistance can be reduced.

Also, in this embodiment, the plurality of wiring layers (M1, M2, M3) made of the same metal material are formed on the semiconductor substrate SB, and it is preferable that the gate wiring (M3G) is disposed between the source wiring (M3S) and the drain wiring (M3D) in the uppermost wiring layer (M3) among the plurality of wiring layers (M1, M2, M3). This will be described with reference to FIGS. 19 and 20.

Figure 19:
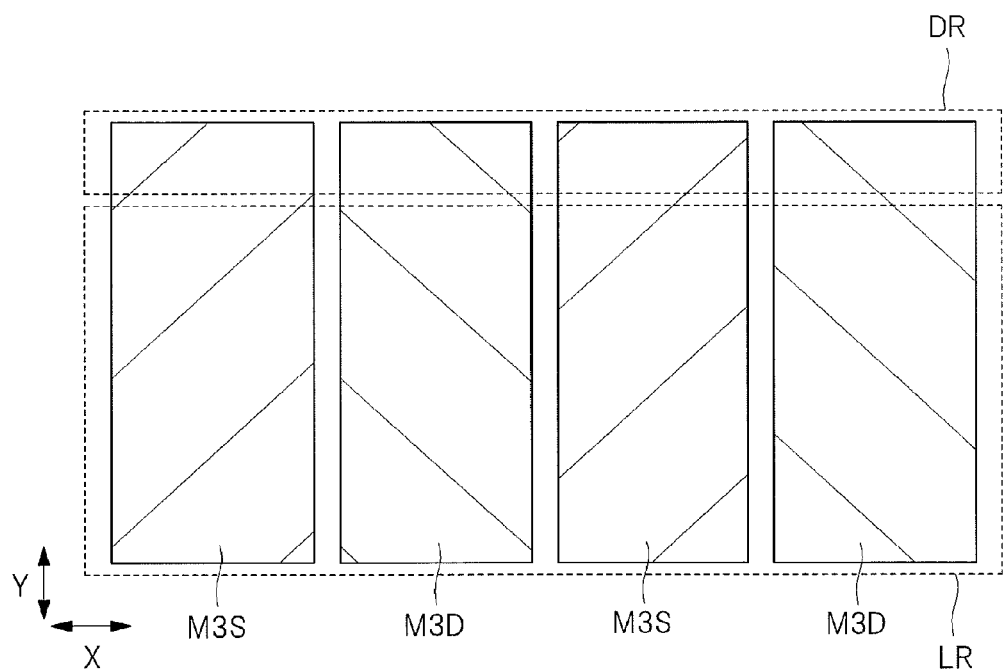
FIG. 19 is an explanatory diagram of a planar layout of a third wiring layer.
Figure 20:
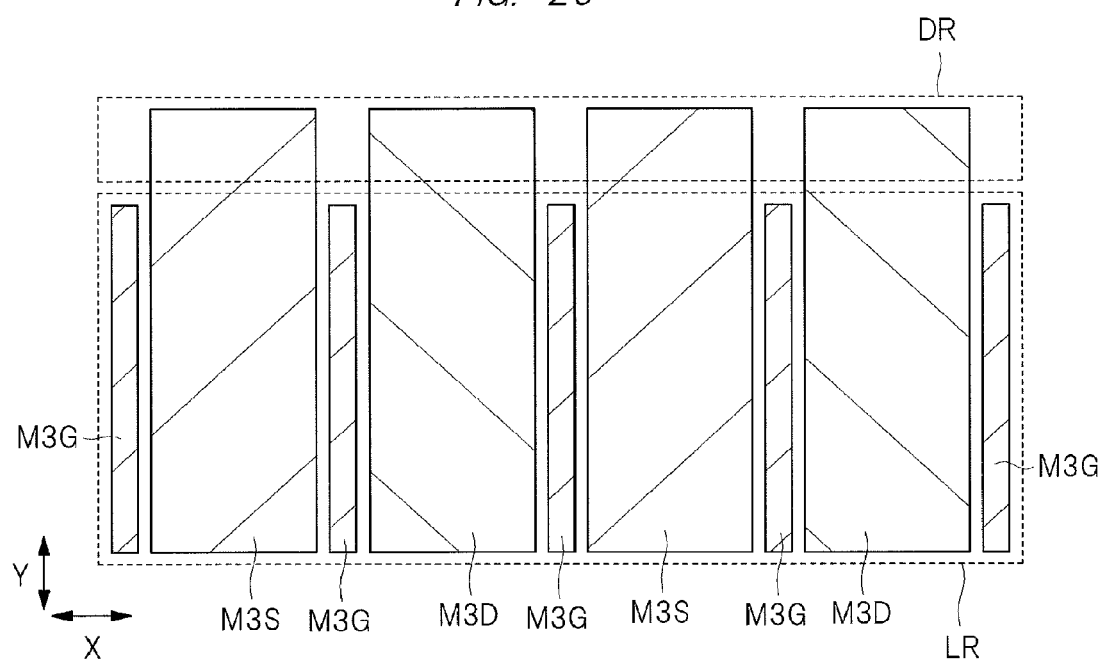
FIG. 20 is an explanatory diagram of the planar layout of the third wiring layer.

FIGS. 19 and 20 are explanatory diagrams of a planar layout of the third wiring layer, and they substantially correspond to FIG. 5 mentioned above. Similar to FIG. 5, although FIGS. 19 and 20 and FIGS. 21 to 24 and 27 which will be described later are plan views, the wiring (M3) of the third wiring layer is hatched in order to make the diagrams easy to see. Although FIG. 5 mentioned above shows the planar positions of the plugs P3S, P3D, and P3G, illustrations of the elements equivalent to the plugs P3S, P3D, and P3G are omitted in FIGS. 19 and 20 and FIGS. 21 to 24 and 27 which will be described later.

FIG. 19 shows a planar layout of the source wirings M3S and the drain wirings M3D in the case where the gate wiring is not provided in the third wiring layer unlike this embodiment. Therefore, the layout shown in FIG. 19 corresponds to a layout example examined by the inventors of the present invention. On the other hand, FIG. 20 shows a planar layout of the source wirings M3S, drain wirings M3D, and gate wirings M3G similar to that shown in FIG. 5. Therefore, the planar layout shown in FIG. 20 corresponds to the planar layout of the source wirings M3S, drain wirings M3D, and gate wirings M3G of this embodiment.

As shown in FIG. 19, each source wiring M3S and each drain wiring M3D are separated from each other and there is a space therebetween. This is because the source wiring M3S and the drain wiring M3D need to be electrically isolated from each other and they need to be separately disposed from each other so as to prevent the source wiring M3S and the drain wiring M3D from being connected.

Therefore, in this embodiment, as shown in FIGS. 5 and 20, the gate wiring M3G is disposed between the source wiring M3S and the drain wiring M3D. Since the source wiring M3S and the drain wiring M3D need to be separated from each other and there is a space therebetween, when the gate wiring M3G is disposed between the source wiring M3S and the drain wiring M3D, the reduction of the planar dimension (planar area) of the source wiring M3S and the drain wiring M3D resulting from providing the gate wiring M3G can be suppressed. As a result, the increase of the source resistance and drain resistance resulting from providing the gate wiring M3G can be suppressed or prevented.

Concretely, in the layout shown in FIGS. 5 and 20, the gate wiring M3G extending in the Y direction is disposed between the source wiring M3S and the drain wiring M3D adjacent to each other in the X direction in the LDMOSFET forming region LR as described in <Layout of LDMOSFET and Wiring>.

It is preferable to adopt the layout in which the source wiring M3S and the drain wiring M3D are adjacent to each other in the X direction across the gate wiring M3G extending in the Y direction in the LDMOSFET forming region LR instead of the layout in which the source wirings M3S are adjacent to each other in the X direction across the gate wiring M3G extending in the Y direction in the LDMOSFET forming region LR and the layout in which the drain wirings M3D are adjacent to each other in the X direction across the gate wiring M3G extending in the Y direction in the LDMOSFET forming region LR. Also, if there is a location where the source wiring M3S and the drain wiring M3D are adjacent to each other in the X direction in the LDMOSFET forming region LR, it is preferable to dispose the gate wiring M3G extending in the Y direction in that location without fail. In this manner, the number of gate wirings M3G extending in the Y direction can be increased while securing as much planar area of the source wiring M3S and drain wiring M3D as possible.

Also, in the LDMOSFET forming region LR, the gate wiring M3G is disposed not only between each source wiring M3S and each drain wiring M3D adjacent to each other in the X direction but also at each of both ends of the LDMOSFET forming region LR in the X direction, so that the number of gate wirings M3G extending in the Y direction can be increased and the gate resistance can be further reduced. In the layout in this case, the plurality of gate wirings M3G extending in the Y direction and arranged in the X direction are present in the LDMOSFET forming region LR, and either source wiring M3S or drain wiring M3D is disposed between the gate wirings M3G extending in the Y direction and facing each other in the X direction.

Figure 21:
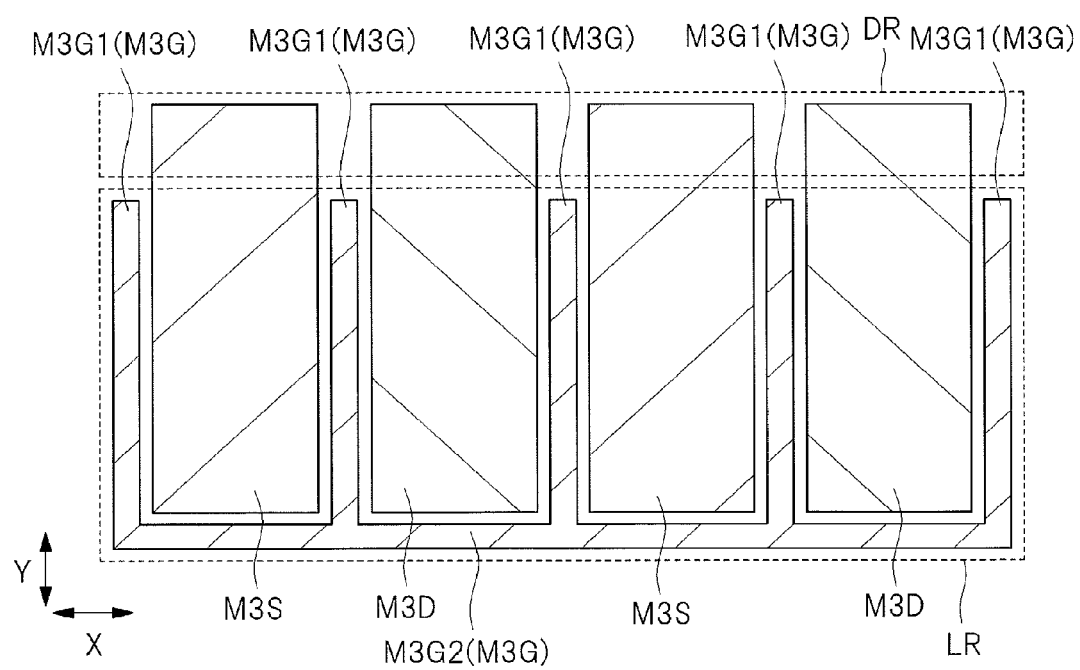
FIG. 21 is an explanatory diagram of a first modified example of the planar layout of the third wiring layer.

FIG. 21 is an explanatory diagram of a first modified example of the planar layout of the third wiring layer, and it corresponds to FIG. 20 mentioned above.

In the planar layout of FIG. 20, the plurality of gate wirings M3G extending in the Y direction and arranged in the X direction are present in the LDMOSFET forming region LR and the gate wirings M3G extending in the Y direction are not connected in the third wiring layer. However, the gate wirings M3G extending in the Y direction are electrically connected to each other via the gate wirings M2G and M1G and the gate plugs P3G and P2G.

On the other hand, one ends (ends distant from the driver circuit region DR) of the gate wirings M3G extending in the Y direction are coupled via the gate wiring M3G extending in the X direction in the planar layout shown in FIG. 20, and this layout corresponds to the planar layout of FIG. 21.

More specifically, in the planar layout of FIG. 21, in the LDMOSFET forming region LR, the gate wiring M3G has the plurality of gate wiring portions M3G1 extending in the Y direction and arranged in the X direction and the gate wiring portion M3G2 coupling the plurality of gate wiring portions M3G1 in an integrated manner. The gate wiring portion M3G2 extends in the X direction. One ends (ends distant from the driver circuit region DR) of the plurality of gate wiring portions M3G1 extending in the Y direction are coupled via the gate wiring portion M3G2 extending in the X direction. Hence, in the planar layout of FIG. 21, the gate wiring M3G has a so-called comb-like planar shape. When the gate wiring portion M3G2 is removed from the gate wiring M3G of FIG. 21, the gate wiring M3G of FIG. 20 is obtained. The planar layout of the source wirings M3S and drain wirings M3D of FIG. 21 is basically the same as that of FIG. 20 except that the source wiring M3S and the drain wiring M3D are not provided in the region in which the gate wiring portion M3G2 is disposed.

In the planar layout of FIG. 21, the plurality of gate wiring portions M3G1 extending in the Y direction are coupled via the gate wiring portion M3G2. More specifically, the gate wiring M3G is not made up of a plurality of separated portions but is formed as an integrated gate wiring (single continuous gate wiring). In this manner, the gate resistance can be further reduced, and the performance of the semiconductor device having the power MISFET can be further improved.

Figure 22:
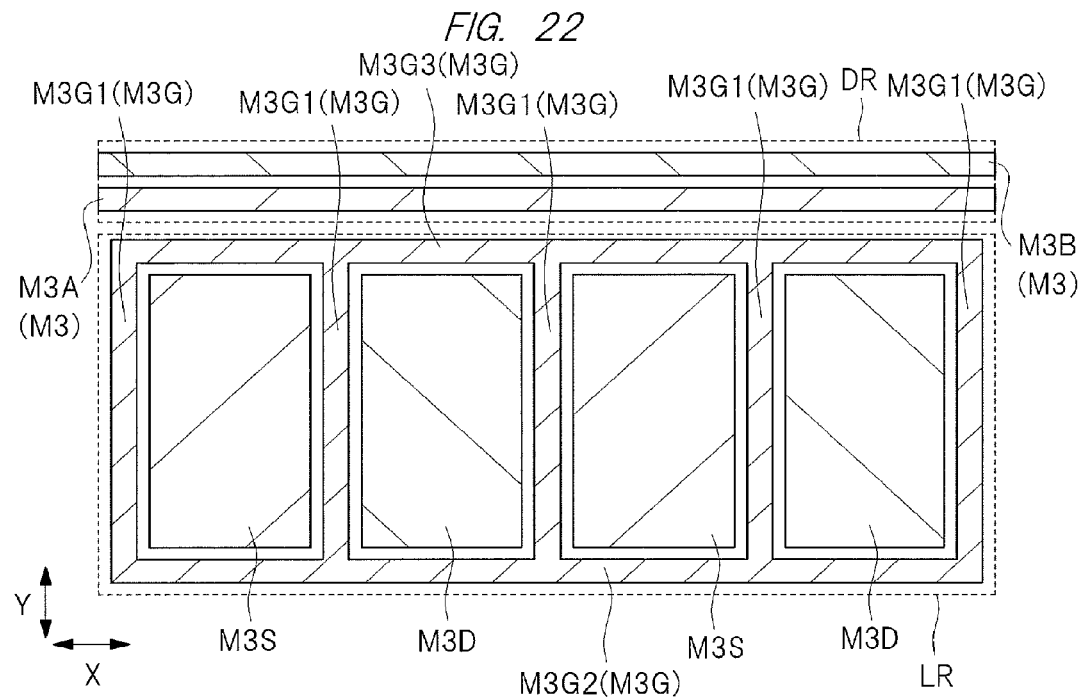
FIG. 22 is an explanatory diagram of a second modified example of the planar layout of the third wiring layer.

FIG. 22 is an explanatory diagram of a second modified example of the planar layout of the third wiring layer, and it corresponds to FIGS. 20 and 21 mentioned above.

In the planar layout of FIG. 22, wirings M3A and M3B are disposed in the driver circuit region DR adjacent to the LDMOSFET forming region LR (specifically, adjacent in the Y direction). Concretely, in the driver circuit region DR, the wirings M3A and M3B extend in the X direction and are separated from (face) each other in the Y direction. The wirings M3A and M3B are the wirings (M3) of the third wiring layer. Therefore, all of the source wiring M3S, the drain wiring M3D, the gate wiring M3G, the wiring M3A, and the wiring M3B are the wirings M3 mentioned above.

Here, both of the wirings M3A and M3B are wirings (power source wirings) connected to the driver circuit formed in the driver circuit region DR and can be regarded as power source wirings of the driver circuit.

When the plurality of unit LDMOSFETs 10a for the power MOS transistor QH are formed in the LDMOSFET forming region LR, the driver circuit DR1 described above is formed in the driver circuit region DR. When the plurality of unit LDMOSFETs 10a for the power MOS transistor QL are formed in the LDMOSFET forming region LR, the driver circuit DR2 described above is formed in the driver circuit region DR. As can be understood from the circuit diagram of FIG. 1, the power source voltage (BOOT) and the output node ND are connected to the driver circuit DR1, and the power source voltage (VCIN) and the reference potential (GND) are connected to the driver circuit DR2. In the case of the driver circuit DR1, the potential of the output node ND functions as the reference potential.

Therefore, when the driver circuit DR1 is formed in the driver circuit region DR, the wiring M3B is the wiring connected to the terminal TE3, that is, the wiring connected to the power source voltage (BOOT) for the driver circuit DR1, and the wiring M3A is the wiring connected to the output node ND. Also, when the driver circuit DR2 is formed in the driver circuit region DR, the wiring M3B is the wiring connected to the terminal TE4, that is, the wiring connected to the power source voltage (VCIN) for the driver circuit DR2, and the wiring M3A is the wiring connected to the terminal TE2, that is, the wiring connected to the reference potential (GND).

In the planar layout of FIG. 22, the wirings (power source wirings) M3A and M3B connected to the driver circuit formed in the driver circuit region DR are formed in the third wiring layer in the driver circuit region DR. By forming the wirings (power source wirings) M3A and M3B in the third wiring layer having a large wiring thickness (that is, having low wiring resistance), the resistance of the wirings (power source wirings) for the driver circuit can be reduced. In this manner, the driving force of the driver circuit formed in the driver circuit region DR can be enhanced More specifically, when the resistance from the terminal TE3 to the driver circuit DR1 or the resistance from the output node ND to the driver circuit DR1 is large, the effective power source voltage supplied to the driver circuit DR1 is reduced. Similarly, when the resistance from the terminal TE4 to the driver circuit DR2 or the resistance from the terminal TE2 to the driver circuit DR2 is large, the effective power source voltage supplied to the driver circuit DR2 is reduced.

For its prevention, the wiring M3B having a large thickness is used as at least a part of the wiring connecting the terminal TE3 and the driver circuit DR1 and the wiring M3A having a large thickness is used as at least a part of the wiring connecting the output node ND and the driver circuit DR1. In this manner, the resistance from the terminal TE3 to the driver circuit DR1 and the resistance from the output node ND to the driver circuit DR1 can be reduced. Similarly, the wiring M3B having a large thickness is used as at least a part of the wiring connecting the terminal TE4 and the driver circuit DR2 and the wiring M3A having a large thickness is used as at least a part of the wiring connecting the terminal TE2 and the driver circuit DR2. In this manner, the resistance from the terminal TE4 to the driver circuit DR2 and the resistance from the terminal TE2 to the driver circuit DR2 can be reduced. As a result, the reduction of the effective power source voltage supplied to the driver circuits DR1 and DR2 can be suppressed or prevented, so that the driving force of the driver circuits DR1 and DR2 can be enhanced. Hence, the switching speed can be improved.

The wirings M3A and M3B are connected to an element making up the driver circuit formed in the driver circuit region DR via the wirings M2 and M1 and the plugs (plugs corresponding to the plugs P2S, P2D, P2G, P1S, P1D, and P1G) formed in the driver circuit region DR.

In the planar layouts of FIGS. 20 and 21, since the wirings M3A and M3B are not disposed in the driver circuit region DR, the source wirings M3S and the drain wirings M3D can be extended into the driver circuit region DR.

On the other hand, in the planar layout of FIG. 22, since the wirings M3A and M3B are disposed in the driver circuit region DR, the source wirings M3S and the drain wirings M3D are not extended into the driver circuit region DR. Other than that, the planar layout of the source wirings M3S and the drain wirings M3D of FIG. 22 is basically the same as that of FIG. 21. Accordingly, in the planar layout of FIG. 22, the gate wiring M3G has a planar shape obtained by adding a gate wiring portion M3G3 to the gate wiring M3G of FIG. 21.

More specifically, in the planar layout of FIG. 22, in the LDMOSFET forming region LR, the gate wiring M3G has the plurality of gate wiring portions M3G1 extending in the Y direction and arranged in the X direction and the gate wiring portions M3G2 and M3G3 coupling the plurality of gate wiring portions M3G1 in an integrated manner. The gate wiring portion M3G2 and the gate wiring portion M3G3 extend in the X direction and face each other in the Y direction. One ends (ends distant from the driver circuit region DR) of the plurality of gate wiring portions M3G1 extending in the Y direction are coupled via the gate wiring portion M3G2 extending in the X direction, and the other ends (ends close to the driver circuit region DR) of the plurality of gate wiring portions M3G1 extending in the Y direction are coupled via the gate wiring portion M3G3 extending in the X direction. Therefore, in the planar layout of FIG. 22, the source wirings M3S and the drain wirings M3D are surrounded by the gate wiring M3G (that is, gate wiring portions M3G1, M3G2, and M3G3) when seen in a plan view.

In the planar layout of FIG. 22, the plurality of gate wiring portions M3G1 extending in the Y direction are coupled via the gate wiring portion M3G3 in addition to the gate wiring portion M3G2. Therefore, the gate resistance can be further reduced.

Figure 23:
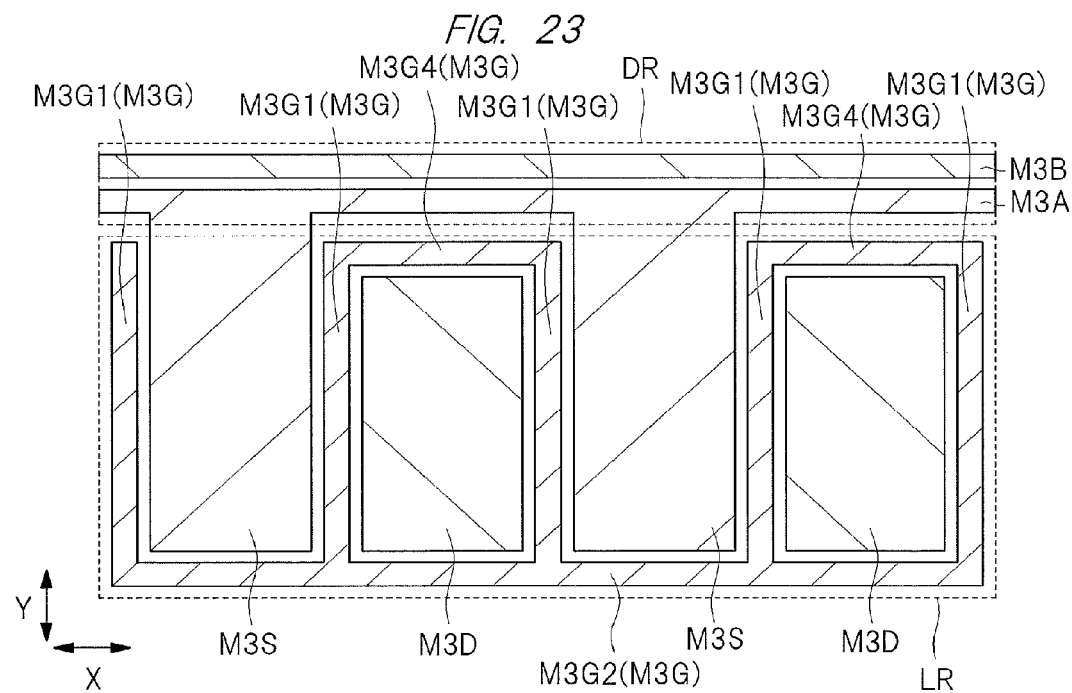
FIG. 23 is an explanatory diagram of a third modified example of the planar layout of the third wiring layer.

FIG. 23 is an explanatory diagram of a third modified example of the planar layout of the third wiring layer, and it corresponds to FIG. 22 mentioned above.

In the planar layout of FIG. 23, the wirings M3A and M3B are disposed in the driver circuit region DR and the source wirings M3S are connected (joined) integrally to the source wiring M3A.

Concretely, in the driver circuit region DR, the wirings M3A and M3B are extended in the X direction and are disposed so as to be separated from (face) each other in the Y direction, the wiring M3A is disposed on a side close to the LDMOSFET forming region LR, and the wiring M3B is disposed on a side distant from the LDMOSFET forming region LR. Also, one ends of the source wirings M3S in the Y direction are joined to the wiring M3A, so that the source wirings M3S are formed integrally with the wiring M3A. The planar layout of the source wirings M3S and the drain wirings M3D of FIG. 23 is basically the same as that of FIG. 22 except that the source wirings M3S are connected integrally to the source wiring M3A.

Since the source wirings M3S are connected integrally to the source wiring M3A, a part of the gate wiring M3G present between the source wirings M3S and the wiring M3A in the case of FIG. 22 is removed in the case of FIG. 23. Except that, the planar layout of the gate wiring M3G of FIG. 23 is basically the same as that of FIG. 22.

More specifically, in the planar layout of FIG. 23, in the LDMOSFET forming region LR, the gate wiring M3G has the plurality of gate wiring portions M3G1 extending in the Y direction and arranged in the X direction and the gate wiring portions M3G2 coupling the plurality of gate wiring portions M3G1 in an integrated manner. The gate wiring portion M3G2 extends in the X direction, and one ends (ends distant from the driver circuit region DR) of the plurality of gate wiring portions M3G1 extending in the Y direction are coupled via the gate wiring portion M3G2 extending in the X direction. In the planar layout of FIG. 23, the gate wiring M3G further has gate wiring portions M3G4, and the gate wiring portions M3G1, M3G2, and M3G4 are integrated together to form the gate wiring M3G. The other ends (ends close to the driver circuit region DR) of the gate wiring portions M3G1 extending in the Y direction and facing each other in the X direction across the drain wiring M3D are coupled to each other via the gate wiring portion M3G4 extending in the X direction. The gate wiring portion M3G4 extends in the X direction and faces the gate wiring portion M3G2 in the Y direction across the drain wiring M3D. In other words, the gate wiring portion M3G4 extends in the X direction between the wiring M3A and the drain wiring M3D and couples the ends (ends close to the driver circuit region DR) of the gate wiring portions M3G1 facing each other in the X direction across the drain wiring M3D. Therefore, in the planar layout of FIG. 23, the source wirings M3S are connected integrally to the wiring M3A, and the drain wirings M3D are each surrounded by the gate wiring M3G (that is, gate wiring portions M3G1, M3G2, and M3G4) when seen in a plan view.

As can be understood from the circuit diagram of FIG. 1, since the source (S1) of the power MOS transistor QH is connected to the output node ND, the wiring connecting the output node ND and the driver circuit DR1 (at least a part of this wiring is made up of the wiring M3A) is electrically connected to the source (S1) of the power MOS transistor QH. Also, since the source (S2) of the power MOS transistor QL is connected to the terminal TE2 for the reference potential (GND), the wiring connecting the terminal TE2 and the driver circuit DR2 (at least a part of this wiring is made up of the wiring M3A) is electrically connected to the source (S2) of the power MOS transistor QL. Therefore, the source wirings M3S and the wiring M3A are electrically connected to have the same potential.

Thus, in the planar layout of FIG. 23, the source wirings M3S and the wiring M3A are directly joined. More specifically, the source wirings M3S are connected integrally to the wiring M3A. As a result, when the driver circuit DR1 is formed in the driver circuit region DR, the resistance from the output node ND to the driver circuit DR1 can be further reduced, and when the driver circuit DR2 is formed in the driver circuit region DR, the resistance from the terminal TE2 for the reference potential (GND) to the driver circuit DR2 can be further reduced. In this manner, the driving force of the driver circuits DR1 and DR2 can be enhanced. Therefore, the switching speed can be further improved.

Next, ingenuities related to the bump electrodes BP will be described.

In this embodiment, the bump electrodes BP are used as external terminals of the semiconductor device CP, and the semiconductor device CP has a plurality of bump electrodes BP. The plurality of bump electrodes BP formed in the semiconductor device CP include the source bump electrodes BPS and the drain bump electrodes BPD.

More specifically, the semiconductor device CP of this embodiment has the source bump electrodes BPS and drain bump electrodes BPD functioning as the external terminals. The source bump electrodes BPS are electrically connected to the source regions ($n^+$-type semiconductor region SR) of the plurality of unit LDMOSFETs 10a formed in the LDMOSFET forming region LR via the source wirings M3S, M2S, and M1S (and the source plugs P3S, P2S, and P1S). The drain bump electrodes BPD are electrically connected to the drain regions ($n^+$-type semiconductor regions HD) of the plurality of unit LDMOSFETs 10a formed in the LDMOSFET forming region LR via the drain wirings M3D, M2D, and M1D (and the drain plugs P3D, P2D, and P1D).

In the semiconductor device CP of this embodiment, when forming the bump electrodes BP, the bump electrodes BP are not formed directly on the wiring M3 but are formed on the re-wiring M4 and are connected to the wiring M3 via the re-wiring M4. In another aspect, it is also possible to form the bump electrodes BP directly on the wiring M3 without forming the re-wiring M4. In this case, the source bump electrodes BPS are formed on the source wiring M3S, and the drain bump electrodes BPD are formed on the drain wiring M3D. In such a case, the insulating film IL4 is formed as a surface protective film, and the bump electrodes BP (including UBM film 11) are formed on the wiring M3 exposed through the openings (equivalent to the openings OP1) of the surface protective film, so that the re-wiring M4 and insulating film PA described above are not formed.

However, it is preferable that the bump electrodes BP are formed on the re-wiring M4 to connect the bump electrodes BP to the wiring M3 via the re-wiring M4 like this embodiment instead of forming the bump electrodes BP on the wiring M3. The reasons therefor are as follows.

In this embodiment, the wiring structure having the plurality of wiring layers made of the same metal material, that is, the first wiring layer (M1), the second wiring layer (M2), and the third wiring layer (M3) is formed on the semiconductor substrate SB. The plurality of wiring layers (M1, M2, M3) made of the same metal material are formed by using the metal material adequate for the wiring, and are preferably made of aluminum wiring layers. However, as an underlying conductive layer on which the bump electrodes are formed, a copper wiring layer is more preferable than an aluminum wiring layer. More specifically, the bump electrodes BP can be formed more readily when the bump electrodes BP are formed on the re-wiring M4 made mainly of copper (that is, copper wiring) like this embodiment than when the bump electrodes BP are formed on the wiring M3.

Hence, in this embodiment, the wiring structure having the plurality of wiring layers (M1, M2, M3) made of the same metal material is formed on the semiconductor substrate SB and the gate wirings (M1G, M2G, M3G), the source wirings (M1S, M2S, M3S), and the drain wirings (M1D, M2D, M3D) are formed in all of the wiring layers (M1, M2, M3) made of the same metal material. Also, on the uppermost wiring layer (M3) among the plurality of wiring layers (M1, M2, M3) made of the same metal material, a dissimilar wiring layer (re-wiring M4) made of a metal material different from the material of the plurality of wiring layers (M1, M2, M3) is formed. Concretely, on the third wiring layer (M3) that is the uppermost wiring layer among the first to third wiring layers (M1, M2, M3) made of the same metal material, the fourth wiring layer (M4) that is the dissimilar wiring layer made of a metal material different from the material of the first to third wiring layers (M1, M2, M3) is formed.

Therefore, in this embodiment, the source bump electrodes BPS are formed on the source re-wiring M4S (source dissimilar wiring) formed in the fourth wiring layer (M4) that is the dissimilar wiring layer and are electrically connected to the source wiring M3S via the source re-wiring M4S (source dissimilar wiring). Also, the drain bump electrodes BPD are formed on the drain re-wiring M4D (drain dissimilar wiring) formed in the fourth wiring layer (M4) that is the dissimilar wiring layer and are electrically connected to the drain wiring M3D via the drain re-wiring M4D (drain dissimilar wiring).

As described above, in this embodiment, the dissimilar wiring layer (re-wiring M4) made of a metal material different from the material of the first to third wiring layers (M1, M2, M3) is formed and the bump electrodes BP are formed on the dissimilar wiring layer (re-wiring M4). In this manner, a wiring material suitable for the first to third wiring layers (M1, M2, M3) can be selected, and the dissimilar wiring layer (re-wiring M4) can be formed by using a material preferable as the underlying layer for the bump electrodes BP. As a result, the total performance and reliability of the semiconductor device can be improved, and the semiconductor device can be manufactured more easily and adequately.

It is preferable that the thickness (T4) of the re-wiring M4 is larger than respective thicknesses (T1, T2, and T3) of the wirings M1, M2, and M3 (the re-wiring M4 is thicker than the wirings M1, M2 and M3). In this manner, since the source re-wiring M4S and the drain re-wiring M4D can have a large thickness, the source resistance and the drain resistance can be reduced. Furthermore, by forming the re-wiring M4 as a copper wiring, the bump electrodes BP can be formed readily on the re-wiring M4 and the thickness of the re-wiring M4 can be increased easily.

Figure 24:
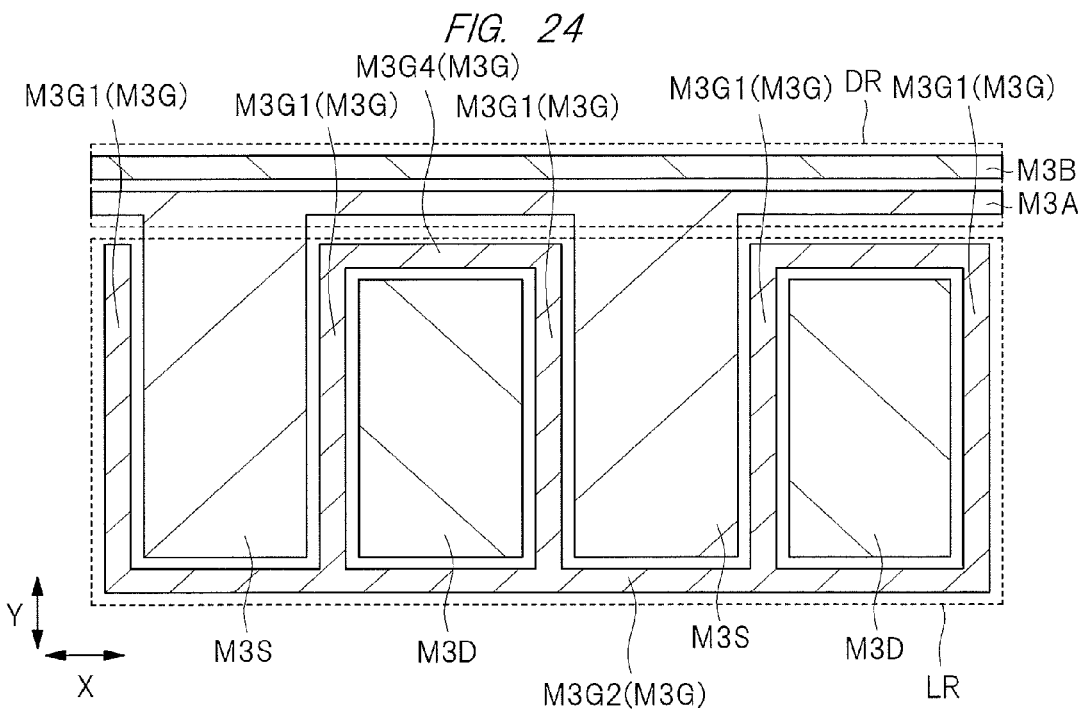
FIG. 24 is an explanatory diagram of a fourth modified example of the planar layout of the third and fourth wiring layers.
Figure 25:
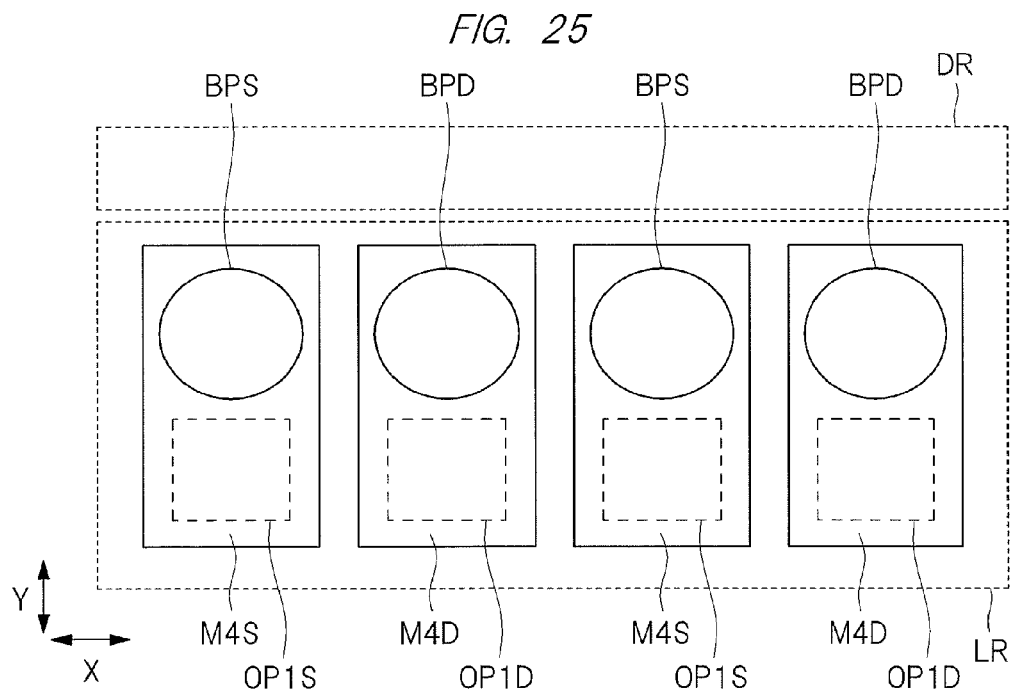
FIG. 25 is an explanatory diagram of the fourth modified example of the planar layout of the third and fourth wiring layers.
Figure 26:
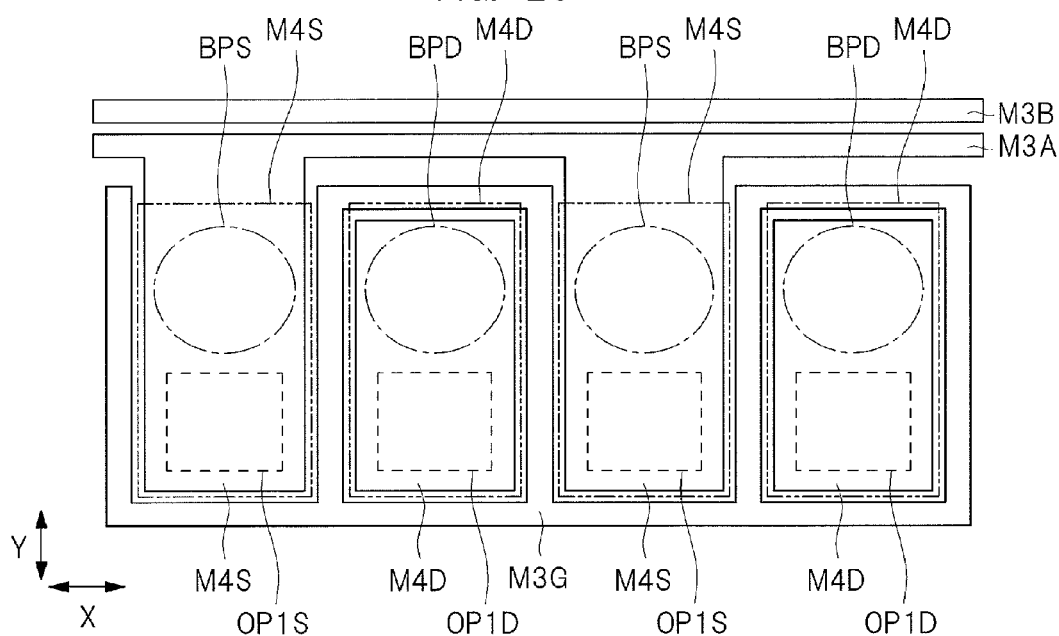
FIG. 26 is an explanatory diagram of the fourth modified example of the planar layout of the third and fourth wiring layers.

FIGS. 24 to 26 are explanatory diagrams of a fourth modified example of the planar layout of the third and fourth wiring layers. FIG. 24 shows a planar layout of the third wiring layer (M3), FIG. 25 shows a planar layout of the fourth wiring layer (M4), and FIG. 26 shows a layout obtained by superposing the layout of FIG. 24 and the layout of FIG. 25. The planar layout of the third wiring layer (M3) of FIG. 24 is the same as the planar layout of FIG. 23.

The bump electrodes BP are preferably disposed at the positions where the bump electrodes BP do not overlap the openings OP1 when seen in a plan view. More specifically, it is preferable that the bump electrodes BP do not overlap the connection region between the re-wiring M4 and the wiring M3 when seen in a plan view. When seen in a plan view, the connection region between the re-wiring M4 and the wiring M3 coincides with the opening OP1. If the bump electrodes BP are located so as not to overlap the openings OP1 when seen in a plan view, that is, if located so as not to overlap the connection region between the re-wiring M4 and the wiring M3, the insulating film IL4 is present under the re-wiring M4 in the region just below the bump electrodes BP. As a result, when a stress is applied to the bump electrodes BP, the stress is transmitted to the re-wiring M4 just below the bump electrodes BP but is hardly transmitted to the wiring M3 in the lower layer below the insulating film IL4 because of the presence of the insulating film IL4. In this manner, when a stress is applied to the bump electrodes BP, the adverse effect due to the stress can be suppressed or prevented. Therefore, the reliability of the semiconductor device can be further improved.

Therefore, in the planar layouts of FIGS. 24 to 26, the source bump electrodes BPS are disposed at the positions where the source bump electrodes BPS do not overlap the source openings OP1S when seen in a plan view, and the drain bump electrodes BPD are disposed at the positions where the drain bump electrodes BPD do not overlap the drain openings OP1D when seen in a plan view. In other words, the source bump electrodes BPS and the drain bump electrodes BPD are disposed so that the source bump electrodes BPS do not overlap the connection region between the source re-wiring M4S and the source wiring M3S and the drain bump electrodes BPD do not overlap the connection region between the drain re-wiring M4D and the drain wiring M3D when seen in a plan view. In this manner, when a stress is applied to the source bump electrodes BPS and the drain bump electrodes BPD, the adverse effect due to the stress can be suppressed or prevented.

However, in the planar layouts of FIGS. 24 to 26, since the source bump electrodes BPS are disposed at the positions where the source bump electrodes BPS do not overlap the source openings OP1S when seen in a plan view and the drain bump electrodes BPD are disposed at the positions where the drain bump electrodes BPD do not overlap the drain openings OP1D when seen in a plan view, the planar dimension (planar area) of the source openings OP1S and drain openings OP1D becomes small. This is because the source openings OP1S cannot be formed in the planar regions of the source wiring M3S in which the source bump electrodes BPS are disposed and the drain openings OP1D cannot be formed in the planar regions of the drain wiring M3D in which the drain bump electrodes BPD are disposed.

In particular, in this embodiment, there is concern that the planar dimension (planar area) of the source wiring M3S and the drain wiring M3D is reduced by the area equivalent to the gate wiring M3G formed in the third wiring layer. Also, when the wirings M3A and M3B are formed in the driver circuit region DR, there is concern that the planar dimension (planar area) of the source wiring M3S and the drain wiring M3D is further reduced.

However, for the reduction of the source resistance and the drain resistance, it is preferable to increase the planar dimension (planar area) of the source openings OP1S and the drain openings OP1D. Planar layouts drawn by taking this fact into account are shown in FIGS. 27 to 29.

Figure 27:
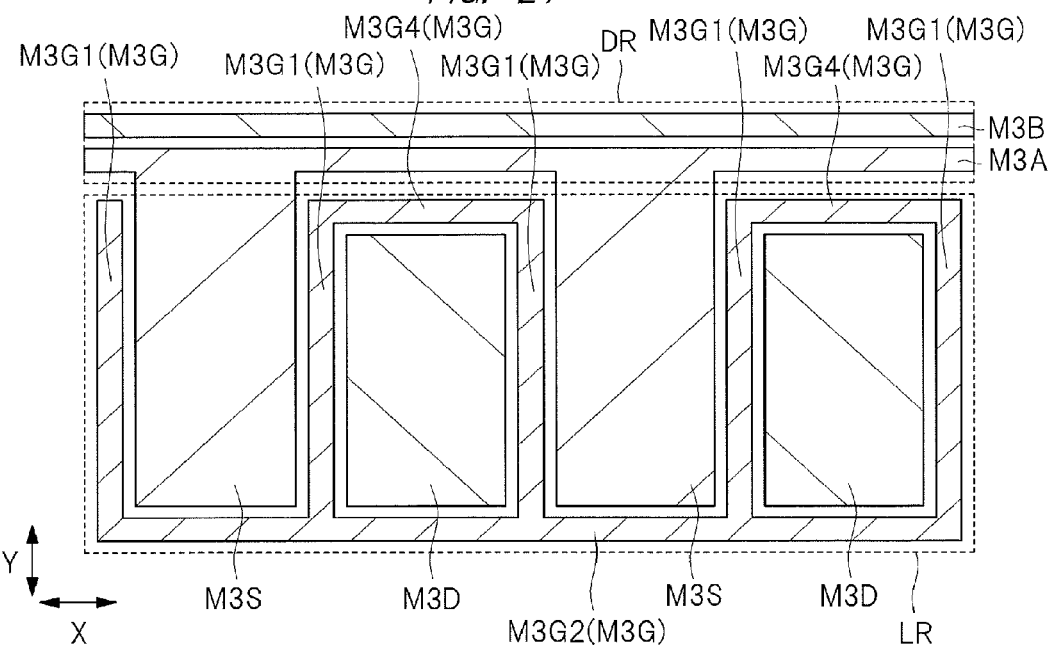
FIG. 27 is an explanatory diagram of a fifth modified example of the planar layout of the third and fourth wiring layers.
Figure 28:
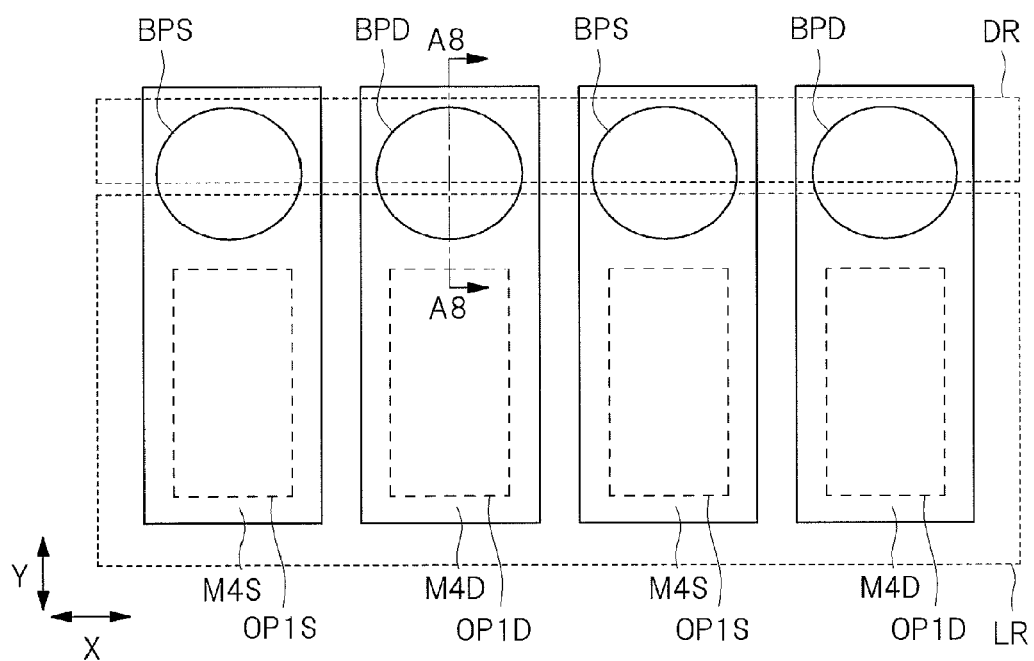
FIG. 28 is an explanatory diagram of the fifth modified example of the planar layout of the third and fourth wiring layers.
Figure 29:
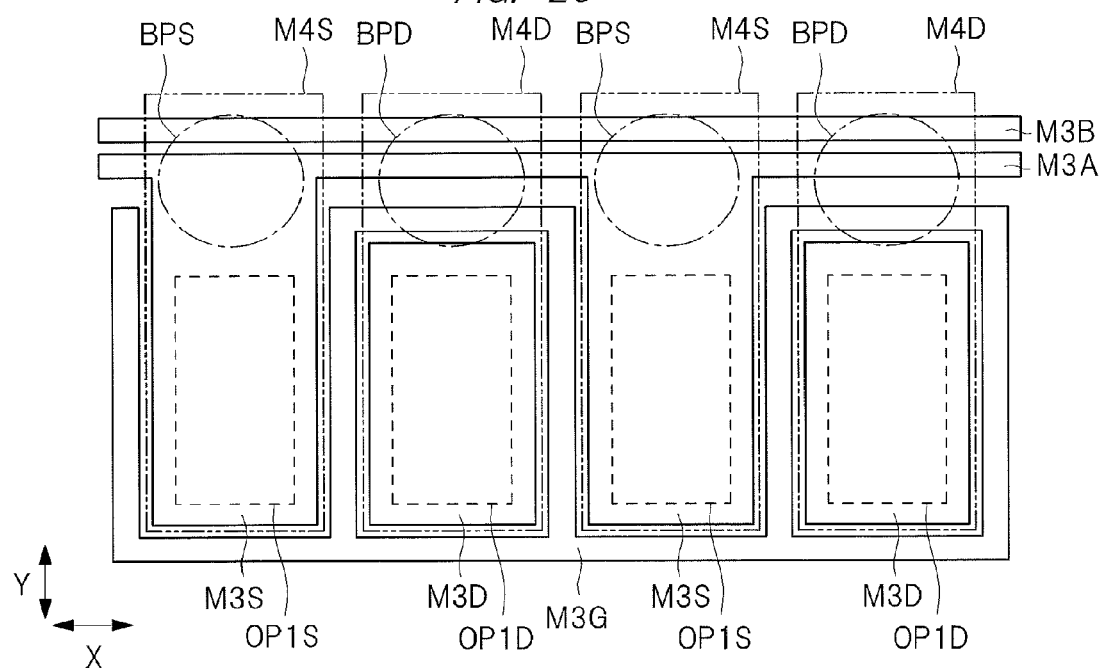
FIG. 29 is an explanatory diagram of the fifth modified example of the planar layout of the third and fourth wiring layers.
Figure 30:
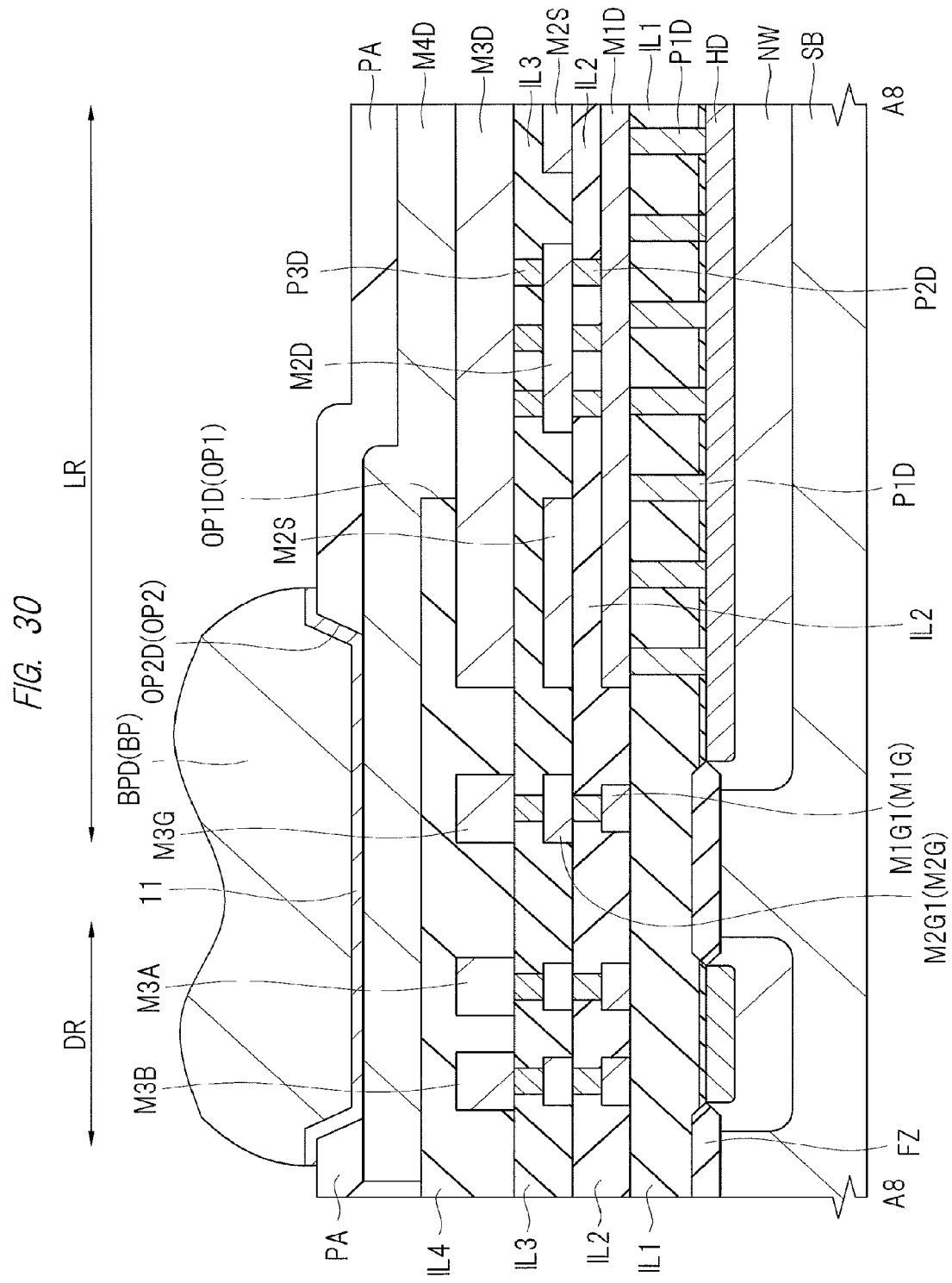
FIG. 30 is an explanatory diagram of the fifth modified example of the planar layout of the third and fourth wiring layers.

FIGS. 27 to 30 are explanatory diagrams of a fifth modified example of the planar layout of the third and fourth wiring layers. FIG. 27 shows a planar layout of the third wiring layer (M3), FIG. 28 shows a planar layout of the fourth wiring layer (M4), and FIG. 29 shows a layout obtained by superposing the layout of FIG. 27 and the layout of FIG. 28. FIG. 30 substantially corresponds to a sectional view taken along the line A8-A8 in FIG. 28. The planar layout of the third wiring layer (M3) of FIG. 27 is the same as the planar layouts of FIGS. 23 and 24.

Also in the planar layouts of FIGS. 27 to 30, like the planar layouts of FIGS. 24 to 26 mentioned above, the source bump electrodes BPS are disposed at the positions where the source bump electrodes BPS do not overlap the source openings OP1S when seen in a plan view, and the drain bump electrodes BPD are disposed at the positions where the drain bump electrodes BPD do not overlap the drain openings OP1D when seen in a plan view. More specifically, the source bump electrodes BPS and the drain bump electrodes BPD are disposed so that the source bump electrodes BPS do not overlap the connection region between the source re-wiring M4S and the source wiring M3S and the drain bump electrodes BPD do not overlap the connection region between the drain re-wiring M4D and the drain wiring M3D when seen in a plan view. In this manner, when a stress is applied to the source bump electrodes BPS and the drain bump electrodes BPD, the adverse effect due to the stress can be suppressed or prevented.

The source re-wiring M4S is connected to the source wiring M3S exposed through the source openings OP1S, and the drain re-wiring M4D is connected to the drain wiring M3D exposed through the source openings OP1D. Therefore, when seen in a plan view, the connection region between the source re-wiring M4S and the source wiring M3S coincides with the source opening OP1S and the connection region between the drain re-wiring M4D and the drain wiring M3D coincides with the drain opening OP1D. Therefore, in the planar layouts of FIGS. 24 to 26 and the planar layouts of FIGS. 27 to 30, the source bump electrodes BPS do not overlap the source openings OP1S when seen in a plan view, and this means that the source bump electrodes BPS do not overlap the connection region between the source re-wiring M4S and the source wiring M3S when seen in a plan view. Also, in the planar layouts of FIGS. 24 to 26 and the planar layouts of FIGS. 27 to 30, the drain bump electrodes BPD do not overlap the drain openings OP1D when seen in a plan view, and this means that the drain bump electrodes BPD do not overlap the connection region between the drain re-wiring M4D and the drain wiring M3D when seen in a plan view.

However, in the planar layouts of FIGS. 27 to 30, unlike the planar layouts of FIGS. 24 to 26 mentioned above, the source bump electrodes BPS overlap the wiring M3 formed in the third wiring layer and having a different potential from the source bump electrodes BPS when seen in a plan view. Also, the drain bump electrodes BPD overlap the wiring M3 formed in the third wiring layer and having a different potential from the drain bump electrodes BPD when seen in a plan view.

In other words, in the planar layouts of FIGS. 27 to 30, the source bump electrodes BPS overlap the wiring M3 other than the source wiring M3S formed in the third wiring layer when seen in a plan view. Also, the drain bump electrodes BPD overlap the wiring M3 other than the drain wiring M3D formed in the third wiring layer when seen in a plan view.

More specifically, the source re-wiring M4S connected to the source wiring M3S is extended also over the wiring M3 having a different potential from the source bump electrodes BPS (or wiring M3 other than the source wiring M3S), and the source bump electrodes BPS formed on the source re-wiring M4S overlap the wiring M3 having a different potential from the source bump electrodes BPS (or wiring M3 other than the source wiring M3S) when seen in a plan view. Also, the drain re-wiring M4D connected to the drain wiring M3D is extended also over the wiring M3 having a different potential from the drain bump electrodes BPD (or wiring M3 other than the drain wiring M3D) and the drain bump electrodes BPD formed on the drain re-wiring M4D overlap the wiring M3 having a different potential from the drain bump electrodes BPD (or wiring M3 other than the drain wiring M3D) when seen in a plan view.

In the case of FIGS. 27 to 30, specifically, the source bump electrodes BPS overlap the wiring M3B when seen in a plan view, and this wiring M3B is the wiring M3 formed in the third wiring layer and the wiring M3 having a different potential from the source bump electrodes BPS (or wiring M3 other than the source wiring M3S). Also, in the case of FIGS. 27 to 30, specifically, the drain bump electrodes BPD overlap the gate wiring M3G and the wiring M3B when seen in a plan view, and these gate wiring M3G and wiring M3B are the wirings M3 formed in the third wiring layer and the wirings M3 having a different potential from the drain bump electrodes BPD (or wirings M3 other than the drain wiring M3D).

When the region where the source bump electrodes BPS overlap the source wiring M3S is large like the planar layouts of FIGS. 24 to 26, the area of each source opening OP1S (that is, the connection area between the source re-wiring M4S and the source wiring M3S) is constricted. Similarly, when the region where the drain bump electrodes BPD overlap the drain wiring M3D is large, the area of each drain opening OP1D (that is, the connection area between the drain re-wiring M4D and the drain wiring M3D) is constricted.

Meanwhile, in the planar layouts of FIGS. 27 to 30, since the source bump electrodes BPS are disposed so as to overlap the wiring M3 having a different potential from the source bump electrodes BPS (or wiring M3 other than the source wiring M3S) when seen in a plan view, the area of the region where the source bump electrode BPS overlaps the source wiring M3S can be reduced or eliminated. As a result, the area of the source opening OP1S can be increased, and the connection area between the source re-wiring M4S and the source wiring M3S can be increased. Therefore, the source resistance can be further reduced. Also, since the drain bump electrodes BPD are disposed so as to overlap the wiring M3 having a different potential from the drain bump electrodes BPD (or wiring M3 other than the drain wiring M3D) when seen in a plan view, the area of the region where the drain bump electrode BPD overlaps the drain wiring M3D can be reduced or eliminated. As a result, the area of the drain opening OP1D can be increased, and the connection area between the drain re-wiring M4D and the drain wiring M3D can be increased. Therefore, the drain resistance can be further reduced.

Also, by disposing the source bump electrodes BPS so as to overlap the wiring M3 having a different potential from the source bump electrodes BPS (or wiring M3 other than the source wiring M3S) when seen in a plan view, the degree of freedom of the position to dispose the source bump electrodes BPS can be enhanced. Also, by disposing the drain bump electrodes BPD so as to overlap the wiring M3 having a different potential from the drain bump electrodes BPD (or wiring M3 other than the drain wiring M3D) when seen in a plan view, the degree of freedom of the position to dispose the drain bump electrodes BPD can be enhanced. As a result, the degree of freedom in the design of the circuit board (equivalent to the circuit board PC) on which the semiconductor device CP is mounted can also be enhanced.

The gate wiring M3G and the wiring M3B are the wirings M3 having a different potential from the source bump electrodes BPS (or wiring M3 other than the source wiring M3S) and are the wirings M3 having a different potential from the drain bump electrodes BPD (or wirings M3 other than the drain wiring M3D). Also, the wiring M3A and the source wiring M3S are the wirings M3 having a different potential from the drain bump electrodes BPD (or wirings M3 other than the drain wiring M3D). Further, the drain wiring M3D is the wiring M3 having a different potential from the source bump electrodes BPS (or wiring M3 other than the source wiring M3S).

Figure 31:
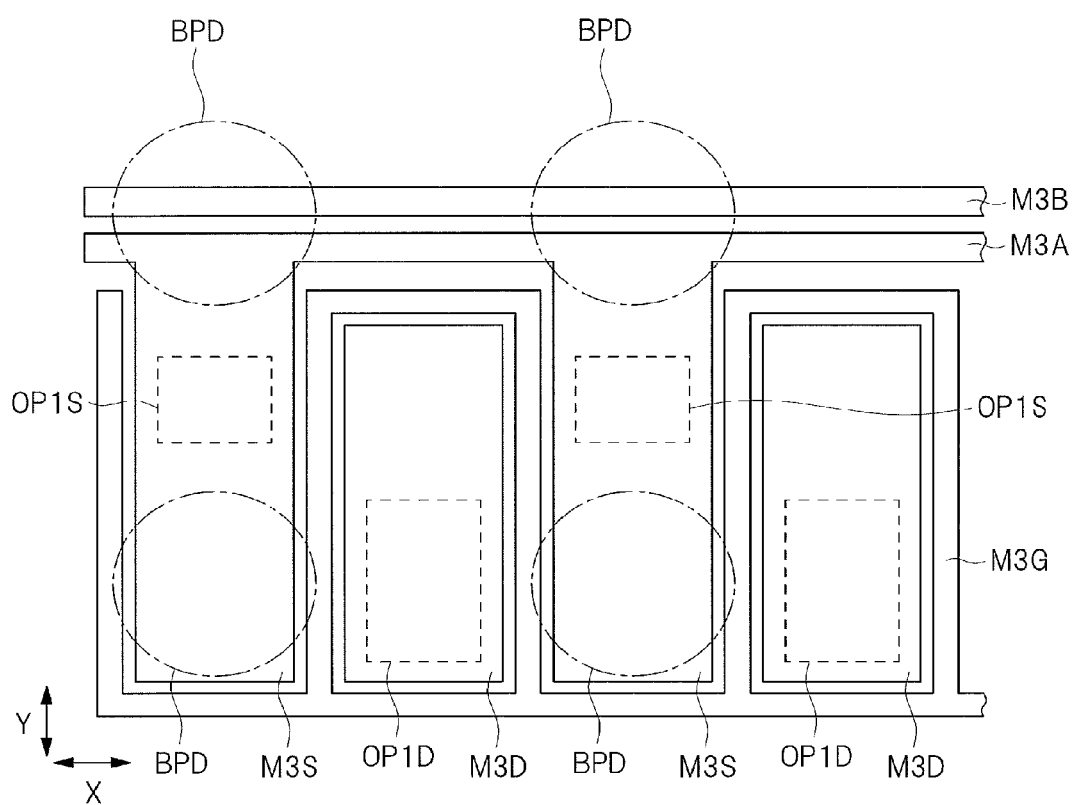
FIG. 31 is an explanatory diagram of a sixth modified example of the planar layout of the third and fourth wiring layers.
Figure 32:
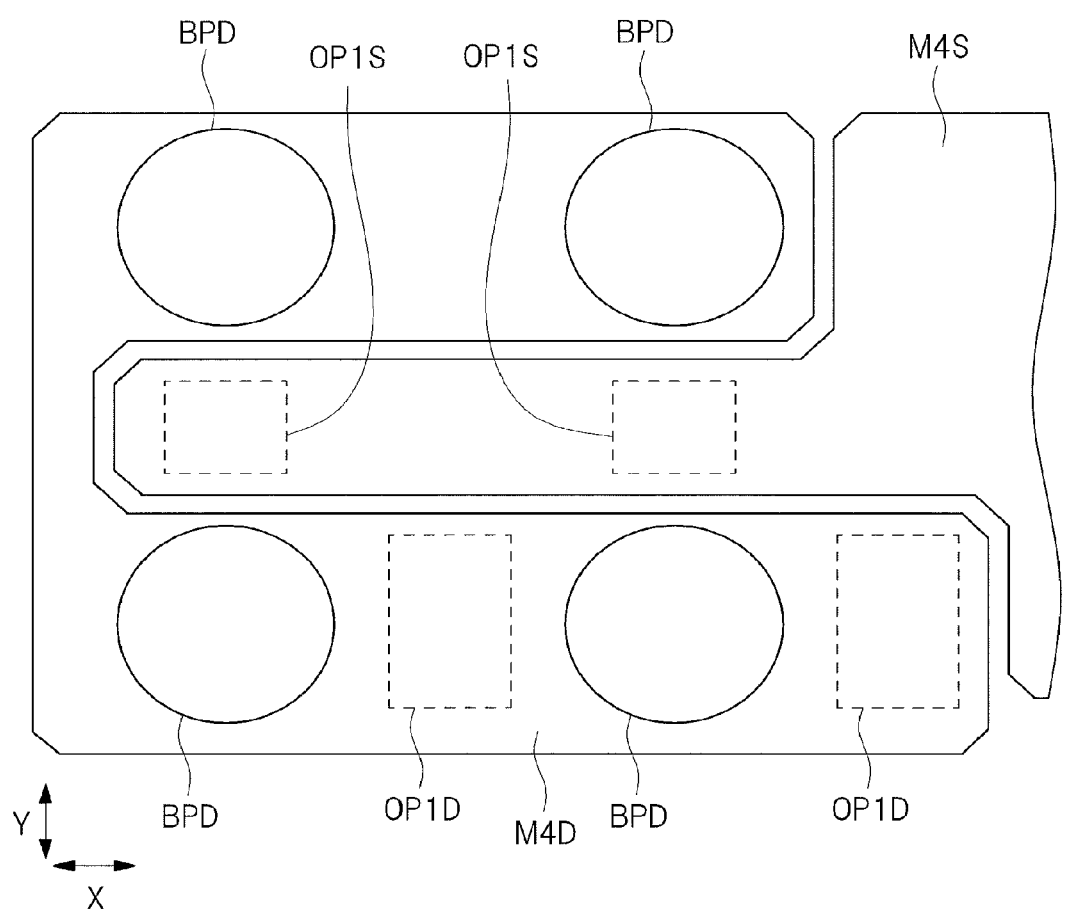
FIG. 32 is an explanatory diagram of the sixth modified example of the planar layout of the third and fourth wiring layers.

FIGS. 31 and 32 are explanatory diagrams of a sixth modified example of the planar layouts of the third and fourth wiring layers. FIG. 31 shows a planar layout of the third wiring layer (M3), and FIG. 32 shows a planar layout of the fourth wiring layer (M4). A layout obtained by superposing the layout of FIG. 31 and the layout of FIG. 32 is too complicated to view and is therefore not presented. However, the drain bump electrodes BPD, the drain openings OP1D, and the source openings OP1S are shown not only in FIG. 32 but also in FIG. 31. Therefore, the relative positional relation between the third wiring layer (M3), the fourth wiring layer (M4), the drain bump electrodes BPD, the drain openings OP1D, and the source openings OP1S can be understood by checking FIG. 31 and FIG. 32 against each other.

The planar layout of the source wiring M3S, the drain wiring M3D, the gate wiring M3G, and the wirings M3A and M3B of FIG. 31 is basically the same as the planar layouts of FIGS. 23, 24, and 27.

In the planar layouts of FIGS. 31 and 32, a common drain re-wiring M4D is connected to the plurality of drain wirings M3D. More specifically, the single (continuous) drain re-wiring M4D is provided for the plurality of drain wirings M3D. The single drain re-wiring M4D overlaps respective parts of the plurality of drain wirings M3D when seen in a plan view, the drain openings OP1D are disposed in the regions where the drain re-wiring M4D overlaps the respective drain wirings M3D, and the drain re-wiring M4D is in contact with the drain wirings M3D and is electrically connected thereto through the drain openings OP1D. In this manner, the plurality of drain wirings M3D are electrically connected to the common drain re-wiring M4D.

Also, in the planar layouts of FIGS. 31 and 32, on the common drain re-wiring M4D connected to the plurality of drain wirings M3D, the plurality of drain bump electrodes BPD are formed. In this manner, the plurality of drain bump electrodes BPD formed on the single (common) drain re-wiring M4D are electrically connected to the plurality of drain wirings M3D via the single (common) drain re-wiring M4D.

Also in the planar layouts of FIGS. 31 and 32, like the planar layouts of FIGS. 27 to 30, the plurality of drain bump electrodes BPD are formed, and the plurality of drain bump electrodes BPD include the drain bump electrodes BPD which overlap the wiring M3 having a different potential from the drain bump electrodes BPD (or wiring M3 other than the drain wiring M3D) when seen in a plan view. Concretely, in the case shown in FIGS. 27 to 30, the drain bump electrodes BPD which overlap the gate wiring M3G and the source wiring M3S when seen in a plan view and the drain bump electrodes BPD which overlap the source wiring M3S and the wirings M3A and M3B when seen in a plan view are provided. These source wiring M3S and wirings M3A and M3B are the wirings M3 formed in the third wiring layer and are the wirings M3 having a different potential from the drain bump electrodes BPD (or wirings M3 other than the drain wiring M3D). Therefore, an effect basically the same as that described with reference to FIGS. 27 to 30 can be obtained.

Note that, although FIGS. 31 and 32 do not show the source bump electrodes BPS, the source re-wiring M4S actually extends also to the outside of the region shown in FIG. 32 (for example, right-side region of FIG. 32), and the source bump electrodes BPS are disposed on the source re-wiring M4S. More specifically, the single (common) source re-wiring M4S is connected to the plurality of source wirings M3S, the plurality of source bump electrodes BPS are formed on the single (common) source re-wiring M4S, and the plurality of source bump electrodes BPS are electrically connected to the plurality of source wirings M3S via the single (common) source re-wiring M4S. The plurality of source bump electrodes BPS include the source bump electrodes BPS which overlap the wiring M3 having a different potential from the drain bump electrodes BPD (or wiring M3 other than the drain wiring M3D) when seen in a plan view.

Figure 33:
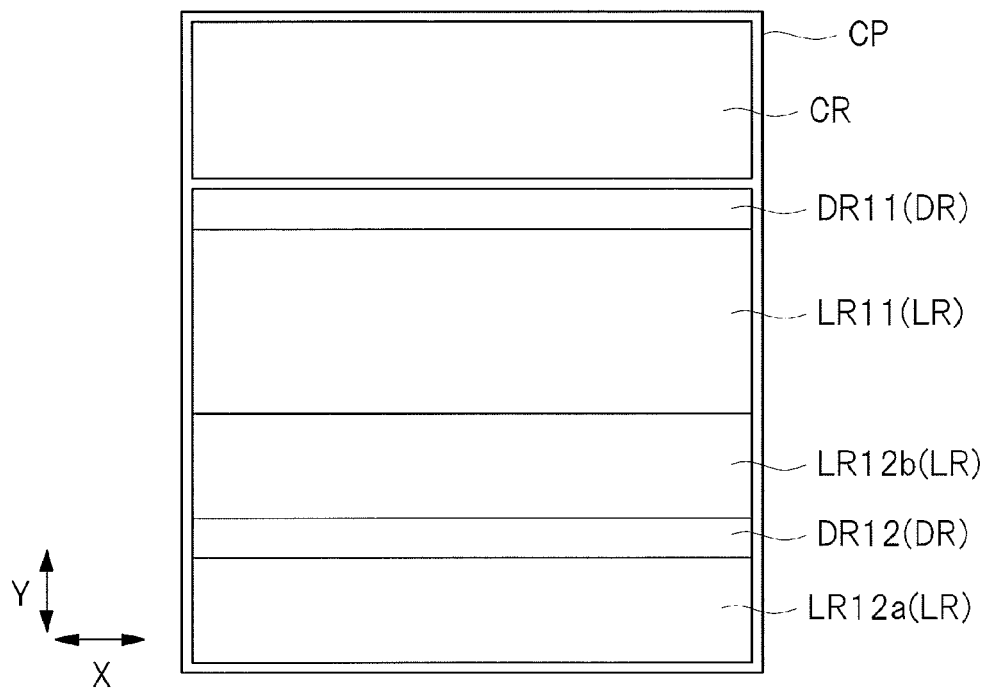
FIG. 33 is a plan view of an example of an overall planar layout of the semiconductor device.
Figure 34:
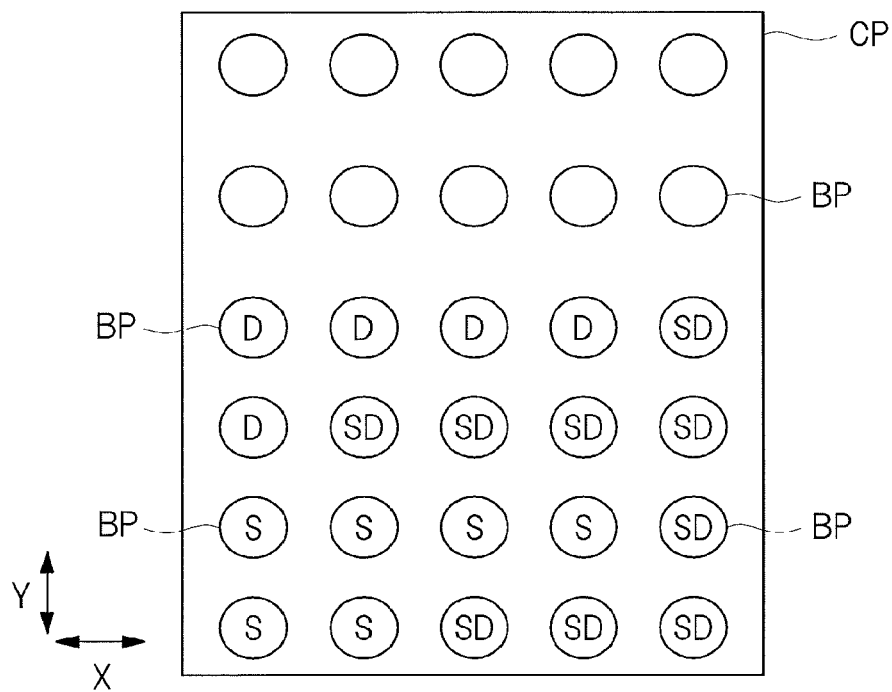
FIG. 34 is a plan view of an example of an overall planar layout of the semiconductor device.

FIGS. 33 and 34 are plan views of examples of an overall planar layout of the semiconductor device (semiconductor chip) CP. FIG. 33 shows an example of a layout of a circuit block formed in the semiconductor device CP, and FIG. 34 shows an example of a layout of the bump electrodes BP in the case of adopting the layout of the circuit block of FIG. 33.

In the case of the layout of FIG. 33, the semiconductor device CP includes the control circuit forming region CR, the driver circuit regions DR11 and DR12, and the LDMOSFET forming regions LR11, LR12a, and LR12b.

The driver circuit regions DR11 and DR12 each correspond to the above-described driver circuit region DR. However, the driver circuit region DR11 is the driver circuit region DR in which the driver circuit DR1 is formed, and the driver circuit region DR12 is the driver circuit region DR in which the driver circuit DR2 is formed. Also, the control circuit forming region CR is a region in which the part of the control circuit CC other than the driver circuits DR1 and DR2 (for example, the control circuit CTC) is formed. Furthermore, the LDMOSFET forming regions LR11, LR12a, and LR12b each correspond to the above-described LDMOSFET forming region LR.

However, the LDMOSFET forming region LR11 is the LDMOSFET forming region LR in which the plurality of unit LDMOSFETs 10a making up the power MOS transistor QH are formed, and each of the LDMOSFET forming regions LR12a and LR12b is the LDMOSFET forming region LR in which the plurality of unit LDMOSFETs 10a making up the power MOS transistor QL are formed. The plurality of unit LDMOSFETs 10a formed in the LDMOSFET forming region LR11 are connected in parallel to form the power MOS transistor QH, and the plurality of unit LDMOSFETs 10a formed in the LDMOSFET forming regions LR12a and LR12b are connected in parallel to form the power MOS transistor QL. More specifically, the plurality of unit LDMOSFETs 10a connected in parallel with each other to make up the power MOS transistor QH are formed in the LDMOSFET forming region LR11, and the plurality of unit LDMOSFETs 10a connected in parallel with each other to make up the power MOS transistor QL are formed in the LDMOSFET forming regions LR12a and LR12b.

In the case of FIG. 33, the LDMOSFET forming region LR11 in which the power MOS transistor QH is formed and the driver circuit region DR11 in which the driver circuit DR1 that controls the power MOS transistor QH is formed are disposed adjacent (specifically, adjacent in the Y direction) to each other. Also, the LDMOSFET forming regions LR12a and LR12b in which the power MOS transistor QL is formed are disposed so as to sandwich the driver circuit region DR12 in which the driver circuit DR2 that controls the power MOS transistor QL is formed.

In each of the LDMOSFET forming regions LR11, LR12a, and LR12b, the plurality of unit LDMOSFETs 10a, the source wirings M1S, M2S, and M3S, the drain wirings M1D, M2D, and M3D, the gate wirings M1G, M2G, and M3G, and the plugs P1S, P1D, P1G, P2S, P2D, P2G, P3S, P3D, and P3G are formed. As the configuration and layout thereof, the configuration and layout in the LDMOSFET forming region LR described above can be applied.

Therefore, in each of the LDMOSFET forming regions LR11, LR12a, and LR12b, the source regions ($n^+$-type semiconductor regions SR) of the plurality of unit LDMOSFETs 10a are electrically connected to each other via the source wirings M1S, M2S, and M3S, and the drain regions ($n^+$-type semiconductor regions HD) of the plurality of unit LDMOSFETs 10a are electrically connected to each other via the drain wirings M1D, M2D, and M3D.

More specifically, the source regions of the plurality of unit LDMOSFETs 10a formed in the LDMOSFET forming region LR11 are electrically connected to each other via the source wirings M1S, M2S, and M3S formed in the LDMOSFET forming region LR11, and the drain regions thereof are electrically connected to each other via the drain wirings M1D, M2D, and M3D formed in the LDMOSFET forming region LR11. Also, the source regions of the plurality of unit LDMOSFETs 10a formed in the LDMOSFET forming region LR12a are electrically connected to each other via the source wirings M1S, M2S, and M3S formed in the LDMOSFET forming region LR12a, and the drain regions thereof are electrically connected to each other via the drain wirings M1D, M2D, and M3D formed in the LDMOSFET forming region LR12a. Also, the source regions of the plurality of unit LDMOSFETs 10a formed in the LDMOSFET forming region LR12b are electrically connected to each other via the source wirings M1S, M2S, and M3S formed in the LDMOSFET forming region LR12b, and the drain regions thereof are electrically connected to each other via the drain wirings M1D, M2D, and M3D formed in the LDMOSFET forming region LR12b.

The plurality of gate electrodes GE formed in the LDMOSFET forming region LR11 are electrically connected to each other via the gate wirings M1G, M2G, and M3G formed in the LDMOSFET forming region LR11, and are connected to the driver circuit DR1 formed in the driver circuit region DR11. Also, the plurality of gate electrodes GE formed in the LDMOSFET forming region LR12a are electrically connected to each other via the gate wirings M1G, M2G, and M3G formed in the LDMOSFET forming region LR12a, and are connected to the driver circuit DR2 formed in the driver circuit region DR12. Also, the plurality of gate electrodes GE formed in the LDMOSFET forming region LR12b are electrically connected to each other via the gate wirings M1G, M2G, and M3G formed in the LDMOSFET forming region LR12b, and are connected to the driver circuit DR2 formed in the driver circuit region DR12.

The plurality of unit LDMOSFETs 10a for the power MOS transistor QL are formed in both of the LDMOSFET forming region LR12a and the LDMOSFET forming region LR12b, and the plurality of unit LDMOSFETs 10a in both regions (LR12a, LR12b) are connected in parallel with each other to form the power MOS transistor QL.

Therefore, the source wiring M3S formed in the LDMOSFET forming region LR12a and the source wiring M3S formed in the LDMOSFET forming region LR12b are electrically connected to each other via the common source re-wiring M4S extending over both LDMOSFET forming regions LR12a and LR12b. Therefore, the source regions of the plurality of unit LDMOSFETs 10a in the LDMOSFET forming region LR12a and the source regions of the plurality of unit LDMOSFETs 10a in the LDMOSFET forming region LR12b are electrically connected to each other via the source wirings M1S, M2S, and M3S and the common source re-wiring M4S formed in the LDMOSFET forming regions LR12a and LR12b.

Also, the drain wiring M3D formed in the LDMOSFET forming region LR12a and the drain wiring M3D formed in the LDMOSFET forming region LR12b are electrically connected to each other via the common drain re-wiring M4D extending over both LDMOSFET forming regions LR12a and LR12b. Therefore, the drain regions of the plurality of unit LDMOSFETs 10a in the LDMOSFET forming region LR12a and the drain regions of the plurality of unit LDMOSFETs 10a in the LDMOSFET forming region LR12b are electrically connected to each other via the drain wirings M1D, M2D, and M3D and the common drain re-wiring M4D formed in the LDMOSFET forming regions LR12a and LR12b.

Also, the gate wirings M1G, M2G, and M3G formed in the LDMOSFET forming region LR12a and the gate wirings M1G, M2G, and M3G formed in the LDMOSFET forming region LR12b are electrically connected to each other via one or more wirings (M1, M2, M3) of the first to third wiring layers (wirings M1, M2, M3). As a result, the plurality of gate electrodes GE formed in the LDMOSFET forming region LR12a and the plurality of gate electrodes GE formed in the LDMOSFET forming region LR12b are electrically connected to each other via the gate wirings M1G, M2G, and M3G and one or more wirings of the first to third wiring layers (wirings M1, M2, M3) formed in the LDMOSFET forming regions LR12a and LR12b.

As can be understood from the circuit diagram of FIG. 1, the source of the power MOS transistor QH and the drain of the power MOS transistor QL are electrically connected to each other. Therefore, the source wiring M3S formed in the LDMOSFET forming region LR11 and the drain wiring M3D formed in the LDMOSFET forming regions LR12a and LR12b are electrically connected to each other via the re-wiring M4 extending over the LDMOSFET forming regions LR11, LR12a, and LR12b. This re-wiring M4 is the common re-wiring M4 functioning both as the source re-wiring M4S for the power MOS transistor QH and the drain re-wiring M4D for the power MOS transistor QL. In this manner, the source regions of the plurality of unit LDMOS-FETs 10a in the LDMOSFET forming region LR11 and the drain regions of the plurality of unit LDMOSFETs 10a in the LDMOSFET forming regions LR12a and LR12b are electrically connected to each other via the source wirings M1S, M2S, and M3S in the LDMOSFET forming region LR11, the drain wirings M1D, M2D, and M3D in the LDMOSFET forming regions LR12a and LR12b, and the re-wiring M4.

The gate electrodes GE formed in the LDMOSFET forming region LR11 and the gate electrodes GE formed in the LDMOSFET forming regions LR12a and LR12b are not connected to each other via a conductor. The drain regions formed in the LDMOSFET forming region LR11 and the source regions formed in the LDMOSFET forming regions LR12a and LR12b are not connected to each other via a conductor. The source regions formed in the LDMOSFET forming region LR11 and the source regions formed in the LDMOSFET forming regions LR12a and LR12b are not connected to each other via a conductor. The drain regions formed in the LDMOSFET forming region LR11 and the drain regions formed in the LDMOSFET forming regions LR12a and LR12b are not connected to each other via a conductor.

FIG. 34 shows an example of a layout of the bump electrodes BP in the semiconductor device CP. In FIG. 34, the bump electrodes BP denoted by D correspond to the drain bump electrodes BPD connected to the drain of the power MOS transistor QH (that is, the plurality of drain regions in the LDMOSFET forming region LR11). The plurality of bump electrodes BP denoted by D are formed on the common drain re-wiring M4D, and are electrically connected to the plurality of drain wirings M3D formed in the LDMOSFET forming region LR11 via the common drain re-wiring M4D.

Also, in FIG. 34, the bump electrodes BP denoted by S correspond to the source bump electrodes BPS connected to the source of the power MOS transistor QL (that is, the plurality of source regions in the LDMOSFET forming regions LR12a and LR12b). The plurality of bump electrodes BP denoted by S are formed on the common source re-wiring M4S, and are electrically connected to the plurality of source wirings M3S formed in the LDMOSFET forming regions LR12a and LR12b via the common source re-wiring M4S.

Also, in FIG. 34, the bump electrodes BP denoted by SD function both as the source bump electrodes BPS connected to the source of the power MOS transistor QH (that is, the plurality of source regions in the LDMOSFET forming region LR11) and the drain bump electrodes BPD connected to the drain of the power MOS transistor QL (that is, the plurality of drain regions in the LDMOSFET forming regions LR12a and LR12b). The plurality of bump electrodes BP denoted by SD are formed on the common re-wiring (M4) functioning both as the source re-wiring M4S for the power MOS transistor QH and the drain re-wiring M4D for the power MOS transistor QL. Also, the plurality of bump electrodes BP denoted by SD are electrically connected to the plurality of source wirings M3S formed in the LDMOSFET forming region LR11 and the plurality of drain wirings M3D formed in the LDMOSFET forming regions LR12a and LR12b via the common re-wiring (M4).

Also in the semiconductor device CP having the layouts shown in FIGS. 33 and 34, the above-described effect can be obtained by applying the configuration described with reference to FIGS. 2 to 32.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:
1. A semiconductor device comprising:
a power MISFET;
a driver transistor which outputs a signal to drive a gate of the power MISFET; and
a signal line which electrically connects an output of the driver transistor to the gate of the power MISFET,
wherein the gate is formed of a gate electrode extending in a first direction and formed between a source region and a drain region of the power MISFET,
the source region and the drain region are adjacent to each other in a second direction perpendicular to the first direction, the first direction is a gate width direction of the gate electrode, both ends of the gate electrode in the first direction, formed between the source region and the drain region, are electrically connected to each other by a first metal wiring formed in a first wiring layer different from a wiring layer in which the gate electrode is formed, and the signal line includes the first metal wiring.

2. The semiconductor device according to claim 1, wherein the first wiring layer is an uppermost wiring layer.

3. The semiconductor device according to claim 1, further comprising:

a source wiring connected to the source region of the power MISFET; and a drain wiring connected to the drain region of the power MISFET, wherein the source wiring and the drain wiring are both formed by connecting wirings formed in respective multiple wiring layers.

4. The semiconductor device according to claim 1, wherein the both ends of the gate electrode in the first direction are electrically connected to each other by the first metal wiring and a second metal wiring, the second metal wiring is formed in a second wiring layer different from the first wiring layer, and the signal line includes the first metal wiring and the second metal wiring connected to each other.

5. The semiconductor device according to claim 4, wherein the first metal wiring is part of a first conductive path from the driver transistor to the gate of the power MISFET, the second metal wiring is part of a second conductive path from the driver transistor to the gate of the power MISFET, and the first conductive path is different from the second conductive path.

6. The semiconductor device according to claim 1, wherein the first metal wiring is formed in a first wiring layer over a second wiring layer and extends along the first direction, a pair of second metal wirings are formed in the second wiring layer, each second metal wiring extending along the second direction, one of the pair of second metal wirings is over and electrically connected to a first end of the gate electrode via a first plug, the other of the pair of second metal wirings is over and electrically connected to a second end of the gate electrode, opposite to the first end of the gate electrode along the first direction, via a second plug, and the first metal wiring is electrically connected to the pair of second metal wirings via respective third plugs at opposite ends of the first metal wiring along the first direction.

7. The semiconductor device according to claim 6, wherein a pair of third metal wirings are formed in a third wiring layer, each third metal wiring extending along the second direction, the first and second wiring layers are over the third wiring layer, one of the pair of third metal wirings is over and electrically connected to the first end of the gate electrode via a fourth plug, the other of the pair of third metal wirings is over and electrically connected to the second end of the gate electrode via a fifth plug, the first plug extends between said one of the pair of third metal wirings and said one of the second metal wirings, and the second plug extends between said other of the pair of third metal wirings and said other of the second metal wirings.

8. The semiconductor device according to claim 7, wherein the signal from the output of the driver transistor is conveyed to the gate via a direct connection to said one of the pair of second metal wirings.

9. The semiconductor device according to claim 8, wherein said one of the pair of third metal wirings and said one of the pair of second metal wirings are part of a first conductive path from the driver transistor to the first end of the gate electrode, wherein the first metal wiring, the other of the pair of second metal wirings, and the other of the pair of third metal wirings are part of a second conductive path from the driver transistor to the second end of the gate electrode, and the first conductive path is different from the second conductive path.

10. The semiconductor device according to claim 6, wherein a second gate electrode extends in the first direction and is spaced from said gate electrode, said one of the pair of second metal wirings is over and electrically connected to a first end of the second gate electrode via a sixth plug, the other of the pair of second metal wirings is over and electrically connected to a second end of the second gate electrode, opposite to the first end of the second gate electrode in the first direction, via a seventh plug, and both ends of the second gate electrode in the first direction are electrically connected to each other by another metal wiring formed in the first wiring layer and separate from the first metal wiring.

11. The semiconductor device according to claim 10, wherein a source wiring or a drain wiring, formed in the first wiring layer, is between the first metal wiring and the another metal wiring in plan view.

* * * * *